US007881479B2

(12) United States Patent
Asada

(10) Patent No.: US 7,881,479 B2
(45) Date of Patent: Feb. 1, 2011

(54) AUDIO PROCESSING METHOD AND SOUND FIELD REPRODUCING SYSTEM

(75) Inventor: Kohei Asada, Kanagawa (JP)

(73) Assignee: Sony Corporation, Tokyo (JP)

( * ) Notice: Subject to any disclaimer, the term of this patent is extended or adjusted under 35 U.S.C. 154(b) by 1233 days.

(21) Appl. No.: 11/487,861

(22) Filed: Jul. 17, 2006

(65) Prior Publication Data

US 2007/0025560 A1 Feb. 1, 2007

(30) Foreign Application Priority Data

Aug. 1, 2005 (JP) ............................ 2005-223437

(51) Int. Cl.
*H03G 3/02* (2006.01)

(52) U.S. Cl. ............................ 381/63; 381/56; 381/58

(58) Field of Classification Search .................. 381/26, 381/56, 57, 58, 59, 61, 63, 91, 92, 95, 96, 381/77, 86, 300, 302, 303, 310, 71.6, 17, 381/101, 103, 18; 84/630
See application file for complete search history.

(56) References Cited

U.S. PATENT DOCUMENTS 5,260,920 A * 11/1993 Ide et al. ........................ 369/5
5,276,740 A 1/1994 Inanaga et al.
5,500,900 A * 3/1996 Chen et al. ..................... 381/17
5,511,129 A * 4/1996 Craven et al. ............... 381/103
6,785,391 B1 * 8/2004 Emura et al. .................. 381/61
2004/0244568 A1 12/2004 Nakabo et al.
2007/0053528 A1 3/2007 Kim et al.
2009/0310793 A1 12/2009 Ohkuri et al.

FOREIGN PATENT DOCUMENTS

EP 1378912 A2 1/2004
JP 03-096199 A 4/1991
JP 03-214892 A 9/1991
JP 04-051700 A 2/1992
JP 08-116587 A 5/1996

(Continued)

OTHER PUBLICATIONS

The active control around the head based on Kirchhoff's integral equation.

(Continued)

*Primary Examiner*—Vivian Chin
*Assistant Examiner*—Leshui Zhang
(74) *Attorney, Agent, or Firm*—Wolf, Greenfield & Sacks, P.C.

(57) ABSTRACT

An audio signal processing method comprises the steps of emitting a sound at a virtual sound image location in space on the outer side of a closed surface, generating measurement-based directional transfer functions corresponding to a plurality of positions on the closed surface based on a result of measuring the sound at the plurality of respective positions on the closed surface by using a directional microphone, generating composite transfer functions corresponding to the plurality of respective positions on the closed surface by respectively adding, at a specified ratio, the measurement-based directional transfer functions and auxiliary transfer functions and generating reproduction audio signals corresponding to the plurality of respective positions on the closed surface by performing a calculation process on an input audio signal in accordance with the set of composite functions.

26 Claims, 36 Drawing Sheets

FOREIGN PATENT DOCUMENTS

| | | | | |
|---|---|---|---|---|
| JP | 2002-152897 | | | 5/2002 |
| JP | 2002-152897 | A | | 5/2002 |
| JP | 2002-186100 | | | 6/2002 |
| JP | 2002186100 | A | * | 6/2002 |
| JP | 2002-218599 | A | | 8/2002 |
| JP | 2002218599 | A | * | 8/2002 |
| JP | 2005-341534 | | | 12/2005 |
| JP | 2006-101441 | A | | 4/2006 |
| JP | 2006-295669 | A | | 10/2006 |
| JP | 2008-005269 | A | | 1/2008 |
| JP | 2008-099163 | A | | 4/2008 |
| JP | 2008-122729 | A | | 5/2008 |
| JP | 2008-124564 | A | | 5/2008 |
| WO | WO 2006/125061 | A1 | | 11/2006 |
| WO | WO 2007/113487 | A1 | | 10/2007 |

OTHER PUBLICATIONS

Peltonen et al., "Computational Auditory Scene Recognition", 2002 IEEE International Conference on Acoustics, Speech, and Signal Processing Proceedings. (ICASSP). Orlando, FL, May 13-17, 2002; IEEE International Conference on Acoustics, Speech, and Signal Processing (ICASSP), May 13, 2002, pg. II-1941-1944, vol. 2, New York, NY.

* cited by examiner (Prior Art)

FIG. 13A
FIG. 13B
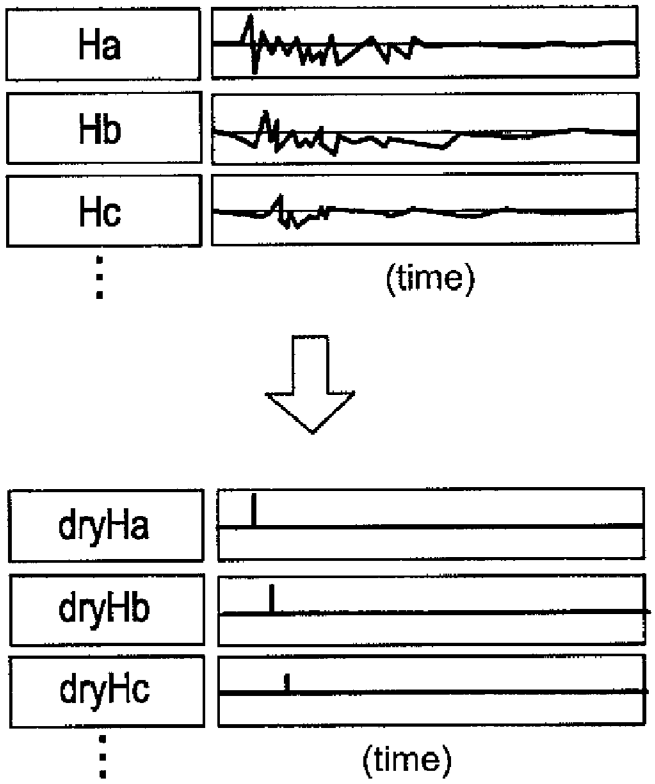
FIG. 14A
FIG. 14B
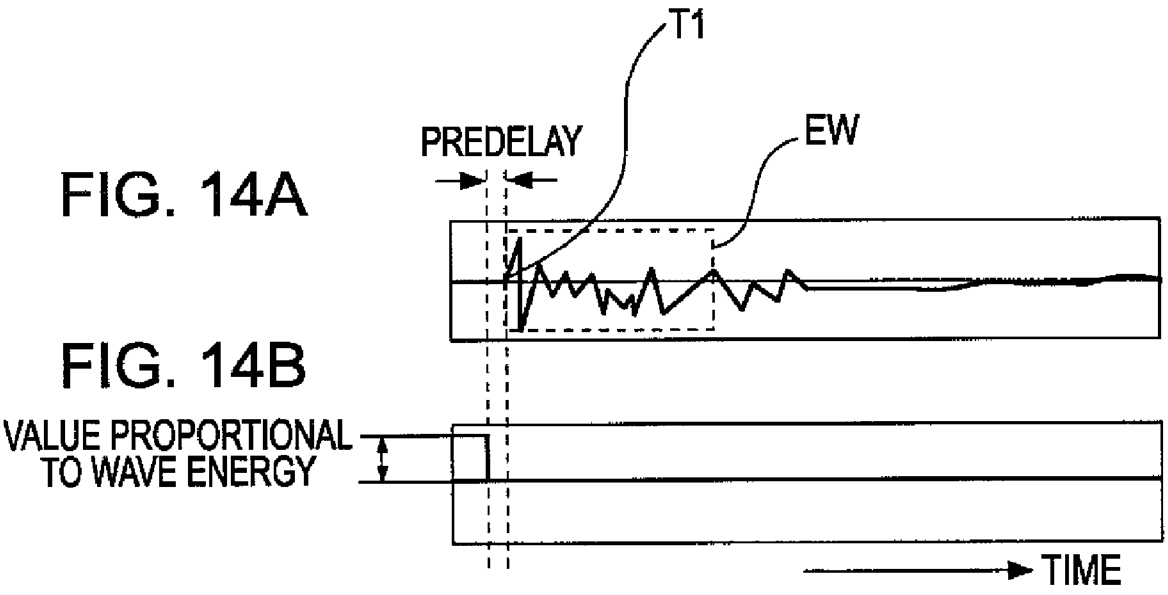

FIG. 23

| | POSITION #1 | POSITION #2 | POSITION #3 | POSITION #4 |
|---|---|---|---|---|
| DIRECTION #1 | Ha1-dir1<br>Hb1-dir1<br>...<br>Hp1-dir1 | Ha2-dir1<br>Hb2-dir1<br>...<br>Hp2-dir1 | Ha3-dir1<br>Hb3-dir1<br>...<br>Hp3-dir1 | Ha4-dir1<br>Hb4-dir1<br>...<br>Hp4-dir1 |
| DIRECTION #2 | Ha1-dir2<br>Hb1-dir2<br>...<br>Hp1-dir2 | Ha2-dir2<br>Hb2-dir2<br>...<br>Hp2-dir2 | Ha3-dir2<br>Hb3-dir2<br>...<br>Hp3-dir2 | Ha4-dir2<br>Hb4-dir2<br>...<br>Hp4-dir2 |
| ... | ... | ... | ... | ... |
| DIRECTION #6 | Ha1-dir6<br>Hb1-dir6<br>...<br>Hp1-dir6 | Ha2-dir6<br>Hb2-dir6<br>...<br>Hp2-dir6 | Ha3-dir6<br>Hb3-dir6<br>...<br>Hp3-dir6 | Ha4-dir6<br>Hb4-dir6<br>...<br>Hp4-dir6 |

FIG. 24

| | POSITION #1 | POSITION #2 | POSITION #3 | POSITION #4 |
|---|---|---|---|---|
| DIRECTION #1 | omniHa1-dir1<br>omniHb1-dir1<br>⋮<br>omniHp1-dir1 | omniHa2-dir1<br>omniHb2-dir1<br>⋮<br>omniHp2-dir1 | omniHa3-dir1<br>omniHb3-dir1<br>⋮<br>omniHp3-dir1 | omniHa4-dir1<br>omniHb4-dir1<br>⋮<br>omniHp4-dir1 |
| DIRECTION #2 | omniHa1-dir2<br>omniHb1-dir2<br>⋮<br>omniHp1-dir2 | omniHa2-dir2<br>omniHb2-dir2<br>⋮<br>omniHp2-dir2 | omniHa3-dir2<br>omniHb3-dir2<br>⋮<br>omniHp3-dir2 | omniHa4-dir2<br>omniHb4-dir2<br>⋮<br>omniHp4-dir2 |
| ⋮ | ⋮ | ⋮ | ⋮ | ⋮ |
| DIRECTION #6 | omniHa1-dir6<br>omniHb1-dir6<br>⋮<br>omniHp1-dir6 | omniHa2-dir6<br>omniHb2-dir6<br>⋮<br>omniHp2-dir6 | omniHa3-dir6<br>omniHb3-dir6<br>⋮<br>omniHp3-dir6 | omniHa4-dir6<br>omniHb4-dir6<br>⋮<br>omniHp4-dir6 |

AUDIO PROCESSING METHOD AND SOUND FIELD REPRODUCING SYSTEM

CROSS REFERENCES TO RELATED APPLICATIONS

The present invention contains subject matter related to Japanese Patent Application JP 2005-223437 filed in the Japanese Patent Office on Aug. 1, 2005, the entire contents of which are incorporated herein by reference.

BACKGROUND OF THE INVENTION

1. Field of the Invention

The present invention relates to an audio signal processing method for reproducing, in an environment, a sound field originally generated in another environment. The present invention also relates to a sound field reproducing system including a recording apparatus configured to record information on a recording medium and an audio signal processing apparatus configured to generate a reproduction audio signal for use to reproduce a sound field in accordance with information recorded on a recording medium.

2. Description of the Related Art

When a content such as a movie content or a music content is played back, it is known to add sound reverberation to enhance presence in reproduced sound.

One known technique to add reverberation is digital reverb. In the digital reverb technique, a large number of delayed signals with a random delay are generated from an original sound and are added together with the original sound. The amplitude of each delayed signal is determined such that the amplitude decreases with the delay time. Delayed signals with large delay times are fed back to achieve sound reverberation with a greater reverberation time. Thus, it is possible to artificially give a reverberation effect to the original sound. However, parameters used to generate the delayed signals are determined based on audibility of a human operator who sets the parameters, and the process of setting the parameters is very complicated and troublesome. Besides, in this technique, the reverberation is artificially generated without consideration of localization of the original sound, and thus this technique does not allow a good sound field to be reproduced.

Another known technique to create a reverberation effect is to measure an impulse response in an actual sound field space and generate reverberation based on the measurement result including spatial information associated with localization of a sound source. A specific example of this technique is disclosed, for example, in Japanese Unexamined Patent Application Publication No. 2002-186100.

In the technique disclosed in Japanese Unexamined Patent Application Publication No. 2002-186100, for example, a speaker 3 serving as a sound source for measurement (hereinafter such a speaker for measurement will be referred to simply as a measurement speaker) is placed in a measurement environment (a sound field to be measured) 1 such as a hall as shown in FIG. 1. Note that similar notations are used elsewhere in the present description to denote devices, units, signals, etc. for use in the measurement. For example, microphones for use in measurement are denoted by measurement microphones. Similarly, devices, units, signals, etc. for use in reproduction are denoted by adding "reproduction" before names of devices, units, signals, etc. An audio signal such as a TSP (Time Stretched Pulse) signal by which to measure the impulse response is applied to the measurement speaker 3, and a measurement signal (a sound by which to measure the impulse response measurement) output from the measurement speaker 3 is detected by a plurality of measurement microphones 4*a* to 4*p* placed at particular positions in the same sound field. For example, as represented by arrows in FIG. 1, the measurement microphone 4*a* detects a direct sound from the measurement speaker 3 and reflected sounds which originate from the measurement speaker 3 and which reach the measurement microphone 4*a* after being reflected in the hall used as the measurement environment. Although not shown in the figure, the other measurement microphones 4*b*, 4*c*, 4*d* and so on detect the direct sound and reflected sounds in a similar manner.

By measuring the impulse response including the reverberation based on the audio signals detected by the respective measurement microphones 4*a* to 4*p*, it is possible to determine transfer functions from the measurement speaker 3 to the respective measurement microphones 4.

By using these transfer functions, the sound field in the measurement environment shown in FIG. 1 can be reproduced in an environment in which speakers 8*a* to 8*p* are placed, as shown in FIG. 3, at positions similar to the positions of the measurement microphones 4 in the measurement environment shown in FIG. 1.

More specifically, if transfer functions from the sound source to respective positions of the measurement microphones 4 are given, audio signals which should be output from the respective speakers 8 placed at the above-described positions can be given by convolutions of an audio signal to be reproduced and the respective transfer functions. If these audio signals are output from the respective speakers 8, a reverberation effect similar to the in the measurement environment shown in FIG. 1 can be obtained in space surrounded by the speakers 8.

This technique allows a sound field to be reproduced with high accuracy, because the transfer functions determined based on the actual measurement are used. This technique is also excellent to obtain good localization of a sound image in the reproduced sound field.

Note that it is important to place the speakers 8*a* to 8*p* in the reproduction environment shown in FIG. 3 at positions geometrically similar to the positions of the measurement microphones 4*a* to 4*p* in the measurement environment shown in FIG. 1 so that, in a region surrounded by the speakers 8 in the reproduction environment (that is, in a region on the inner side of a closed surface on which the speakers 8 are located), the sound source in the measurement sound field is precisely reproduced at a location corresponding to the location of the original sound source, and thus the sound field in the measurement environment is precisely reproduced.

SUMMARY OF THE INVENTION

In the technique disclosed in Japanese Unexamined Patent Application Publication No. 2002-186100, as described above, a sound is reproduced based on the sound measurement actually made in a measurement environment such as a hall. This technique makes it possible to obtain, in space different from that of the measurement environment, reverberation similar to that in the measurement environment. Furthermore, it is possible to create a virtual sound image at a definite location.

In audio playback systems, it is desirable that sound quality (tone) of a reproduced sound can be adjusted in accordance with user's preference. In some conventional audio playback systems, it is allowed to enhance a low frequency sound or adjust the tone depending on the genre (such as rock or jazz) of reproduced music. This allows a user to enjoy music played back with selected sound quality.

By analogy, in sound field reproducing systems, it is desirable to allow a user to adjust reverberation and/or localization of a sound image.

In view of the above, the present invention provides an audio signal processing method including the steps of emitting a sound at a virtual sound image location in space on the outer side of a first closed surface, generating a set of measurement-based directional transfer functions from the virtual sound image location to a plurality of positions on the first closed surface based on a result of measurement of the sound emitted in the sound emission step at the plurality of respective positions on the first closed surface by using a directional microphone oriented outward, generating a set of first transfer functions in the form of a set of composite transfer functions from the virtual sound image location to the plurality of respective positions on the first closed surface by respectively adding, at a specified ratio, the set of measurement-based directional transfer functions and a set of auxiliary transfer functions determined separately from the set of measurement-based directional transfer functions based on a sound emitted at the virtual sound image location and arriving at the plurality of respective positions on the first closed surface, and generating first reproduction audio signals corresponding to the plurality of respective positions on the first closed surface by performing a calculation process on an input audio signal in accordance with the set of first transfer functions.

As described above, by adding measurement-based directional transfer functions similar to those conventionally used to reproduce a sound field with another transfer functions (auxiliary transfer functions) determined for the plurality of respective positions, it is possible to obtain reproduction audio signals to be output from the plurality of respective positions. Sounds emitted according to the obtained reproduction audio signals have sound quality (in terms of reverberation, localization of a sound image, etc) different from that of sounds emitted according to only the measurement-based directional transfer functions. By adding these two types of transfer functions at a specified ratio, it is possible to adjust the sound quality of a reproduced sound field in terms of reverberation, localization of a sound image, etc.

Thus, the present invention makes it possible to adjust the sound quality of a sound field reproduced in an environment different from an environment in which the sound was originally emitted. This provides great convenience and advantage to a user.

BRIEF DESCRIPTION OF THE DRAWINGS

FIGS. 13A and 13B show measurement-based directional transfer functions and information associated with a sound delay time and a sound level extracted from the measurement-based directional transfer functions;

FIGS. 14A and 14B show a manner in which information associated with a sound delay time and a sound level is extracted from measurement-based directional transfer functions;

FIG. 23 shows an example of data structure of direction-to-transfer function correspondence information for measurement-based directional transfer functions;

FIG. 24 shows an example of data structure of direction-to-transfer function correspondence information for measurement-based omnidirectional transfer functions;

DESCRIPTION OF THE PREFERRED EMBODIMENTS

The present invention is described in further detail below with reference to specific embodiments in terms of the following items.

1. Basic configuration 1-1. Reproduction of a single sound image position 1-2. Reproduction of a plurality of sound image positions 1-3. Reproduction of a sound field on a second closed surface 2. Reproduction of sound field according to embodiments 2-1. Adjustment using measurement-based omnidirectional transfer functions 2-2. Adjustment using information associated with sound delay time and sound level 3. Additional configurations 3-1. Reproduction of direction of directivity of sound source 3-2. Simulation of playing form 3-3. Reproduction of stereo effector 3-4. Reproduction of directivity of sound source and reproduction of sound emission characteristics for each directivity 3-5. Addition of ambience data 3-6. Reproduction of sound field depending on camera viewpoint 4. Sound field reproduction system according to embodiments 4-1. Example of system configuration Note that in the present description, a "calculation process according to a transfer function" on an audio signal refers to, unless otherwise stated, a process of determining a convolution integral of the audio signal and a transfer function or a process of filtering an audio signal using a FIR (Finite Impulse Response) filter with filter coefficients corresponding to a transfer function.

1. Basic Configuration

1-1. Reproduction of a Single Sound Image Position

Figure 1:
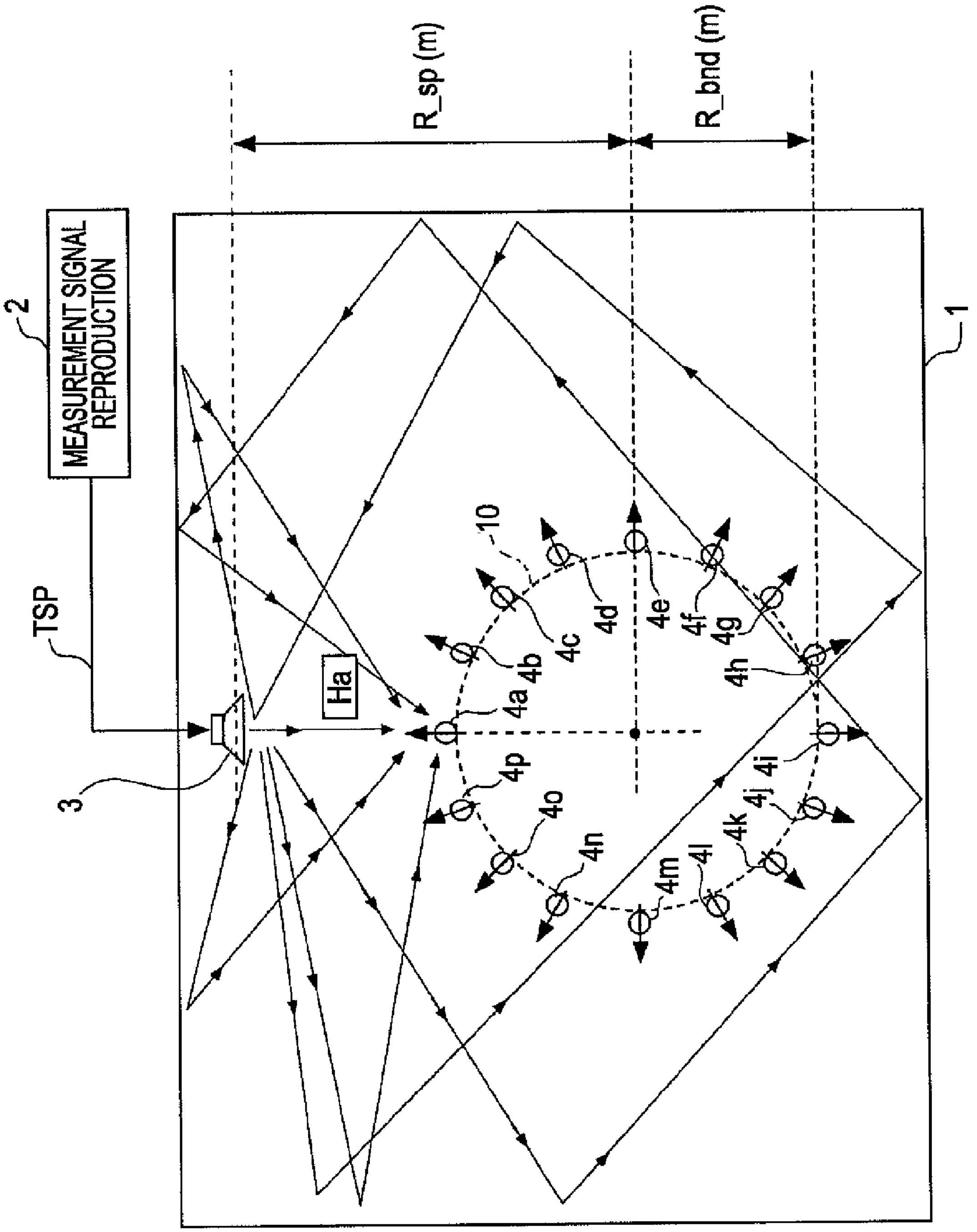
FIG. 1 is a schematic diagram showing a measurement environment.

FIG. 1 is a schematic diagram showing a measurement environment in which measurement for reproduction of a sound field is performed.

The sound field reproduction technique explained herein in "1. Basic configuration" is a technique on which to base a sound reproduction technique according to embodiments of the present invention, and this basic technique is also described in an earlier application laid-open as Japanese Unexamined Patent Application Publication No. 2002-186100.

In FIG. 1, a sound field to be reproduced later in a reproduction environment (which will be described later) is generated in a measurement environment 1 such as a concert hall or a live event place.

In the measurement environment 1, for example, measurement microphones 4*a*, 4*b*, 4*c*, 4*d*, 4*e*, 4*f*, 4*g*, 4*h*, 4*i*, 4*j*, 4*k*, 41, 4*m*, 4*n*, 4*o*, and 4*p* are placed on the circumference of a circle with a radius R_bnd such that the positions thereof are not too close to any wall of the measurement environment 1.

Hereinafter, the circumference of the circle with the radius R_bnd will be referred to as a first closed surface 10. Herein, the term "closed surface" is used to describe an imaginary surface that partitions space into two regions: an inner region; and an outer region. Note that the first closed surface 10 does not necessarily need to be a circular (spherical). When it is not necessary to take into account the reproducibility in a vertical direction in the measurement environment and the reproduction environment, the measurement microphones 4 (and reproduction speakers 8 which will be described later) may be placed two-dimensionally in a single plane. In the present embodiment, for simplicity, it is assumed that the first closed surface 10 defines a circular environment area.

The measurement microphones 4*a* to 4*p* are assumed to be placed such that they are directive in an outward direction normal to the first closed surface 10. An arrow drawn on each microphone indicates the principal direction of the directivity of the microphone in the present figure and also in other figures.

The measurement speaker 3 serving as a virtual sound source is placed at a position apart by a distance R_sp from the center of the circle defined by the first closed surface 10. A measurement signal is supplied to the measurement speaker 3 from a measurement signal reproduction unit 2. More specifically, a time stretched pulse (TSP) signal by which to measure an impulse response (described later) is used as the measurement signal.

Because the measurement speaker 3 is placed herein to reproduce a virtual speaker in a reproduction environment described later, it is desirable that characteristics such as directivity and a frequency characteristic of the measurement speaker 3 be selected taking into account characteristics of the sense of hearing of listeners in the reproduction environment.

Note that the measurement in the measurement environment 1 is performed such that the measurement signal TSP is supplied to the measurement speaker 3 and the measurement signal output from the measurement speaker 3 is input to each of the measurement microphones 4*a* to 4*p*, although FIG. 1 shows only a sound path from the measurement speaker 3 to the measurement microphone 4*a*.

The audio signal detected by each of the measurement microphones 4*a* to 4*p* is supplied to an impulse response measurement unit (not shown). Based on the sound pressure of the sound detected by each of the measurement microphones 4, the impulse response measurement unit measures the impulse response from the measurement speaker 3 to each of the measurement microphones 4*a* to 4*p*. The impulse response can be as long as 5 to 10 seconds when the measurement is performed in a large hall. When the measurement is performed in a small hall or a hall with small reverberation, the impulse response is shorter. A transfer function is determined based on each measured impulse response. More specifically, for example, a transfer function Ha along a sound path from the measurement speaker 3 to the measurement microphone 4*a* is determined as shown in FIG. 1. Although not shown in FIG. 1, transfer functions Hb to Hp from the measurement speaker 3 to the respective measurement microphones 4*b* to 4*p* are also determined in a similar manner.

The impulse response measurement may be performed separately for each measurement microphone or may be performed simultaneously for all measurement microphones 4*a* to 4*p*. The measurement signal is not limited to the TSP signal, but other signals such as pseudo-random noise or a music signal may be used.

In the following explanation, a transfer function from a measurement speaker to a measurement microphone in the measurement environment 1 is also denoted by H.

Thus, the transfer functions Ha, Hb, Hc, Hd, . . . , Hp corresponding to the respective measurement microphones 4*a*, 4*b*, 4*c*, 4*d*, . . . , 4*p* in the measurement environment 1 are determined in the above-described manner. By using these transfer functions Ha to Hp, the sound field in the measurement environment 1 can be reproduced in another environment (reproduction environment).

Figure 2:
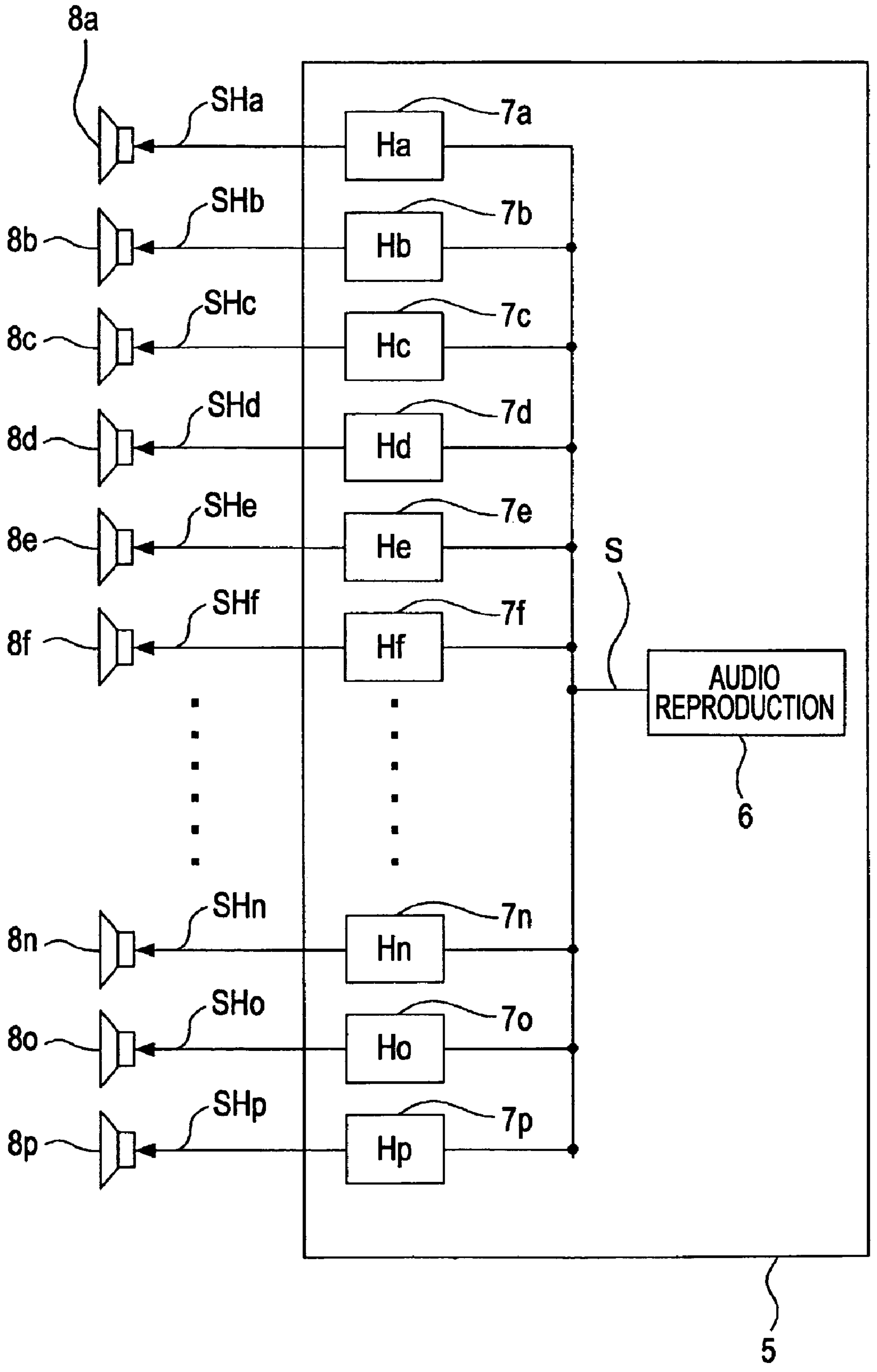
FIG. 2 is a block diagram showing a basic configuration of a sound reproducing system for reproducing a sound in a reproduction environment.

FIG. 2 shows a reproduction system (a reproduction signal generator) configured to reproduce a sound in a reproduction environment.

In the reproduction signal generator 5, a sound reproduction unit 6 is configured to output an arbitrary audio signal S. The audio signal S output from the sound reproduction unit 6 is supplied to calculation units 7*a*, 7*b*, 7*c*, 7*d*, . . . , 7*n*, 7*o*, and 7*p*. The transfer functions Ha to Hp measured using the respective measurement microphones 4*a* to 4*p* are set in the respective calculation units 7*a* to 7*p* with the same subscripts as the subscripts of the transfer functions. The respective calculation units 7 perform a calculation process on the supplied audio signal S in accordance with the transfer functions H set in the respective calculation units 7. As a result, the calculation units 7*a* to 7*p* respectively output reproduction signals SHa, SHb, SHc, SHd, . . . , SHn, SHo, and SHp in the form of convolutions of an audio signal S and the respective impulse responses.

Note that as described above, the operation of each calculation unit 7 can also be realized by using an FIR filter with filter coefficients corresponding to each transfer function (impulse response). This can also be applied to all calculation units described later.

The reproduction signals SHa to SHp are supplied to respective reproduction speakers 8*a*, 8*b*, 8*c*, 8*d*, . . . , 8*n*, 8*o*, and 8*p* placed in the reproduction environment. As a result, the respective reproduction speakers 8*a* to 8*p* output sounds in accordance with the reproduction signals SHa to SHp generated according to the transfer functions Ha to Hp in the measurement environment 1.

Figure 3:
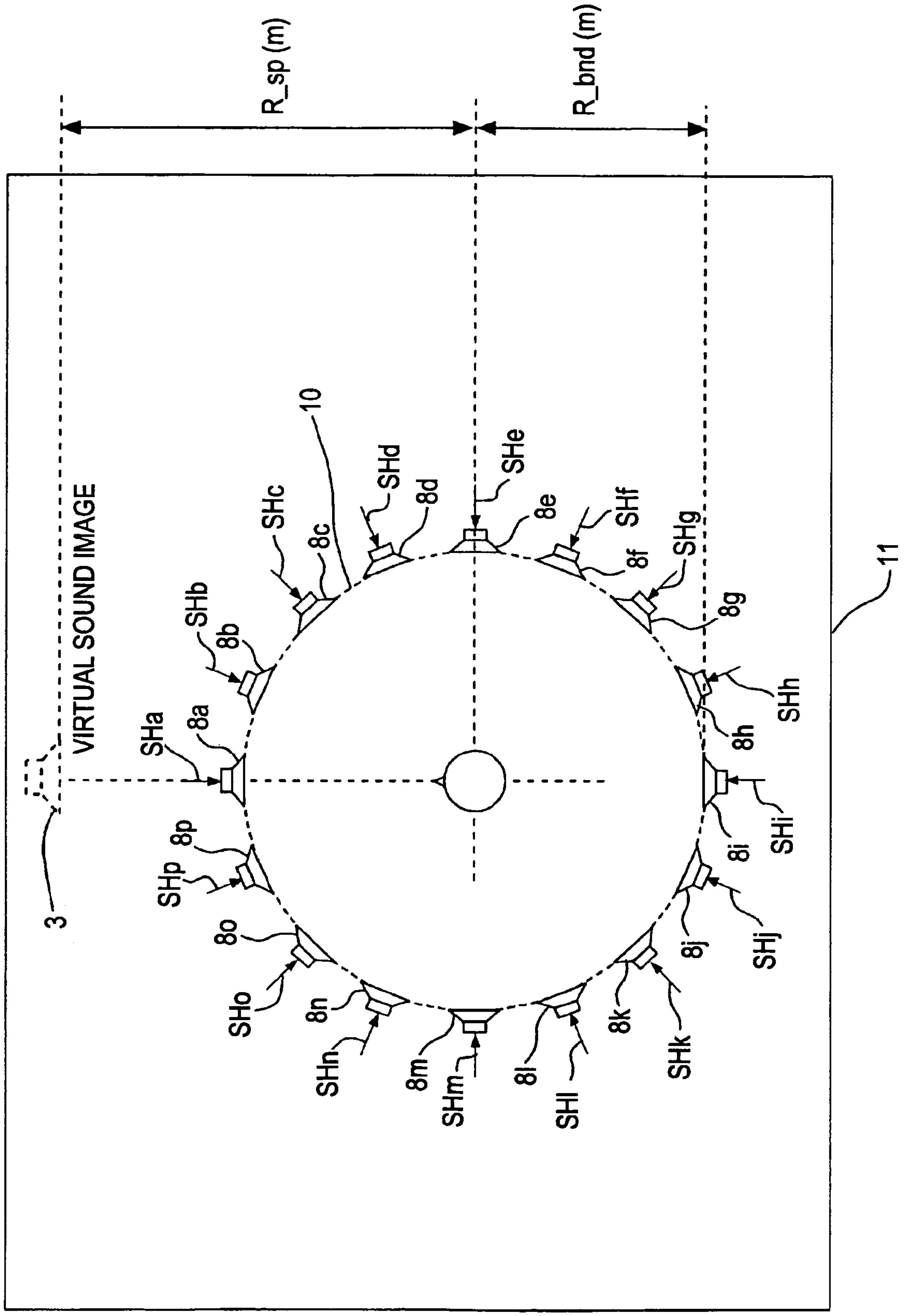
FIG. 3 is a schematic diagram showing a reproduction environment.

FIG. 3 is a schematic diagram showing a reproduction environment.

Specific examples of the reproduction environment 11 are an anechoic room and a studio with low sound reverberation.

The reproduction speakers 8*a* to 8*p* shown in FIG. 2 are placed in the reproduction environment 11 such that the reproduction speakers 8*a* to 8*p* are placed, on the circumference of the first closed surface 10 with a radius R_bnd, at positions corresponding to the respective positions of the measurement microphones 4*a* to 4*p* shown in FIG. 1 and such that they face in inward directions. Note that the reproduction speakers 8*a* to 8*p* correspond to the measurement microphones with the same subscripts (a to p) as the subscripts of the reproduction speakers.

Note that although the first closed surface 10 in the measurement environment 1 and the first closed surface 10 in the reproduction environment 11 are imaginary closed surfaces lying in different spaces, they are denoted by the same reference numeral for the purpose of convenience because they are geometrically identical closed surfaces with the same radius.

When sounds are output from these reproduction speakers 8*a* to 8*p* by supplying them with the reproduction signals SHa to SHp as shown in FIG. 2, a listener present in space on the inner side of the first closed surface 12 feels as if the sound field generated in accordance with the audio signal S reproduced from the measurement speaker 3 shown in FIG. 1 were reproduced in space on the outer side of the first closed surface 10.

It is known that a sound field in an environment in which no sound source exists in space on the inner side of a certain closed surface can be accurately reproduced in a different environment by generating a sound such that there are no differences in the sound pressure and the particle velocity on the circumference of the closed surface between the original sound field and the reproduced sound field (see "Acoustic System and Digital Processing", edited by The Institute of Electronics, Information, and Communications Engineers (Corona publishing Co., Ltd)). In this technique, an infinite number of bidirectional microphones are placed on a closed surface, and the sound pressure and the particle velocity are measured at respective positions of the bidirectional microphones. More specifically, an infinite number of measurement microphones are placed on the first closed surface 10 in the measurement environment 1 such that they face in outward directions normal to the first closed surface 10, and an infinite number of corresponding reproduction speakers are placed on the first closed surface 10 in the reproduction environment 11. In this situation, if a listening position is set in the inner space surrounded by the first closed surface 10 in the reproduction environment 11, a listener can perceive a sound image localized at a definite location and reverberation similar to those as perceived in the inner space surrounded by the first closed surface 10 in the measurement environment 1. The listener can also perceive a virtual sound image at the position of the measurement speaker 3 which is not actually placed in the reproduction environment 11. That is, a sound field similar to that in the space on the outer side of the first closed surface 10 in the measurement environment 1 is precisely reproduced and can be perceived at any listening position in the space on the inner side of the first closed surface 10 in the reproduction environment 11.

However, in practice, it is difficult to dispose an infinite number of microphones and an infinite number of reproduction speakers. To solve the above problem, the present applicant has developed a technique that allows similar sound effects to be achieved using a finite number of directional microphones and a corresponding number of reproduction speakers, based on the fact that the output of a directional microphone such as a unidirectional microphone includes a sound pressure component and a particle velocity component.

This makes it possible to reproduce substantially the same sound field in the measurement environment 1 such as a hall in the reproduction environment 11 such as an anechoic room.

Note that in this technique, once the impulse response in the measurement environment 1 has been measured as shown in FIG. 1, the sound field in the measurement environment 1 can be virtually reproduced in an environment such as the reproduction environment 11 different from the measurement environment 1 by using the measured data (transfer functions).

In the technique described above with reference to FIG. 2, there is no restriction on the sound to be reproduced, and an arbitrary sound can be reproduced as if the sound were actually generated in a hall in which the measurement was performed.

1-2. Reproduction of a Plurality of Sound Image Positions

In the above explanation, it is assumed that the impulse responses from one measurement speaker 3 to the respective measurement microphones 4*a* to 4*p* are measured in the measurement environment 1, and one sound image position is reproduced in the reproduction environment 11 using the measurement result. This technique can also be used to reproduce a plurality of sound image positions at which a plurality of measurement speakers 3 are placed as shown in FIG. 4.

Figure 4:
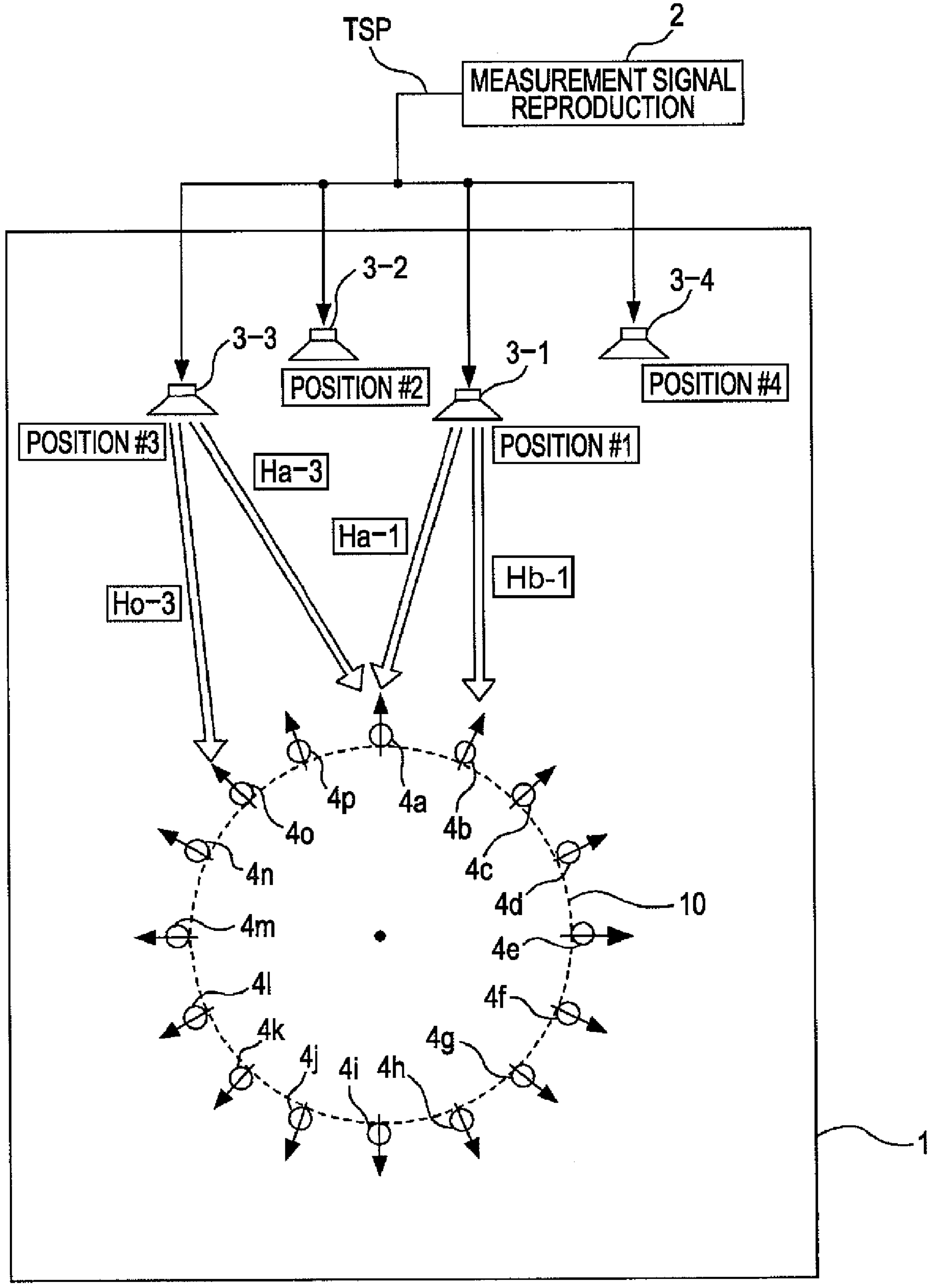
FIG. 4 shows a manner in which measurement for reproduction of a plurality of virtual sound image positions is performed in a measurement environment.

In this case, as shown in FIG. 4, in a measurement environment 1 in which measurement microphones 4*a* to 4*p* are placed in a similar manner as in FIG. 1, a plurality of measurement speakers 3-1, 3-2, 3-3, and 3-4 are placed at different positions in the region on the outer side of the first closed surface 10. In the specific example shown in FIG. 4, the measurement speaker 3-1 is placed at position #1, the measurement speaker 3-2 at position #2, the measurement speaker 3-3 at position #3, and the measurement speaker 3-4 at position #4.

The measurement in the measurement environment 1 is performed separately for each measurement speaker 3 by supplying the measurement signal TSP to each measurement speaker 3. In the measurement, measurement microphones 4*a* to 4*p* detect the output audio signal for each measurement speaker 3. The audio signal detected by each measurement microphone 4 for each measurement speaker 3 is supplied to an impulse response measurement unit (not shown) to measure the impulse response from each measurement speaker 3 (3-1 to 3-4) to each of measurement microphones 4*a* to 4*p*. Based on the measurement result, the transfer function from each measurement speaker 3 to each measurement microphone 4 can be determined.

For example, in FIG. 4, the path of the transfer function Ha-1 from the measurement speaker 3-1 to the measurement microphone 4*a*, and the path of the transfer function Hb-1 from the measurement speaker 3-1 to the measurement microphone 4*b* are schematically shown. In this figure, also shown are the path of the transfer function Ha-3 from the measurement speaker 3-3 to the measurement microphone 4*a*, and the path of the transfer function Ho-3 from the measurement speaker 3-3 to the measurement microphone 40.

Thus, by applying the measurement signal TSP separately to each measurement speaker 3, it is possible to determine transfer functions Ha-1 to Hp-1 from the measurement speaker 3-1 to respective measurement microphones 4*a* to p, transfer functions Ha-2 to Hp-2 from the measurement speaker 3-2 to respective measurement microphones 4*a* to p, transfer functions Ha-3 to Hp-3 from the measurement speaker 3-3 to respective measurement microphones 4*a* to p, and transfer functions Ha-4 to Hp-4 from the measurement speaker 3-4 to respective measurement microphones 4*a* to p.

Note that it is desirable that the measurement of the impulse response should be performed by applying the measurement signal TSP separately to each measurement speaker 3 to prevent sounds output from measurement speakers 3 located at different positions from being mixed together. Instead of placing a plurality of measurement speakers 3, a single measurement speaker 3 may be placed from one position to another.

Figure 5:
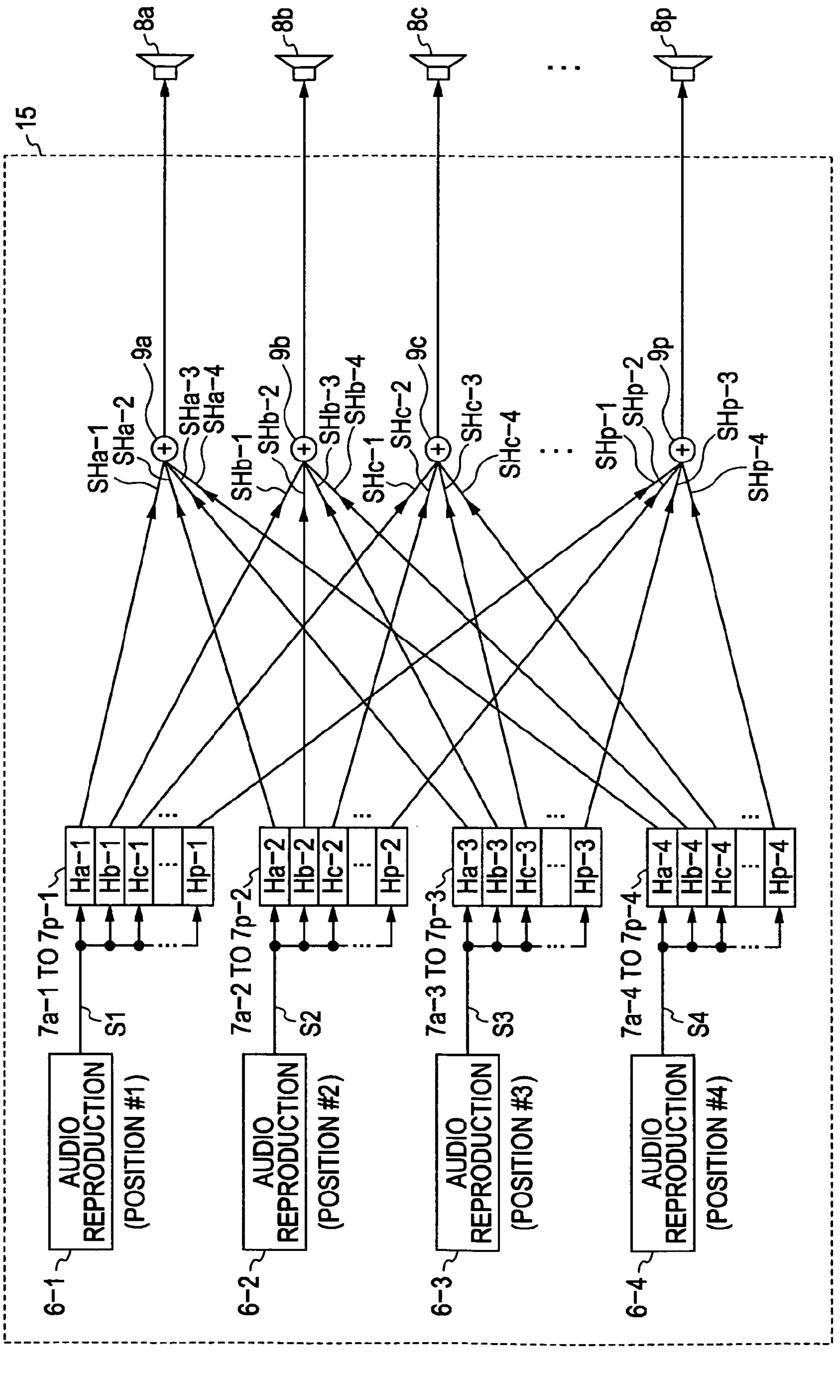
FIG. 5 shows a configuration of a reproduction signal generator adapted to reproduce a plurality of virtual sound image locations.

FIG. 5 shows a reproduction signal generator 15 configured to generate reproduction audio signals for reproducing a sound field (hereinafter also referred to simply as a reproduction signal) based on these transfer functions Ha-1 to Hp-1, Ha-2 to Hp-2, Ha-3 to Hp-3, and Ha-4 to Hp-4.

The reproduction signal generator 15 is adapted to output different sounds from the respective sound image positions (position #1 to position #4). To this end, the reproduction signal generator 15 includes a total of four sound reproduction units (sound reproduction units 6-1, 6-2, 6-3, and 6-4) corresponding to the respective positions #1 to #4.

Each sound reproduction unit 6 is adapted to output an arbitrary audio signal S. Herein, the audio signals S output from the respective sound reproduction units 6 are denoted by audio signals S1, S2, S3, and S4 so as to correspond to the position numbers (#1 to #4).

Furthermore, four sets of calculation units 7 corresponding to the respective positions #1 to #4 are provided. More specifically, the reproduction signal generator 15 includes a first set of calculation units 7*a*-1 to 7*p*-1 corresponding to position #1, a second set of calculation units 7*a*-2 to 7*p*-2 corresponding to position #2, a third set of calculation units 7*a*-3 to 7*p*-3 corresponding to position #3, and a fourth set of calculation units 7*a*-4 to 7*p*-4 corresponding to position #4.

As shown in FIG. 5, transfer functions Ha-1 to Hp-1 determined based on the outputs of the respective measurement microphones 4 for the sound output from the measurement speaker 3-1 (at position #1) are set in the calculation units 7*a*-1 to 7*p*-1. If the audio signal S1 is input from the sound reproduction unit 6-1 to these calculation units 7*a*-1 to 7*p*-1, the audio signal S1 is subjected to calculation processes based on the respective transfer functions H set in the calculation units 7*a*-1 to 7*p*-1, and reproduction signals SHa-1 to SHp-1 are output. As a result, reproduction signals for reproduction of the sound image position (position #1) of the measurement speaker 3-1 are obtained.

Transfer functions Ha-2 to Hp-2 determined based on the outputs of the respective measurement microphones 4 for the sound output from the measurement speaker 3-2 (at position #2) are set in the calculation units 7*a*-2 to 7*p*-2. The audio signal S2 input from the sound reproduction unit 6-2 to these calculation units 7*a*-2 to 7*p*-2 is subjected to calculation processes based on the respective transfer functions H set in the calculation units 7*a*-2 to 7*p*-2, and reproduction signals SHa-2 to SHp-2 are output. As a result, reproduction signals for reproduction of the sound image position (position #2) of the measurement speaker 3-2 are obtained.

Similarly, transfer functions Ha-3 to Hp-3 determined based on the outputs of the respective measurement microphones 4 for the sound output from the measurement speaker 3-3 (at position #3) are set in the calculation units 7*a*-3 to 7*p*-3. The audio signal S1 input from the sound reproduction unit 6-3 to these calculation units 7a-3 to 7p-3 is subjected to calculation processes based on the respective transfer functions H set in the calculation units 7a-3 to 7p-3, and reproduction signals SHa-3 to SHp-3 are output. As a result, reproduction signals for reproduction of the sound image position (position #3) of the measurement speaker 3-3 are obtained.

Furthermore, transfer functions Ha-4 to Hp-4 determined based on the outputs of the respective measurement microphones 4 for the sound output from the measurement speaker 3-4 (at position #4) are set in the calculation units 7a-4 to 7p-4. The audio signal S4 input from the sound reproduction unit 6-4 to these calculation units 7a-4 to 7p-4 is subjected to calculation processes based on the respective transfer functions H set in the calculation units 7a-4 to 7p-4, and reproduction signals SHa-4 to SHp-4 are output. As a result, reproduction signals for reproduction of the sound image position (position #4) of the measurement speaker 3-4 are obtained.

The reproduction signal generator 15 also includes adders 9a to 9p each of which corresponds to one of reproduction speakers 8a to 8p. Signals outputs from calculation units 7a-1 to 7p-1, signals outputs from calculation units 7a-2 to 7p-2, signals outputs from calculation units 7a-3 to 7p-3, and signals outputs from calculation units 7a-4 to 7p-4 are applied to the adders 9a to 9p such that the signals output from calculation units 7 are input to the adder with the same alphabetic subscript (a to p) as the subscript of the calculation units. The input signals are added together, and results are supplied to reproduction speakers 8 with corresponding alphabetic subscripts.

More specifically, four reproduction signals SHa-1, SHa-2, SHa-3, and SHa-4 output from the respective calculation units 7a-1, 7a-2, 7a-3, and 7a-4 are applied to the adder 9a and are added together. The resultant signal is supplied to the reproduction speaker 8a. As a result, the speaker 8a outputs a reproduction sound corresponding to sound paths, shown in FIG. 4, from all positions #1 to #4 to the measurement microphone 4a.

On the other hand, four reproduction signals SHp-1, SHp-2, SHp-3, and SHp-4 output from the respective calculation units 7p-1, 7p-2, 7p-3, and 7p-4 are applied to the adder 9p and are added together. The resultant signal is supplied to the reproduction speaker 8p. As a result, the speaker 8p outputs a reproduction sound corresponding to sound paths, shown in FIG. 4, from all positions #1 to #4 to the measurement microphone 4p.

Adding of reproduction signals SH is performed in a similar manner also by the other adders 9b to 9o, and speakers 8b to 8o corresponding to these adders output reproduction signals corresponding to the sound paths from all positions #1 to #4 to the respective corresponding measurement microphones 4.

As a result, a listener in the region surrounded by these reproduction speakers 8a to 8p, that is, in the inner region surrounded by the first closed surface 10 in the reproduction environment 11 feels that a sound field created by sounds output from the respective measurement speakers 4 (at positions #1 to #4) shown in FIG. 4 is virtually reproduced in the region on the outer side of the first closed surface 10. That is, sound images are reproduced (localized or presented) at respective positions #1 to #4.

Figure 6:
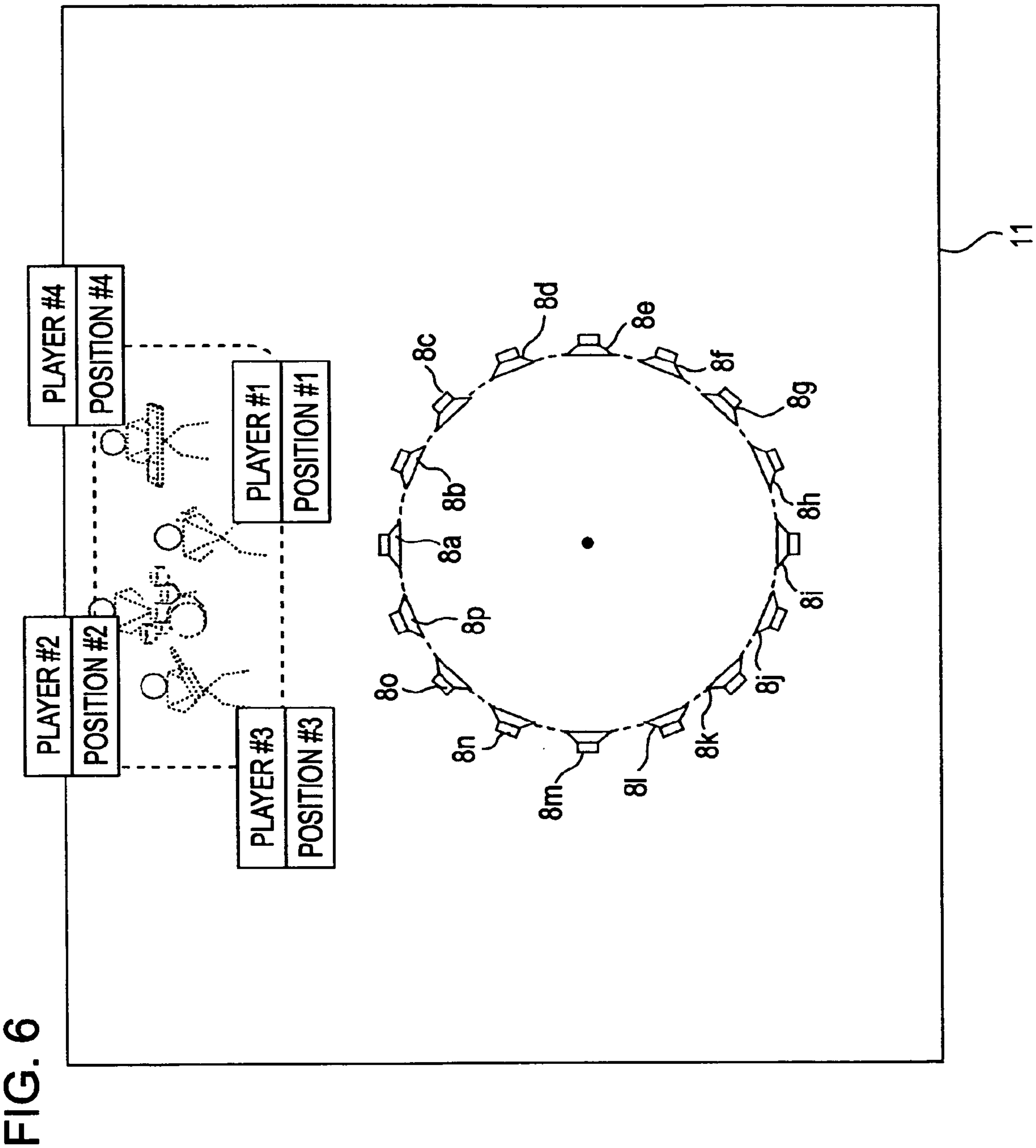
FIG. 6 is a schematic diagram showing a reproduction environment in which to reproduce a plurality of virtual sound image locations.

FIG. 6 schematically illustrates a manner in which sound images are reproduced in the reproduction environment 11.

In the reproduction signal generator 15 shown in FIG. 5, sounds originating from the respective positions #1 to #4 are allowed to be input separately. For example, if sounds generated by different players at respective positions #1 to #4, such as a vocal sound, a drum sound, a guitar sound, and a keyboard sound, are input, then, as shown in FIG. 6, sound images are presented at corresponding positions and more specifically such that the vocal sound (by player #1) is reproduced at position #1, the drum sound (played by player #2) is reproduced at position #2, the guitar sound (played by player #3) is reproduced at position #3, and the keyboard sound (played by player #4) is reproduced at position #4.

1-3. Reproduction of a Sound Field on a Second Closed Surface

In the sound field reproduction techniques described above, better localization of a sound image (higher reproducibility of a sound field) can be obtained with increasing number of positions for measurement speakers 4 and increasing number of positions for reproduction speakers 8 in the reproduction environment 11. From this point of view, it is more desirable that the reproduction environment 11 allow a great number of reproduction speakers 8 to be placed. However, this is difficult for practical reproduction environments such as a room of an ordinary house.

In a general environment such as a room of an ordinary house, there is generally a restriction on the number of speaker positions. In addition to the restriction on the number of speaker positions, another possible problem is that speaker positions can vary from one house to another. Thus, in reproduction of a sound field in an ordinary house, it is needed to perform measurement in a measurement environment such as a hall such that the number of measurement microphones 4 and the positions thereof are determined taking into account the possibility that the sound field will be reproduced in houses under various conditions. That is, it is needed to perform measurement separately for each of various houses.

Thus, to adapt to conditions in terms of the number of speakers and the positions thereof which are predicted to be used in each house, it is needed to separately perform measurement in a hall by using measurement microphones placed at positions corresponding to the assumed positions of speakers. This needs a large amount of labor and a high cost.

The fact that the sound field in the measurement environment 1 can be reproduced in the region on the inner side of the first closed surface 10 in the reproduction environment 11 means that reproduction signals for reproducing the sound field in the measurement environment 1 in a region on the inner side of an second closed surface defined in a regions on the inner side of the first closed surface 10 can be obtained by performing calculations using transfer functions from the respective speakers placed on the first closed surface 10 to corresponding positions on the second closed surface.

That is, the sound field in the measurement environment 1 can be reproduced in the region on the inner side of the second closed surface.

Thus, once the measurement in the hall the sound field in which to be reproduced has been performed, transfer functions needed to reproduce the sound field in a reproduction environment such as a room of a house different from the originally assumed reproduction environment 11 can be determined by performing measurement from the reproduction speakers 8 to positions of respective measurement microphones on the second closed surface 14 in a proper reproduction environment 11 such as a laboratory without having to perform measurement in the original measurement environment 1.

It should be noted herein that the technique of reproducing a sound field on the first closed surface 10 in the reproduction environment 11 can find a wide variety applications in addition to an application to a room of an ordinary house.

For example, some live events are held in a form in which a live video image of an actual performance is displayed on a screen, and a live sound is emitted. Such a live event form is called a film live event.

In a place where such a film live event is held, it is allowed to place a large number of reproduction speakers 8 (that is, it is allowed to place a large number of measurement microphones 4 in the measurement process). By outputting a reproduction sound from such a large number of reproduction speakers 8 according to the information measured in an actual live hall, it is possible to reproduce a sound field very similar to that obtained in an actual live concert. If it is allowed to determine positions for respective players in advance, it is allowed to perform the measurement for the respective positions in the actual hall and reproduce the sound images at correct positions corresponding to the respective players by performing the calculation process on the sounds of the respective players in accordance with the measurement result (transfer functions).

Figure 7:
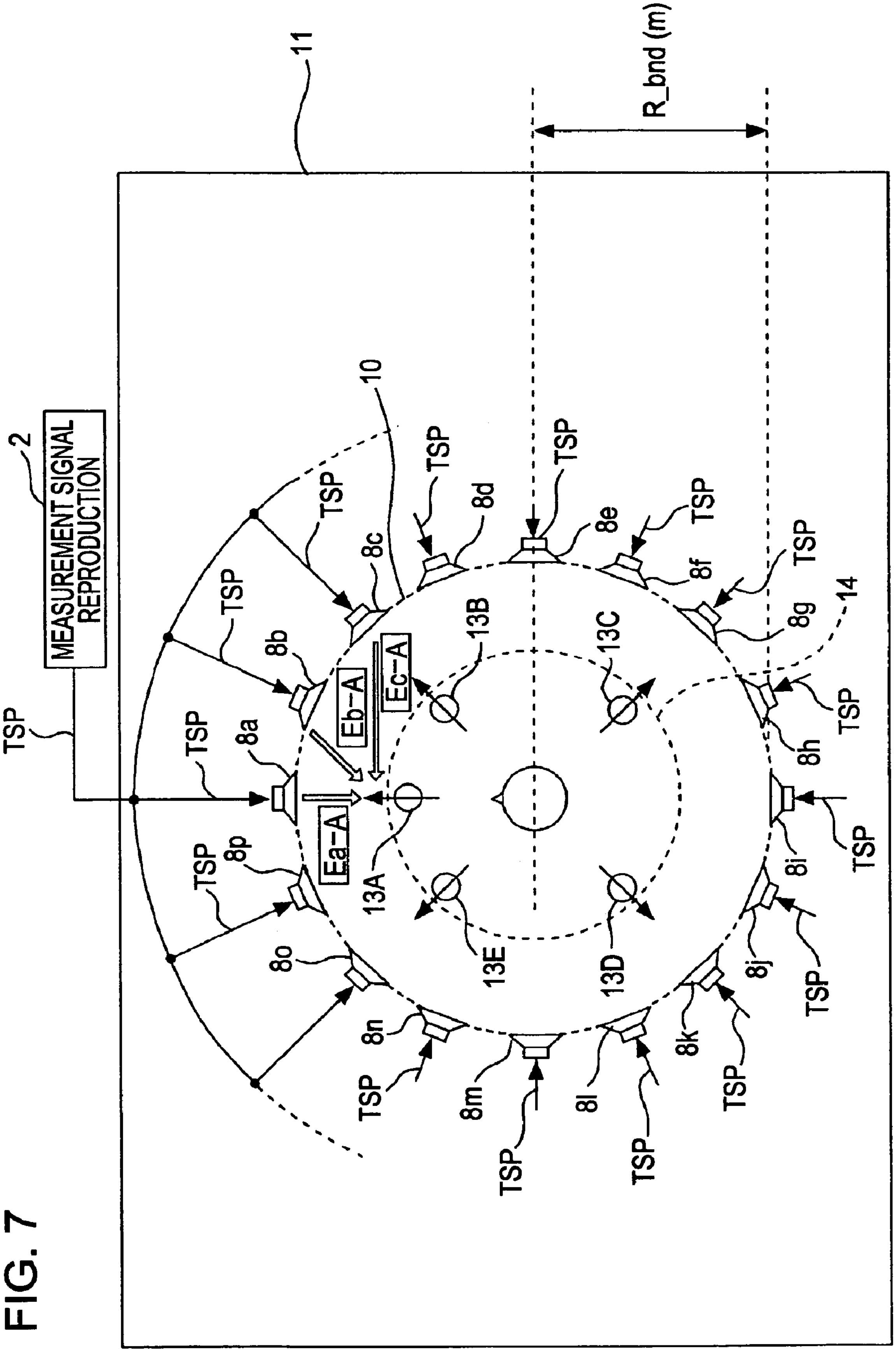
FIG. 7 is a schematic diagram showing a manner in which measurement for reproduction of a sound field on a second closed surface is performed in a measurement environment.

FIG. 7 is a schematic diagram illustrating a method of measuring impulse responses to determine transfer functions needed to reproduce a sound field on the second closed surface located in space on the inner side of the first closed surface 10.

In this example shown in FIG. 7, for the purpose of simplicity, it is assumed that only one measurement speaker 3 is placed in the measurement environment 1 to perform measurement needed to reproduce the sound image position thereof.

In FIG. 7, measurement microphones 13A, 13B, 13C, 13D, and 13E are placed in the region on the inner side of the first closed surface 10 in the reproduction environment 11. These measurement microphones 13A to 13E are placed at positions corresponding to positions where reproduction speakers will be placed in a reproduction environment (for example, a reproduction environment 20 described later) such a room in a house, and the number of measurement microphones 13A to 13E and positions thereof are not limited to those shown in FIG. 7.

In this example shown in FIG. 7, a closed surface on which the measurement microphones 13A to 13E are placed is denoted as a second closed surface 14. It is assumed herein that the region inside this second closed surface 14 corresponds to a reproduction environment such as a room in an ordinary house in which listening will be performed.

Because the second closed surface 14 should be formed in the regions on the inner side of the first closed surface 10, it is desirable to form the first closed surface 10 in the measurement environment 1 taking into account the predicted size of the second closed surface 14.

Furthermore, it is also desirable to place as many measurement microphones 4 as possible in the measurement in the hall to determine transfer functions H for as many points as possible on the first closed surface 10. This makes it possible to achieve higher reproducibility in reproduction of the sound field of the measurement environment 1 in the reproduction environment 11, and also achieve higher reproducibility for reproduction in a smaller reproduction environment such as a room in an ordinary house.

In the measurement to adapt to a smaller reproduction environment, as shown in FIG. 7, the measurement signal TSP output from the measurement signal reproduction unit 2 is applied separately to each of the reproduction speakers 8 placed on the first closed surface 10, and impulse responses from each speaker 8 to the respective measurement microphones 13 are measured. Based on the impulse responses, transfer functions are determined for paths from each speaker 8 to the respective measurement microphones 13.

The transfer functions for paths from the reproduction speakers placed on the first closed surface 10 to the measurement microphones placed on the second closed surface 14 are denoted by E.

For example, as shown in FIG. 7, the transfer function from the reproduction speaker 8*a* to the measurement microphone 13A is denoted by Ea-A. Similarly, the transfer function from the reproduction speaker 8*b* to the measurement microphone 13A is denoted by Eb-A, and the transfer function from the reproduction speaker 8*c* to the measurement microphone 13A is denoted by Ec-A.

Although not shown in FIG. 7, the transfer functions from the reproduction speaker 8*a* to the other measurement microphones 13B to 13E are denoted by Ea-B, Ea-C, Ea-D, and Ea-E, the transfer functions from the reproduction speaker 8*b* to the measurement microphones 13B to 13E are denoted by Eb-B, Eb-C, Eb-D, and Eb-E, and the transfer functions from the reproduction speaker 8*c* to the measurement microphones 13B to 13E are denoted by Ec-B, Ec-C, Ec-D, and Ec-E. In the following explanations, subscripts of lower-case alphabetic letters are used to distinguish respective measurement speakers 8 from each other, and upper-case alphabetic letters following a hyphen are used to distinguish respective measurement speaker 13 from each other in the notation of the transfer functions E from respective speakers to respective microphones.

By using the transfer functions E determined in the above-described manner, the sound field reproduced in the region on the inner side of the first closed surface 10 can be reproduced in the region on the inner side of the second closed surface 14. As described above, because the sound field in the measurement environment 1 can be reproduced in the region on the inner side of the first closed surface 10 in the reproduction environment 1 by using the transfer functions H, the sound field in the measurement environment 1 can also be reproduced in the region on the inner side of the second closed surface 14.

Figure 8:
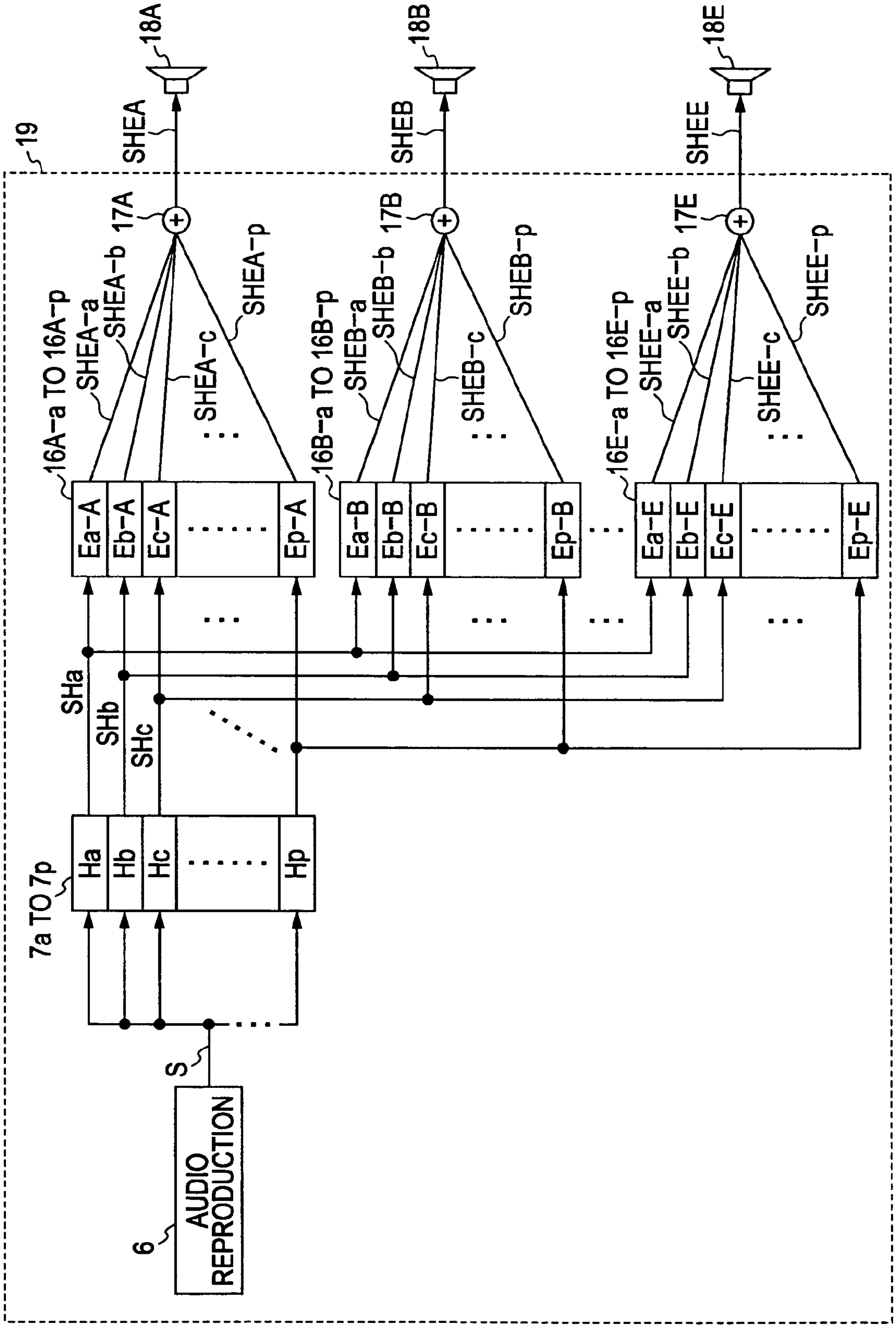
FIG. 8 is a block diagram showing a configuration of a reproduction signal generator adapted to reproduce a sound field on a second closed surface.

FIG. 8 shows a configuration of a reproduction signal generator 19 adapted to reproduce the sound field of the measurement environment 1 in the region on the inner side of the second closed surface 14.

In FIG. 8, reproduction speakers placed in an actual reproduction environment 20 such as a room in a house are denoted by reproduction speakers 18A, 18B, . . . , 18E.

First, as with reproduction signal generator 5 shown in FIG. 2, an audio signal S output from a sound reproduction unit 6 is input to calculation units 7*a* to 7*p* in which transfer functions Ha to Hp are respectively set. The calculation units 7*a* to 7*p* perform calculation processes on the input audio signal S in accordance with the respective transfer functions Ha to Hp and output resultant reproduction signals SHa to SHp corresponding to the respective reproduction speakers 8*a* to 8*p*.

As can be seen from FIG. 7, the sound output from each reproduction speaker 8 on the first closed surface 10 is input to each microphone 13 on the second closed surface 14. Correspondingly, as many transfer functions E are obtained for each measurement microphone 13 as there are reproduction speakers 8*a* to 8*p* on the first closed surface 10. More specifically, transfer functions Ea-A, Eb-A, . . . , Ep-A are obtained for the measurement microphone 13A, transfer functions Ea-B, Eb-B, . . . , Ep-B are obtained for the measurement microphone 13B, transfer functions Ea-C, Eb-C, . . . , Ep-C are obtained for the measurement microphone 13C, transfer functions Ea-D, Eb-D, . . . , Ep-D are obtained for the measurement microphone 13D, and transfer functions Ea-E, Eb-E, . . . , Ep-E are obtained for the measurement microphone 13E.

In order to obtain reproduction signals at respective positions of the measurement microphones 13 on the second closed surface 14 (that is, at respective positions of the reproduction speakers 18 placed in the actual reproduction environment 20), calculation units 16A-a to 16A-p, 16B-a to 16B-p and 16E-a to 16E-p in which transfer functions E for respective microphones 13 are set are provided for the respective positions (A to E) of the measurement microphones 13.

As shown in FIG. 8, the reproduction signals SHa-4 to SHp-4 output from the respective calculation units 7*a* to 7*p* are applied to the calculation units 16A-a to 16A-p, 16B-a to 16B-p, and 16E-a to 16E-p, such that a reproduction signal SH with a subscript of a particular lower-case alphabetic letter is applied to a calculation unit with a subscript of the same lower-case alphabetic letter following a hyphen. Each calculation unit performs a calculation process on the input reproduction signal SH in accordance with the transfer function E set therein.

Thus reproduction signals SHE are obtained as a result of the calculation processes according to the transfer functions E corresponding to the respective paths from the measurement speakers 8*a* to 8*p* on the first closed surface 10 to the respective positions of the measurement microphones 13A to 13E (the positions of the reproduction speakers 18A to 18E).

More specifically, for example, for the measurement microphone 13A (the reproduction speaker 18A), reproduction signals SHEA-a to SHEA-p are obtained as a result of the calculation processes performed according to the transfer functions E corresponding to the paths from the respective measurement microphones 8*a* to 8*p*. Similarly, for the measurement microphone 13B (the reproduction speaker 18B), reproduction signals SHEB-a to SHEB-p are obtained as a result of the calculation processes performed according to the transfer functions E corresponding to the paths from the respective measurement microphones 8*a* to 8*p*.

Similarly, reproduction signals SHEC-a to SHEC-p, SHED-a to SHED-p, and SHEE-a to SHEE-p are output from the calculation units 16C-a to 16C-p, 16D-a to 16D-p, and 16E-a to 16E-p.

The reproduction signal generator 19 also includes adders 17A, 17B, . . . , 17E each of which corresponds to one of reproduction speakers 18A, 18B, . . . , 18E.

As shown in FIG. 8, reproduction signals SHEA-a to SHEA-p output from calculation units 16A-a to 16A-p, reproduction signals SHEB-a to SHEB-p output from calculation units 16B-a to 16B-p, . . . , reproduction signals SHEE-a to SHEE-p output from calculation units 16E-a to 16E-p, are applied to the respective adders 17A, 17B, . . . , 17E. These reproduction signals are added together by the adders and resultant signals are supplied to the corresponding reproduction speakers 18A, 18B, . . . ,18E.

As can be seen from the above explanation, reproduction signals SHEAa to SHEEp obtained as a result of calculation processes performed for the respective measurement microphones 13 (the reproduction speakers 18) according to the corresponding transfer functions H and transfer functions E are applied to the respective adders 17.

These reproduction signals are added together by the respective adders 17 and the resultant signals are supplied to the corresponding speaker 18. As a result, the respective reproduction speakers 18 output reproduction signals SHE (SHEA, SHEB, . . . , SHEE) to reproduce the sound field in the measurement environment 1. Thus, in the actual reproduction environment 20 in which the reproduction speakers 18 are placed on the second closed surface 14 at positions similar to the positions of the measurement microphones 13, the sound field in the measurement environment 1 can be reproduced in the region on the inner side of the second closed surface 14.

Figure 9:
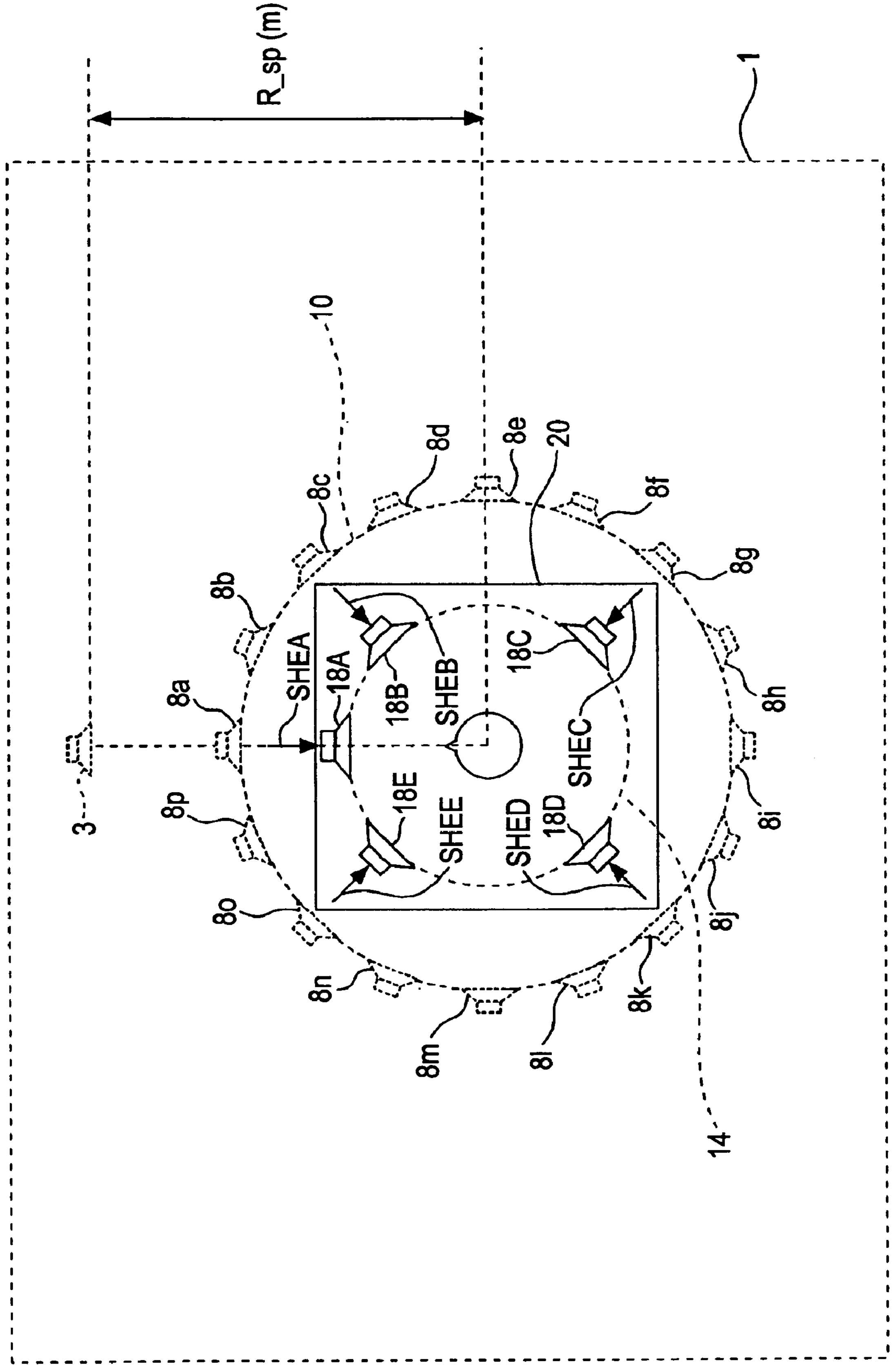
FIG. 9 is a schematic diagram illustrating a reverberation sound field and localization of a sound image in a reproduction environment in a state in which a listening position is selected inside a second closed surface.

FIG. 9 is a schematic diagram illustrating the actual reproduction environment 20 in which the sound field in the measurement environment 1 is on the second closed surface 14 and also illustrating the measurement environment 1 as the virtual sound field and the first closed surface 10.

In the reproduction environment 20, the reproduction speakers 18A to 18E are placed on the second closed surface 14 with the same radius as that of the second closed surface 14 shown in FIG. 7, at positions similar to the positions of the respective measurement microphones 13A to 13E shown in FIG. 7. That is, in the reproduction environment 20, the reproduction speakers 18 are placed at positions which are geometrically similar to the positions of the measurement microphones 13.

As shown in FIG. 9, these reproduction speakers 18A to 18E are placed on the second closed surface 14 such that they face inward, and the reproduction signal SHEA is output from the reproduction speaker 18A, the reproduction signal SHEB is output from the reproduction speaker 18B, the reproduction signal SHEC is output from the reproduction speaker 18C, the reproduction signal SHED is output from the reproduction speaker 18D, and the reproduction signal SHEE is output from the reproduction speaker 18E so that a listener in the region on the inner side of the second closed surface 14 can feel that a sound field is reproduced which is similar to the sound field reproduced by the reproduction speakers 8*a* to 8*p* placed on the first closed surface 10 represented by broken lines. That is, the listener can feel the virtual existence of the sound field in the measurement environment 1 represented by broken a line (the virtual existence of sound reverberation and sound images at positions of the measurement speakers 3). That is, a listener at a listening position in the region on the inner side of the second closed surface 14 can feel that the sound field with sound reverberation and clear localization of the sound image in the measurement environment 1 is reproduced. This makes it possible for a listener in a room of an ordinary house to listen to a sound of a content reproduced so as to have sound reverberation and good localization of a sound image that cause the listener to feel as if the listener were in a hall.

Although in the example described above, it is assumed that only one measurement speaker 3 is placed at a particular position in the measurement environment 1, a plurality of measurement speakers 3 may be placed at different positions. In this case, parts disposed before the respective adders 17 shown in FIG. 8 are modified so as to adapt to the additional positions. More specifically, for example, in a case in which there are two positions #1 and #2, parts for the position #2 are added to those shown in FIG. 8. That is, a sound reproduction unit 6 (6-2), calculation units 7*a* to 7*p* (7*a*-2 to 7*p*-2), calculation units 16A-a to 16A-p, 16B-a to 16B-p, . . . , 16E-a to 16E-p (16A-a-2 to 16A-p-2, 16B-a-2 to 16B-p-2, . . . , 16E-a-2 to 16E-p-2) are added, and reproduction signals output from the calculation units 16A-a to 16A-p, 16B-a-2 to 16B-p-2, . . . , 16E-a-2 to 16E-p-2 are applied to the adders 17A to 17E such that a reproduction signal with a subscript of an upper-case letter is applied to an adder with a subscript of the same upper-case letter.

Note that transfer functions H (a to b) set in the calculation units for processing the reproduction signals S according to the transfer functions H from the measurement environment 1 to the first closed surface 10 are different between the calculation units 7*a* to 7*p* and the calculation units 7*a*-2 to 7*p*-2.

More specifically, the transfer functions Ha-1 to Hp-1 corresponding to the paths from the position #1 to the respective measurement microphones 8 are set in the respective calculation units 7*a* to 7*p*, while the transfer functions Ha-2 to Hp-2 corresponding to the paths from the position #2 to the respective measurement microphones 8 are set in the respective calculation units 7*a*-2 to 7*p*-2.

Thus, the adders 17A to 17E output reproduction signals SHEA to SHEE obtained as a result of processes performed so as to represent the sound image positions (at positions #1 and #2) according to the transfer functions H from the measurement environment 1 to the first closed surface 10 and according to the transfer functions E from the first closed surface 10 to the second closed surface 14. As a result, the reproduction speakers 18A to 18E output the reproduction signals thereby reproducing the sound images at positions #1 and #2 whereby a listener in the region on the inner side of the second closed surface 14 can perceive the sound images at positions #1 and #2 similar to those in the measurement environment 1.

2. Reproduction of Sound Field According to Embodiments 2-1. Adjustment Using Measurement-Based Omnidirectional Transfer Functions In the sound field reproduction techniques described above, a reverberation effect is generated and clear localization of a sound image is achieved by using spatial information based on the actual impulse response measurement in the measurement environment 1 thereby making it possible to reproduce a realistic sound field.

In audio playback systems, in addition to such a need for reproduction of a realistic sound, there is a need for the capability of adjusting sound quality (tone) of a reproduced sound in accordance with user's preference. In some conventional audio playback systems, it is allowed to enhance a low frequency sound or adjust the tone depending on the genre (such as rock or jazz) of reproduced music. This allows a user to enjoy music played back with selected sound quality.

By analogy, in the sound field reproducing system according to an embodiment of the present invention, it is desirable to allow a user to adjust reverberation and/or localization of a sound image.

Accordingly, as an embodiment of the present invention, there is provided a technique to adjust the sound quality of a reproduced sound in the sound field reproducing system as described below.

First, sound quality adjustment using measurement-based directional transfer functions is explained with reference to FIGS. 10 to 12.

In the following discussion, it is assumed that there is one position (position #1) for a viral sound image position, and reproduction of a sound field in the measurement environment 1 is performed in the reproduction environment 11 in which the reproduction speakers 8*a* to 8*p* are placed on the first closed surface 10 as described above with reference to FIG. 3.

First, using the technique described above with reference to FIG. 1, transfer functions Ha to Hp corresponding to paths from the measurement speaker 3 to the respective measurement microphones 4*a* to 4*p* based on the measurement result of the output sound (the measurement signal TSP) output from the measurement speaker 3 using the measurement microphones 4*a* to 4*p* placed on the first closed surface 10 in the measurement environment 1. Note that the measurement microphones 4*a* to 4*p* used herein are unidirectional (directional) microphones. Therefore, in the following discussion, the transfer functions Ha to Hp determined herein in such a manner will also be referred to as measurement-based directional transfer functions.

Figure 10:
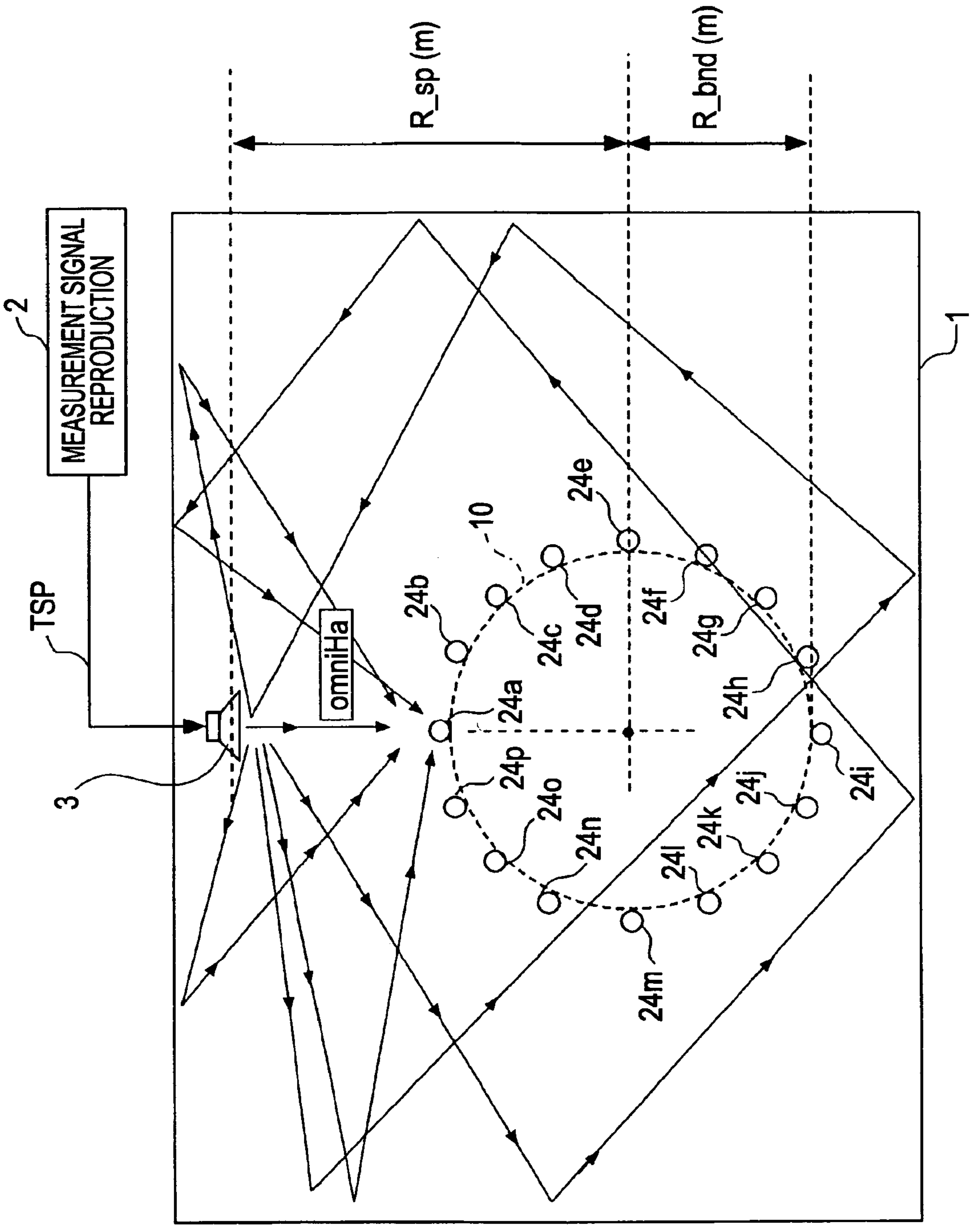
FIG. 10 is a schematic diagram showing a manner in which measurement is performed in a measurement environment to determine measurement-based omnidirectional transfer functions for use in sound quality adjustment in reproduction of sound field, according to an embodiment of the present invention.

After the measurement-based directional transfer functions Ha to Hp have been determined using the technique described above with reference to FIG. 1, measurement-based omnidirectional transfer functions are generated based on the measurement result using omnidirectional microphones as shown in FIG. 10.

In the measurement environment 1 shown in FIG. 10, omnidirectional microphones are used as the measurement microphones for detecting the sound output from the measurement speaker 3. In this measurement, as many omnidirectional microphones are used as the number of measurement microphones 4*a* to 4*p* used to determine the measurement-based directional transfer functions Ha to Hp, and omnidirectional microphones are placed at positions similar to the positions of the measurement microphones 4*a* to 4*p*. In FIG. 10, these omnidirectional measurement microphones are denoted by 24*a* to 24*p*.

According to a measurement signal TSP supplied from a measurement signal reproduction unit 2 a sound is output from the measurement speaker 3 placed at the virtual sound image location, The output sound is detected by the omnidirectional measurement microphones 24*a* to 24*p*, and transfer functions Ha to Hp are determined based on the measured impulse responses from the measurement speaker 3 to the respective omnidirectional measurement microphones 24*a* to 24*p*.

Hereinafter, the transfer functions H obtained as a result of the measurement using the omnidirectional measurement microphones 24 will be referred to as measurement-based omnidirectional transfer functions omniH (or simply as transfer functions omniH). More specifically, transfer functions Ha to Hp determined based on the result of measurement using the respective omnidirectional measurement microphones 24*a* to 24*p* are referred to as measurement-based omnidirectional transfer functions omniHa to omniHp.

Use of the omnidirectional measurement microphones 24*a* to 24*p* in the measurement of the impulse responses makes it possible to detect a greater number of reveberation components in the measurement environment 1 than can using the unidirectional microphones. Thus, use of the transfer functions omniH determined based on the measurement using the omnidirectional measurement microphones 24 allow a greater amount of reverberation to be reproduced.

In the present embodiment, by adding the measurement-based omnidirectional transfer functions omniH, as required, to the measurement-based directional transfer functions H used in the sound field reproduction in the normal mode, it is possible to adjust the sound quality so as to increase the amount of reverberation in the reproduce sound.

Figure 11:
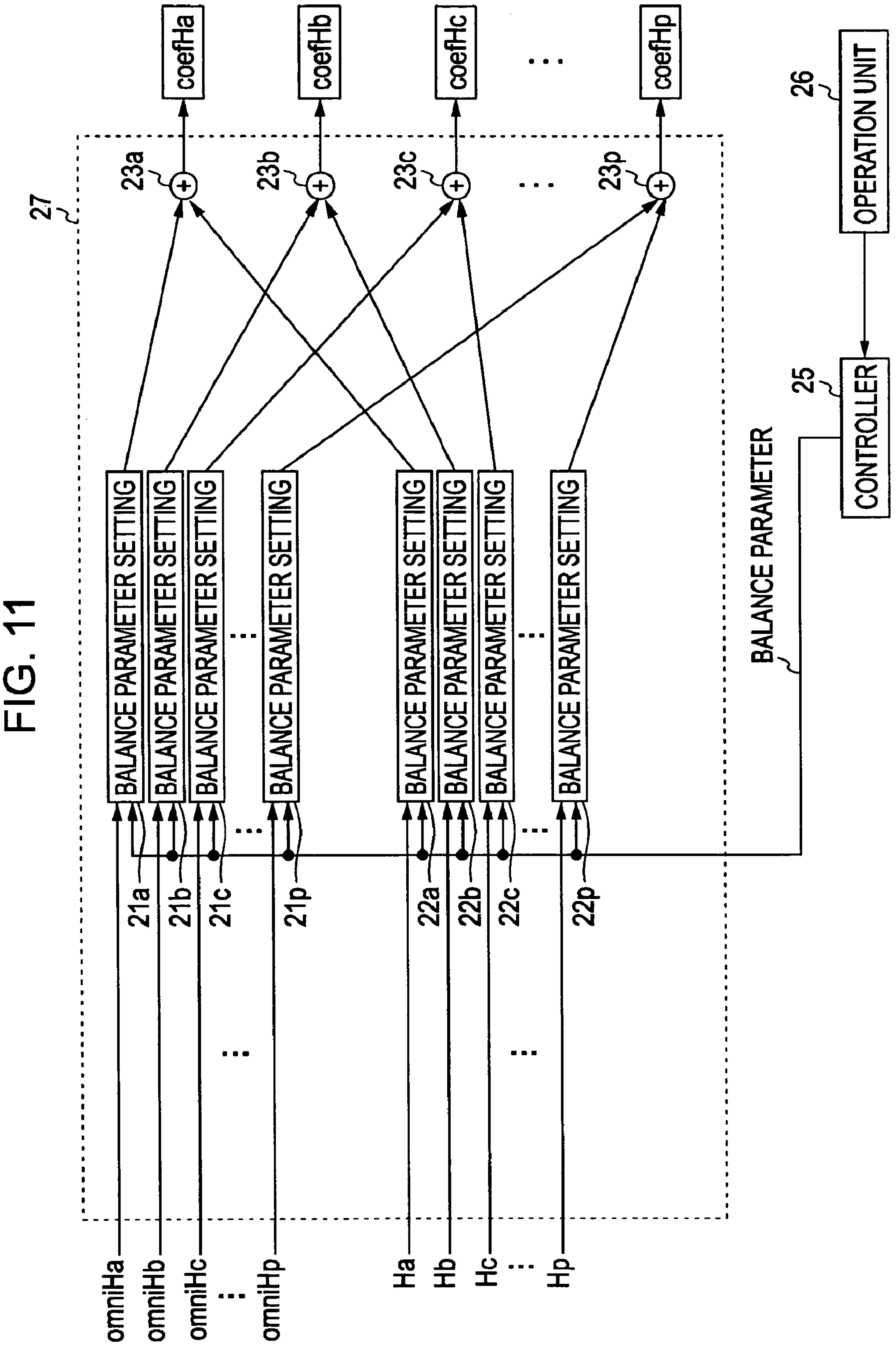
FIG. 11 is a block diagram showing a configuration of a sound quality adjustment system for adjusting sound quality using measurement-based omnidirectional transfer functions, in reproduction of a sound field, according to an embodiment of the present invention.

FIG. 11 illustrates a configuration of a sound quality adjustment system for adjusting the sound quality based on the measurement-based omnidirectional transfer functions.

As shown in FIG. 11, the sound quality adjustment system includes balance parameter setting units 21*a* to 21*p* and balance parameter setting units 22*a* to 22*p* for setting ratios at which to add the measurement-based omnidirectional transfer functions omniHa to omniHp to the measurement-based directional transfer functions Ha to Hp.

The measurement-based omnidirectional transfer functions omniHa to omniHp are applied to the balance parameter setting units 21*a* to 21*p* such that a measurement-based omnidirectional transfer function omniH with a subscript of a lower-case latter is applied to a balance parameter setting unit 21 with the same subscript.

Similarly, the measurement-based directional transfer functions Ha to Hp are applied to the balance parameter setting units 22*a* to 22*p* such that a measurement-based directional transfer function H with a subscript of a lower-case latter is applied to a balance parameter setting unit 22 with the same subscript.

The adjustment of the balance parameters of the balance parameter setting units 21 and 22 is performed by a controller 25 shown in FIG. 11 in accordance with a command issued via an operation unit 26.

In FIG. 11, for simplicity, the controller 25 are connected to the balance parameter setting units 21 and balance parameter setting units 22 via only one control line. However, actually, the controller 25 is connected to the balance parameter setting units 21*a* to 21*p* and the balance parameter setting units 22*a* to 22*p* such that the controller 25 can individually supply a balance parameter value to each balance parameter setting unit.

A user is allowed to operate the operation unit 26 to input a command to specify a balance parameter value to be set in each balance parameter setting unit. In accordance with the input command, the controller 25 supplies balance parameter values to the respective balance parameter setting units 21 and the balance parameter setting unit 22.

The sound quality adjustment system also includes as many adders 23*a* to 23*p* as there are measurement microphones 4 (measurement microphones 24) placed on the first closed surface 10 in the measurement. The signals output from the balance parameter setting units 21 and 22 are applied to the adders 23*a* to 23*p* such that signals output balance parameter setting units with a subscript of a lower-case letter are applied to an adder with the same subscript, and the applied signals are added together.

As a result, for example, the adder 23*a* adds the measurement-based omnidirectional transfer function omniHa with the balance parameter given by the balance parameter setting unit 21*a* and the measurement-based directional transfer function Ha with the balance parameter given by the balance parameter setting unit 22*a*, and outputs a composite transfer function coefHa. The adder 23*b* adds the measurement-based omnidirectional transfer function omniHb with the balance parameter given by the balance parameter setting unit 21*b* and the measurement-based directional transfer function Hb with the balance parameter given by the balance parameter setting unit 22*b*, and outputs a composite transfer function coefHb.

The other adders 23*c* to 23*p* respectively output composite transfer functions coefHc to coefHp obtained in a similar manner.

A user is allowed to adjust the ratio at which to add the measurement-based directional transfer functions H and the measurement-based omnidirectional transfer functions omniH. For example, if the ratio is set to be small for the measurement-based directional transfer functions H and great for the measurement-based omnidirectional transfer functions omniH, then composite transfer functions coefH are obtained which result in an increase in the amount of reverberation. If the ratio is set oppositely, then composite transfer functions coefH are obtained which result in a decrease in the amount of reverberation.

Figure 12:
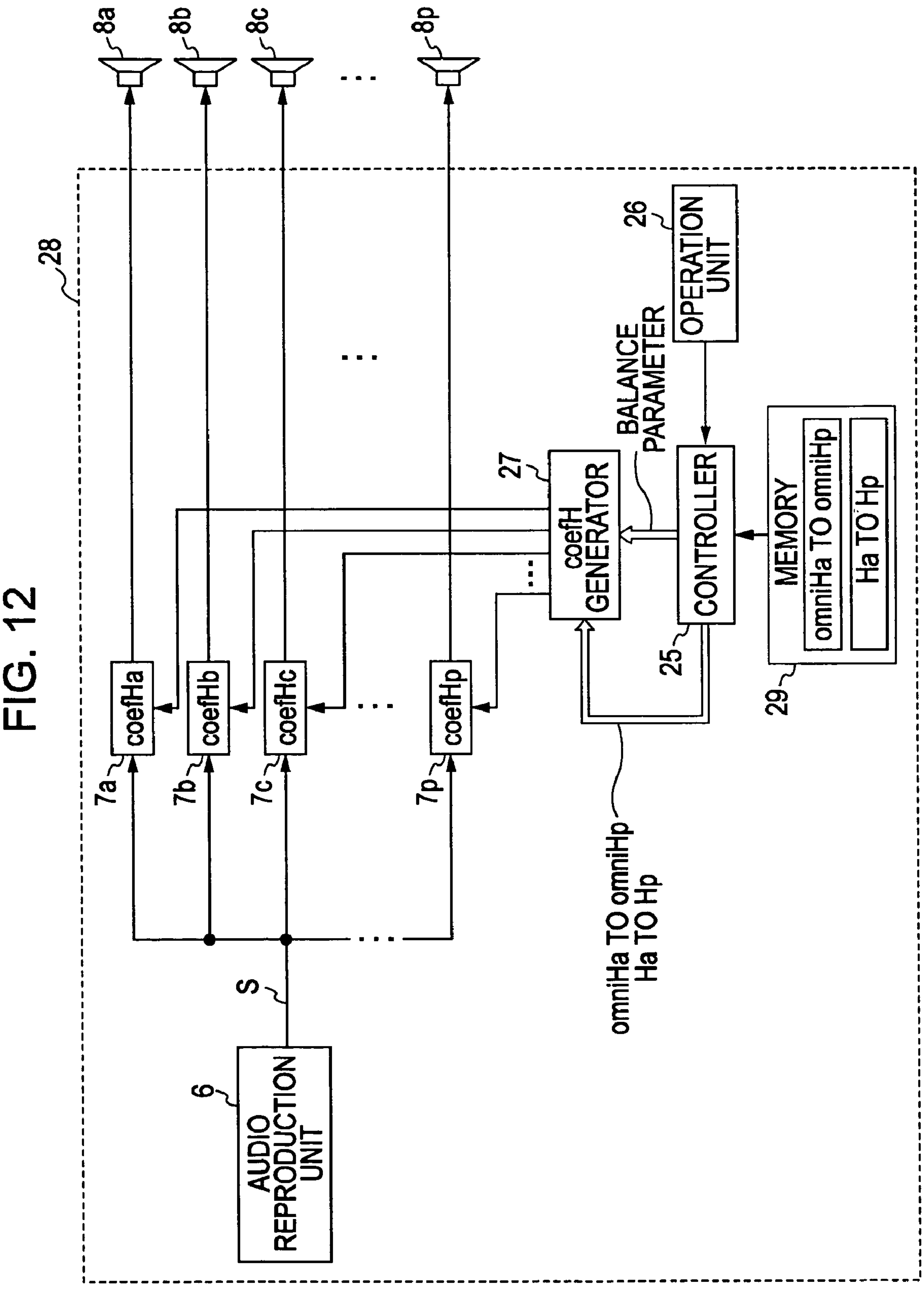
FIG. 12 is a block diagram showing a configuration of a reproduction signal generator used in adjustment of sound quality using measurement-based omnidirectional transfer functions, in reproduction of a sound field, according to an embodiment of the present invention.

FIG. 12 illustrates a configuration of a reproduction signal generator 28 which includes an adjustment system similar to that described above and which is adapted to adjust the sound quality based on the measurement-based omnidirectional transfer functions. Herein, it is also assumed that the reproduction speakers 8*a* to 8*p* are placed on the first closed surface 10 in the reproduction environment 11.

The reproduction signal generator 28 has a coefH generator 27 including balance parameter setting units 21*a* to 21*p*, balance parameter setting units 22*a* to 22*p*, and adders 23*a* to 23*p*, which are connected as shown in FIG. 11. The reproduction signal generator 28 also has a controller 25 and an operation unit 26 similar to those shown in FIG. 11.

A memory 29 generically denotes storage devices such as ROM, RAM, a hard disk, etc. included in the controller 25. The measurement-based directional transfer functions Ha to Hp and the measurement-based omnidirectional transfer functions omniHa to omniHp obtained via the measurement according to the technique described above with reference to FIG. 1 or 10, are stored in advance in the memory 29.

The controller 25 supplies the measurement-based omnidirectional transfer functions omniHa to omniHp stored in the memory 29 to the balance parameter setting units 21 in the coefH generator 27 such that a measurement-based omnidirectional transfer function with a subscript of a lower-case letter is applied to a balance parameter setting unit with the same subscript. Similarly, the controller 25 supplies the measurement-based directional transfer functions Ha to Hp to the balance parameter setting units 22 such that a measurement-based omnidirectional transfer function with a subscript of a lower-case letter is applied to a balance parameter setting unit with the same subscript.

In response to a command issued via the operation unit 26, the controller 25 supplies balance parameters to be set in the respective balance parameter setting units 21 and the respective balance parameter setting unit 22 in the coefH generator 27.

The operation unit 26 has control knobs (control sliders) for setting parameters associated with the respective balance parameter setting units 21*a* to 21*p* and the respective balance parameter setting units 22*a* to 22*p*. A user is allowed to operate these control knobs to specify balance parameter values to be set in the balance parameter setting units 21*a* to 21*p* and the balance parameter setting units 22*a* to 22*p*.

The adjustment of balance parameters may be made using an operation panel displayed on a screen of a display (not shown). In this case, a pointing device such as a mouse is used as the operation unit 26 so that a user is allowed to operate the mouse to move a cursor on the screen to drag a control knob icon for adjusting the parameter displayed on the operation panel so as to specify the balance parameter values to be set in the respective balance parameter setting units 21*a* to 21*p* and 22*a* to 22*p*.

The composite transfer functions coefHa to coefHp generated by the coefH generator 27 are supplied to the corresponding calculation units 7*a* to 7*p* to which the audio signal S is input from the sound reproduction unit 6, and the composite transfer functions coefHa to coefHp are set therein. More specifically, a composite transfer function coefH with a subscript of a lower-case letter supplied from the coefH generator 27 is applied to a calculation unit 7 with the same subscript such that, for example, the composite transfer function coefHa is supplied to the calculation unit 7*a*, the composite transfer function coefHb is supplied to the calculation unit 7*b*, and the composite transfer function coefHp is supplied to the calculation unit 7*p*, and they are set in these calculation units.

The calculation units 7*a* to 7*p* perform calculation processes on the audio signal S according to the transfer function set in the respective calculation units 7*a* to 7*p* and supply reproduction signals obtained as a result of the calculation processes to the respective reproduction speakers 8 with the same subscript as those of the calculation units 7*a* to 7*p*.

Thus, as described above, reproduction signals are produced according to the composite transfer functions coefH obtained by adding the measurement-based directional transfer functions H and the measurement-based omnidirectional transfer functions omniH at ratios specified by a user. In other words, the user is allowed to adjust the amount of reverberation of the reproduced sound in the sound field reproduced by the reproduction signals output from the reproduction speakers 8.

It should be noted herein that because the adjustment of the sound quality (in terms of the reverberation) is made based on the impulse responses actually measured in the measurement environment 1, the adjustment can be made so as to increase (or decrease) the amount of reverberation relative to the original amount of reverberation in the measurement environment 1. The technique according to the present embodiment of the invention is different in this point from the conventional adjustment technique in which reverberation is artificially created by means of digital echo or digital reverb.

2-2. Adjustment Using Information Associated with Sound Delay Time and Sound Level The technique described above makes it possible to adjust the amount of reverberation by using transfer functions obtained by properly adding measurement-based omnidirectional transfer functions omniH to the measurement-based directional transfer functions H. However, when the adjustment is made to increase the amount of reverberation by increasing the components of the measurement-based omnidirectional transfer functions omniH, there is a possibility that the perceived location of a virtual sound image becomes unclear.

In view of the above, in the present embodiment, when the composite transfer functions are produced by adding measurement-based omnidirectional transfer functions omniH to the measurement-based directional transfer functions H, it is also allowed to adjust the direct sound components including no reverberation components thereby making it possible to make the adjustment so as to enhance the localization of the sound image (so as to enhance the sharpness of the sound image).

Because the perceived location of the virtual sound image is determined by the sound components (direct sound components) directly input to the respective measurement microphones on the first closed surface 10 from the position of the measurement speaker 3 in the measurement environment 1, it is possible to increase the sharpness of the sound image by increasing the direct sound components when the convolution of the reproduced sound and the transfer function components is generated.

The transfer functions from the measurement speaker 3 to the respective measurement microphones for the direction sound can be represented using delay times of the direct sound, that is, the times taken for the sound output from the measurement speaker 3 to directly reach the respective measurement microphones, and the sound levels thereof (waveform energy). In the present embodiment, in order to obtain the transfer functions from the measurement speaker 3 to the respective measurement microphones for the direction sound, information indicating the delay times of the sound directly arriving at the respective measurement microphones and the levels thereof is extracted from the measurement-based directional transfer functions Ha to Hp.

The extraction method is explained below with reference to FIGS. 13 and 14.

FIG. 13A shows waveform components of impulse responses represented by the measurement-based directional transfer functions H. From the components of the respective measurement-based directional transfer functions H, information indicating sound delay times and sound levels is extracted as shown in FIG. 13B.

The information indicating the sound delay times and the sound levels extracted from the respective measurement-based directional transfer functions Ha to Hp is referred to as delay-based transfer functions dryHa to dryHp.

The information indicating the sound delay times and the sound levels can be extracted as shown in FIGS. 14A and 14B.

FIG. 14A shows waveform components of an impulse response represented by a measurement-based directional transfer function H, and FIG. 14B shows waveform components of a delay-based transfer function dryH extracted from the impulse response shown in FIG. 14A.

First, in FIG. 14A, a rising point T1 of the waveform of the impulse response represented by the measurement-based directional transfer function H is detected. Furthermore, a point a predetermined predelay time before the detected rising point T1 of the waveform is detected. The detect point is employed as the rising point of the waveform of the delay-based transfer function dryH shown in FIG. 14B.

Thereafter, in FIG. 14A, an energy calculation window EW (in the form of a rectangle denoted by a broken line in FIG. 14A) is defined such that the left-hand side of the window is put on the detected rising point T1 of the waveform. The energy within this window is then calculated. Thereafter, in FIG. 14B, the amplitude of the waveform at the rising position of the delay-based transfer function dryH is defined by a value obtained by multiplying the calculated energy value by a predetermined coefficient (that is, as shown in FIG. 14B, the amplitude is proportional to the energy value determined in FIG. 14A).

Thus, the respective delay-based transfer functions dryHa to dryHp can be determined by extracting the sound delay times and the sound levels for the direct sound from the respective measurement-based directional transfer functions Ha to Hp.

The technique to obtain the information associated with the sound delay times and the sound levels from the impulse responses is also disclosed in an earlier application 2005-67413 filed by the present applicant. For further detailed explanation, see this application.

In the technique described above, the rising point of the waveform of each delay-based transfer function dryH is given by the point obtained by shifting the rising point of an impulse response by the predetermined predelay time. Alternatively, the rising point T1 of the impulse response represented by the measurement-based directional transfer function H may be directly employed as the rising point of the waveform of the delay-based transfer function dryH without making a shift by the predelay time.

However, it is more desirable to make such a shift to allow the sound quality adjustment to be made over a wider range. The length of the predelay time may be variably set within the range, for example, from 0 msec to 20 msec.

Figure 15:
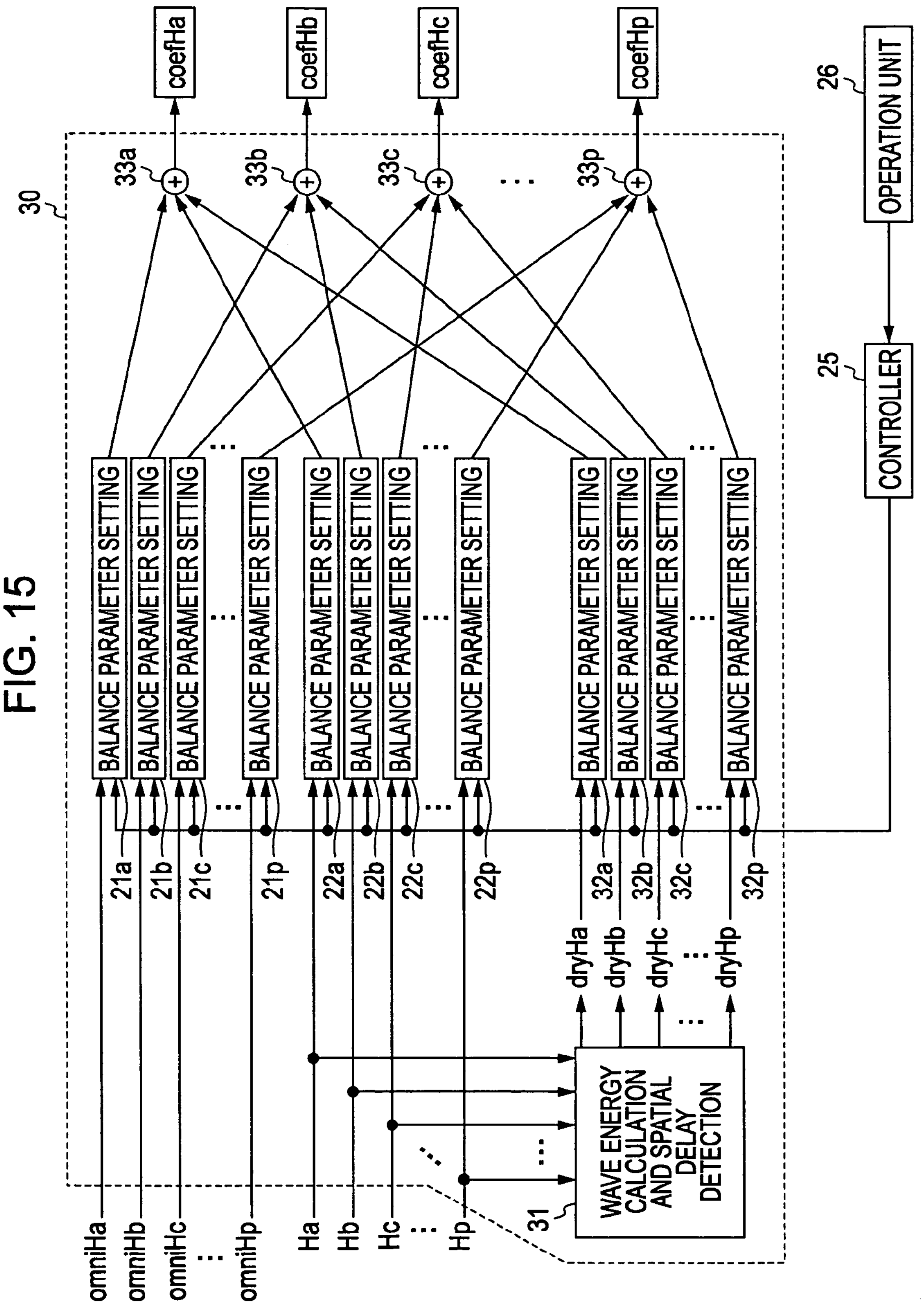
FIG. 15 a block diagram showing a configuration of a sound quality adjustment system for adjusting sound quality using information associated with sound delay times and sound levels, in reproduction of a sound field, according to an embodiment of the present invention.

FIG. 15 shows a configuration of an adjustment system adapted to make a sound quality adjustment using the delay-based transfer functions dryH.

As shown in FIG. 15, the adjustment system includes balance parameter setting units 21$a$ to 21$p$ for setting respective balance parameters to be applied to measurement-based omnidirectional transfer functions omniHa to omniHp input to the balance parameter setting units 21$a$ to 21$p$. The adjustment system also includes balance parameter setting units 22$a$ to 22$p$ for setting respective balance parameters to be applied to measurement-based directional transfer functions Ha to Hp input to the balance parameter setting units 22*a* to 22*p*.

Note that the measurement-based directional transfer functions Ha to Hp into to the balance parameter setting units 22*a* to 22*p* are also input to a waveform energy calculation/spatial delay detection unit 31 as shown in FIG. 15.

The waveform energy calculation/spatial delay detection unit 31 extracts information indicating sound delay times and sound levels from the respective measurement-based directional transfer functions Ha to Hp using the technique described above with reference to FIG. 14, and generates delay-based transfer functions dryHa to dryHp.

The adjustment system includes balance parameter setting units 32*a* to 32*p* for setting respective balance parameters to be applied to the delay-based transfer functions dryHa to dryHp input to the balance parameter setting units 32*a* to 32*p*. Note that delay-based transfer functions dryHa to dryHp are input to the balance parameter setting units 32*a* to 32*p* such that a delay-based transfer function dryH with a subscript of a lower-case letter is input to a balance parameter setting unit 32 with the same subscript. The respective balance parameter setting units 32 apply coefficients, given by the balance parameters supplied from the controller 25, to the respective input delay-based transfer functions dryH.

The controller 25 is adapted to individually supply balance parameter values to be set in the respective balance parameter setting units 32*a* to 32*p* in accordance with a command input via the operation unit 26.

That is, the operation unit 26 and the controller 25 are configured so as to allow a user to specify the respective values of respective balance parameters to be set in the balance parameter setting units 32*a* to 32*p*. To this end, the operation unit 26 described above with reference to FIG. 12 is configured to additionally have control knobs for specifying the balance parameter values to be set in the respective balance parameter setting units 32. Alternatively, in the case in which the operation panel is provided on the display screen, control knob icons for inadvisably adjusting the balance parameters to be set in the balance parameter setting units 32 may be provided on the operation panel.

In FIG. 15, for simplicity, the controller 25 is connected to the respective balance parameter setting units 21, 22, and 32 via only one control line. However, actually, the controller 25 is connected to the respective balance parameter setting units 21, 22, and 32 such that the controller 25 can individually supply a balance parameter value to each balance parameter setting unit.

The measurement-based omnidirectional transfer functions omniHa to omniHp output from the balance parameter setting units 21*a* to 21*p*, the measurement-based directional transfer functions Ha to Hp output from the balance parameter setting units 22*a* to 22*p*, and the delay-based transfer functions dryHa to dryHp output from the balance parameter setting units 32*a* to 32*p* are input to the adders 33*a* to 33*p* and added together. Note that a measurement-based omnidirectional transfer function omniH, a measurement-based directional transfer function H, and a delay-based transfer function dryH, which have a subscript of a lower-case letter, are input to an adder with the same subscript as the script of the above transfer functions.

As a result, for example, the adder 33*a* outputs a composite transfer function coefHa obtained by adding the measurement-based omnidirectional transfer function omniHa with the balance parameter given by the balance parameter setting unit 21*a*, the measurement-based directional transfer function Ha with the balance parameter given by the balance parameter setting unit 22*a*, and the delay-based transfer function dryHa with the balance parameter given by the balance parameter setting unit 33*a*. Similarly, the adder 33*b* outputs a composite transfer function coefHb obtained by adding the measurement-based omnidirectional transfer function omniHb with the balance parameter given by the balance parameter setting unit 21*b*, the measurement-based directional transfer function Hb with the balance parameter given by the balance parameter setting unit 22*b*, and the delay-based transfer function dryHb with the balance parameter given by the balance parameter setting unit 33*b*.

The other adders 33*c* to 33*p* respectively output composite transfer functions coefHc to coefHp obtained in a similar manner.

In the present embodiment, as described above, the delay-based transfer functions dryHa to dryHp are allowed to be additionally added to generate the composite transfer functions coefHa to coefHp. Furthermore, it is allowed to specify the ratios at which to add the delay-based transfer functions dryHa to dryHp.

Thus, it is allowed to adjust the amount of reverberation by adjusting the ratios of the measurement-based omnidirectional transfer functions omniH, and adjust the localization of the sound image by adjusting the ratios of the delay-based transfer functions dryH.

Note that the above-described sound quality adjustment system using the delay-based transfer functions dryH, that is, in FIG. 5, the part adapted to generate the composite transfer functions coefH and including the waveform energy calculation/spatial delay detection unit 31, the balance parameter setting units 21*a* to 21*p*, the balance parameter setting units 22*a* to 22*p*, the balance parameter setting unit 32*a* to 32*p*, and the adders 33*a* to 33*p* is referred to as a coefH generator 30.

Although not shown in the figures, a reproduction signal generator having a capability of making a sound quality adjustment using the delay-based transfer functions dryH can be realized by replacing the coefH generator 27 of the configuration shown in FIG. 12 with the coefH generator 30 shown in FIG. 15. In this case, the controller 25 and the operation unit 26 are configured so as to allow it to individually set the balance parameters associated with the balance parameter setting units 32 in the coefH generator 30.

Note that because the delay-based transfer functions dryH are generated based on the measurement-based directional transfer functions H as described above with reference to FIG. 15, it is sufficient if the coefH generator 30 can receive only the measurement-based directional transfer functions Ha to Hp and the measurement-based omnidirectional transfer functions omniHa to omniHp stored in the memory 29 under the control of the controller 25 of the reproduction signal generator.

That is, because the delay-based transfer functions dryH are automatically generated based on the measurement-based directional transfer functions H, it is sufficient if the measurement in the measurement environment 1 is performed only for the measurement-based directional transfer functions H and the measurement-based omnidirectional transfer functions omniH.

Figure 16:
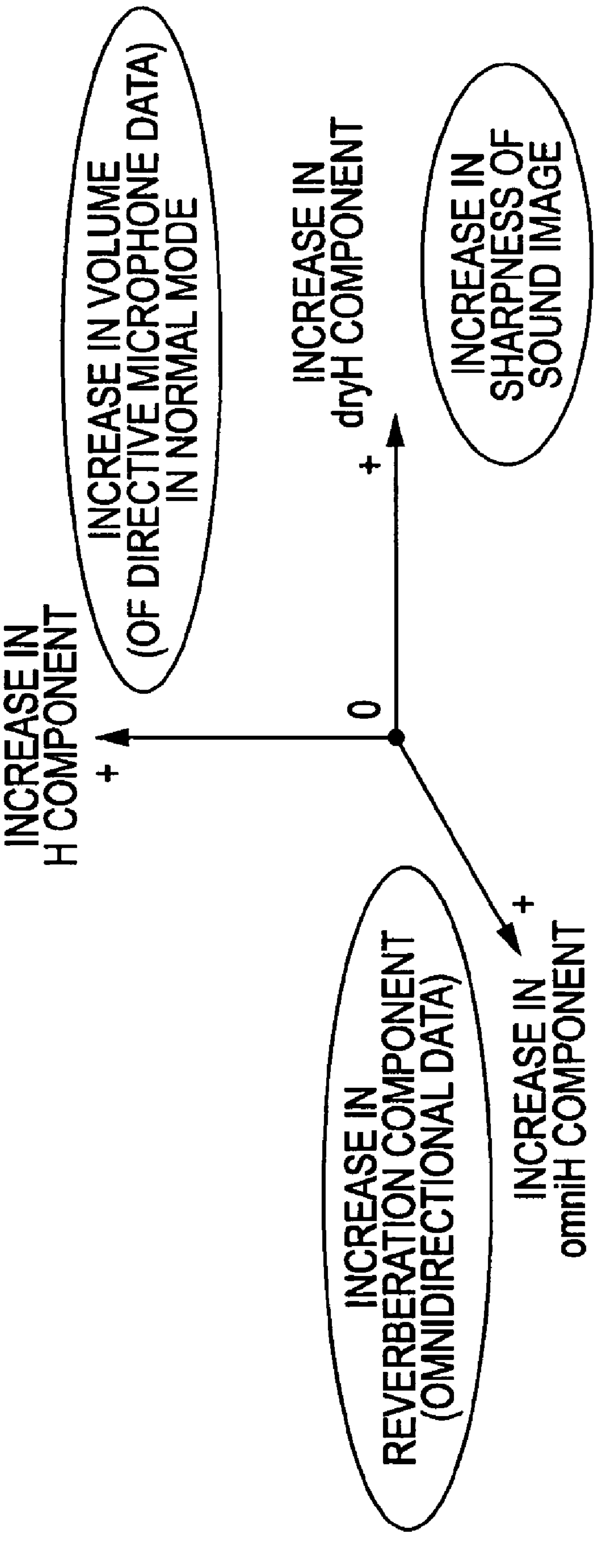
FIG. 16 shows a concept of sound quality adjustment.

FIG. 16 shows a summary of the sound quality adjustment. As shown in FIG. 16, by increasing the components of the measurement-based directional transfer functions H, it is possible to increase the sound volume in the normal mode (using the normal transfer functions determined via the measurement using the unidirectional measurement microphones 4). By increasing the components of the measurement-based omnidirectional transfer functions omniH, it is possible to increase the amount of reverberation as described above. By increasing the components of the delay-based transfer functions dryH, it is possible to enhance the localization of a sound image thereby enhancing the sharpness of the sound image.

Figure 17A:
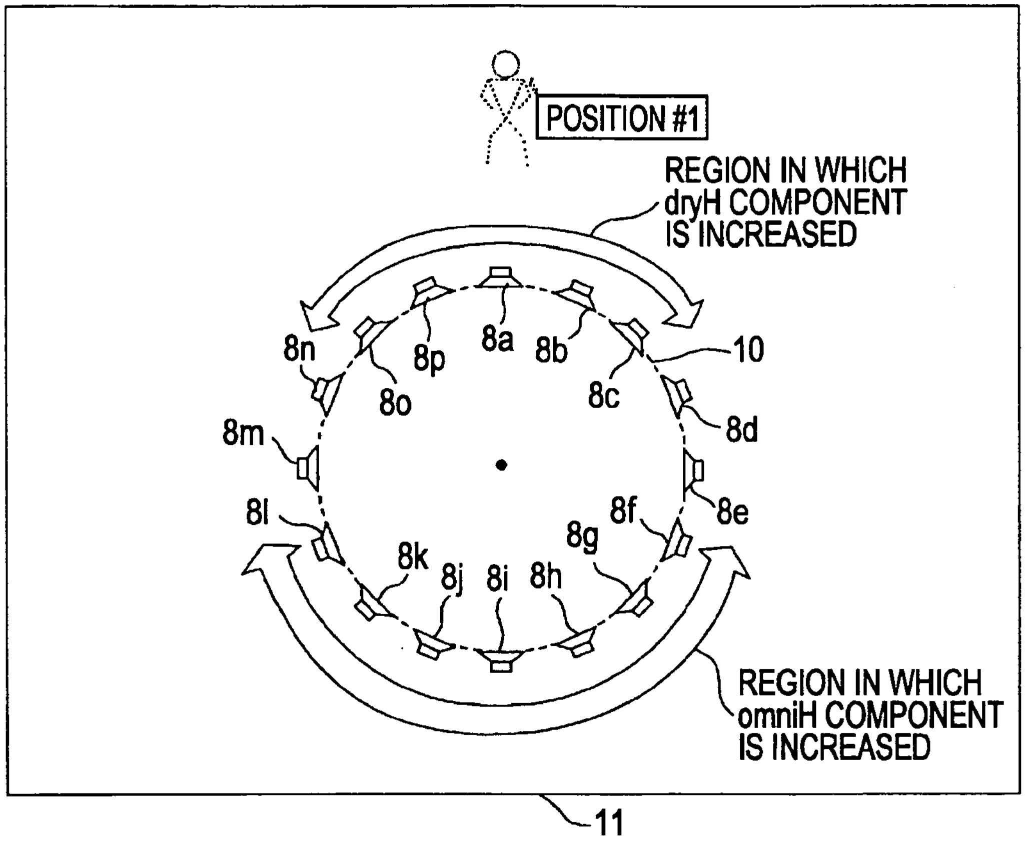
FIGS. 17A and 17B show an example of a manner in which sound quality is adjusted.
Figure 17B:
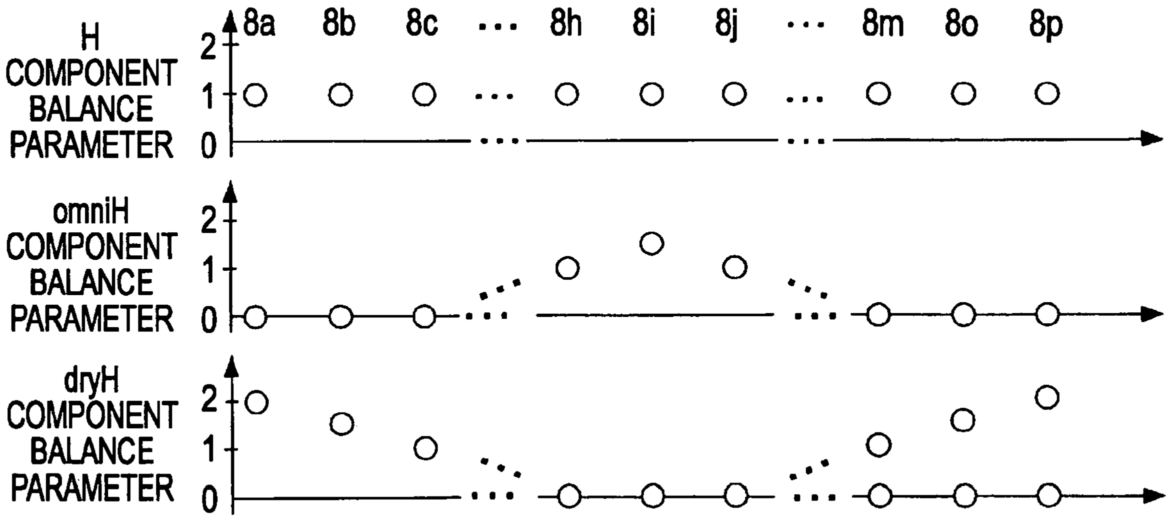

FIGS. 17A and 17B show an example of the setting in terms of the balance parameters.

As shown in FIG. 17A, when a virtual sound image to be reproduced in the reproduction environment 11 exists only on one side, it is desirable that the delay-based transfer functions dryH in a region (front region) close to the position (position #1 in FIG. 17A) of the virtual sound mage are increased so as to enhance the localization of the sound image, while the measurement-based omnidirectional transfer functions omniH in an opposite region (rear region) apart from the virtual sound image are increased so as to increase the amount of reverberation to achieve reverberation similar to that in a hall or the like.

FIG. 17B shows examples of balance parameter values selected to achieve the above-described situation. More specifically, the components of the measurement-based directional transfer functions H are all set so as to be flat over the all region. In the example shown in FIG. 17B, the balance parameter is set to "1" for all reproduction speakers 8*a* to 8*p* (that is, for all balance parameter setting units 22*a* to 22*p* shown in FIG. 15).

On the other hand, the components of the measurement-based omnidirectional transfer functions omniH for the reproduction speakers 8 (8*f* to 8*l*) in the rear region, that is, for the balance parameter setting units 21*f* to 21*l* are set such that a highest balance parameter value ("2" in the example shown in FIG. 17B) is set for the reproduction speaker 8*i* at the farthest position (that is, for the balance parameter setting unit 21*i*), and the balance parameter value is gradually decreased from this value as the position goes away from the position of the reproduction speaker 8*i* to the position of the reproduction speaker 8*f* at one of the region or to the position of the reproduction speaker 81 at the opposite end of the region. For the other positions (the balance parameter setting units 21*m* to 21*e*) outside the rear region, the balance parameter is set, for example, to "0".

The components of the delay-based transfer functions dryH for the reproduction speakers 8 (8*o* to 8*c*) in the from region are set such that a highest balance parameter value (for example "2") is set for the reproduction speaker 8*a* at the frontmost position, and the balance parameter value is gradually decreased from this value as the position goes away from the position of the reproduction speaker 8*a* to the position of the reproduction speaker 8*o* at one end of the front region or to the position of the reproduction speaker 8*c* at the opposite end of the front region. That is, the balance parameter for the balance parameter setting unit 32*a* is set to "2", and the balance parameter value is gradually decreased from "2" for the balance parameter setting unit 32*a* to a lowest value for the balance parameter setting unit 320 or the balance parameter setting unit 32*c*. For the other positions in the region outside the front region (for the reproduction speakers 8*d* to 8*n*, that is, for the balance parameter setting units 32*d* to 32*n*), the balance parameter is set to "0".

Thus, because the balance parameter values can be supplied independently to the balance parameter setting units 21*a* to 21*p*, the balance parameter setting units 22*a* to 22*p*, and the balance parameter setting units 32*a* to 32*p* as described above with reference to FIG. 15, the balance parameter values can be adjusted independently for the respective measurement-based directional transfer functions H, the measurement-based omnidirectional transfer functions omniH, the delay-based transfer functions dryH, and independently for the respective positions of the reproduction speakers 8*a* to 8*p*.

Instead of individually adjusting the balance parameter values for the respective positions of the reproduction speakers 8, the balance parameter value may be simply adjusted for the measurement-based directional transfer functions H as a whole, the measurement-based omnidirectional transfer functions omniH as a whole, and the delay-based transfer functions dryH as a whole. That is, the controller 25 supplies a particular balance parameter value to all balance parameter setting units 21*a* to 21*p*, a particular balance parameter value to all balance parameter setting units 22*a* to 22*p*, and a particular balance parameter value to all balance parameter setting units 32*a* to 32*p*.

In the above explanation, it is assumed that there is only one position (position #1) for the position of the virtual sound image. When there are a plurality of positions, the measurement-based directional transfer functions Ha to Hp and the measurement-based omnidirectional transfer functions omniHa to omniHp are measured for each of the plurality of positions using the technique described above with reference to FIG. 4. The reproduction signal generator generates composite transfer functions coefHa to coefHp for each position based on the measurement-based directional transfer functions H (Ha to Hp), and the measurement-based omnidirectional transfer functions omniHa to omniHp measured for each position.

A specific example of a configuration of such a reproduction signal generator adapted to a plurality of positions will be described later.

When there are a plurality of position, the technique according to the present invention described above may be applied to the second closed surface 14. A specific example of a configuration of such a reproduction signal generator adapted to the second closed surface 14 will also be described later.

In the sound quality adjustment according to the embodiment described above, the measurement-based omnidirectional transfer functions and the delay-based transfer functions dryH are added to the measurement-based directional transfer functions H which are used to reproduce the sound field in the normal mode. Alternatively, in the sound quality adjustment, other transfer functions may be added to the measurement-based directional transfer functions H.

For example, if transfer functions determined based on the measurement using bidirectional microphones (a to p) placed on the first closed surface 10 in the measurement environment 1 are added to the measurement-based directional transfer functions H, the amount of reverberation and the localization of a sound image of a reproduced sound in a reproduced sound field can be adjusted.

That is, the sound quality of the reproduced sound in the reproduced sound field can be adjusted by adding transfer functions, which are different from the measurement-based directional transfer functions H but which have been determined for the same positions of the measurement microphones on the first closed surfaces 10 as the positions used to determine the measurement-based directional transfer functions H, to the measurement-based directional transfer functions H. That is, in the sound quality adjustment, the transfer functions (auxiliary transfer functions) which are added to the principal transfer functions H are not limited to the measurement-based omnidirectional transfer functions omniH and the delay-based transfer functions dryH.

Note that because the delay-based transfer functions dryHa to dryHp are determined from the respective measurement-based directional transfer functions Ha to Hp, the delay-based transfer functions dryHa to dryHp are also transfer functions determined for the respective positions of the measurement microphones on the first closed surface 10.

3. Additional Configurations 3-1. Reproduction of Direction of Directivity of Sound Source In the above-described technique to reproduce a sound field, an omnidirectional speaker is used as the measurement speaker 3 for outputting the measurement signal in the measurement environment 1. A sound is omnidirectionally emitted over the entire space from a single point, and measurement is performed to determine parameters associated with acoustic characteristics of the measurement environment, which depend on the size of the measurement space, the materials of the walls, the floor, the ceiling, and the like of the measurement environment, the geometrical structure of the measurement environment, etc.

However, in practice, the sound source to be reproduced as the virtual sound image at the position of the measurement speaker 3 can be directional. In this case, if the reproduction of the sound field is performed based on the result of measurement of impulse response using an omnidirectional speaker as the measurement speaker 3, it is impossible to reproduce the directivity of the sound source.

In view of the above, in an alternative embodiment described below, a directional speaker is used as the measurement speaker to output the measurement signal in the measurement environment 1, and the sound field is reproduced based on the result of the measurement of the impulse responses in particular directions.

Figure 18:
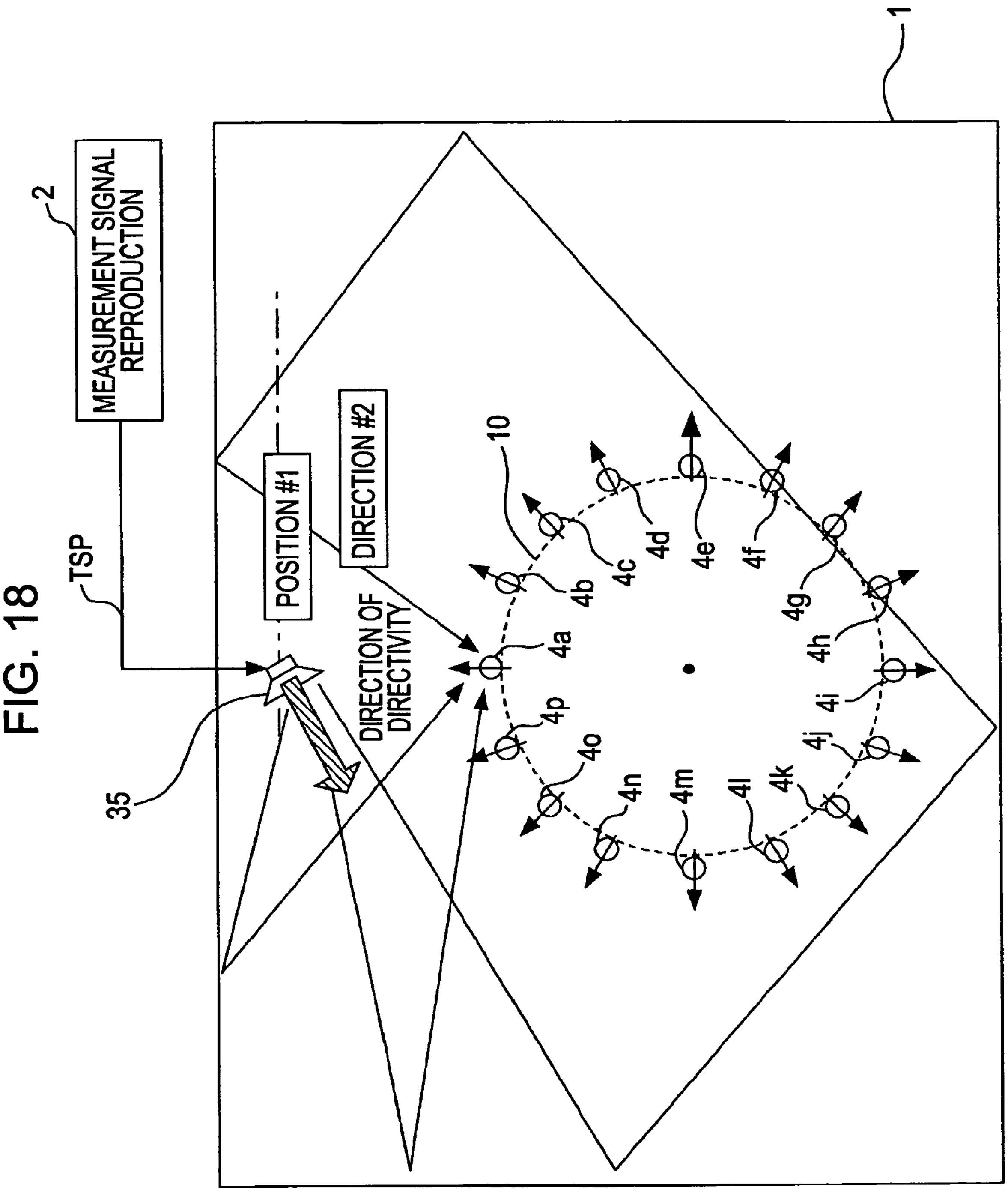
FIG. 18 a schematic diagram showing a manner in which measurement is performed in a measurement environment to determine measurement-based directional transfer functions used to reproduce a particular direction of directivity.
Figure 19:
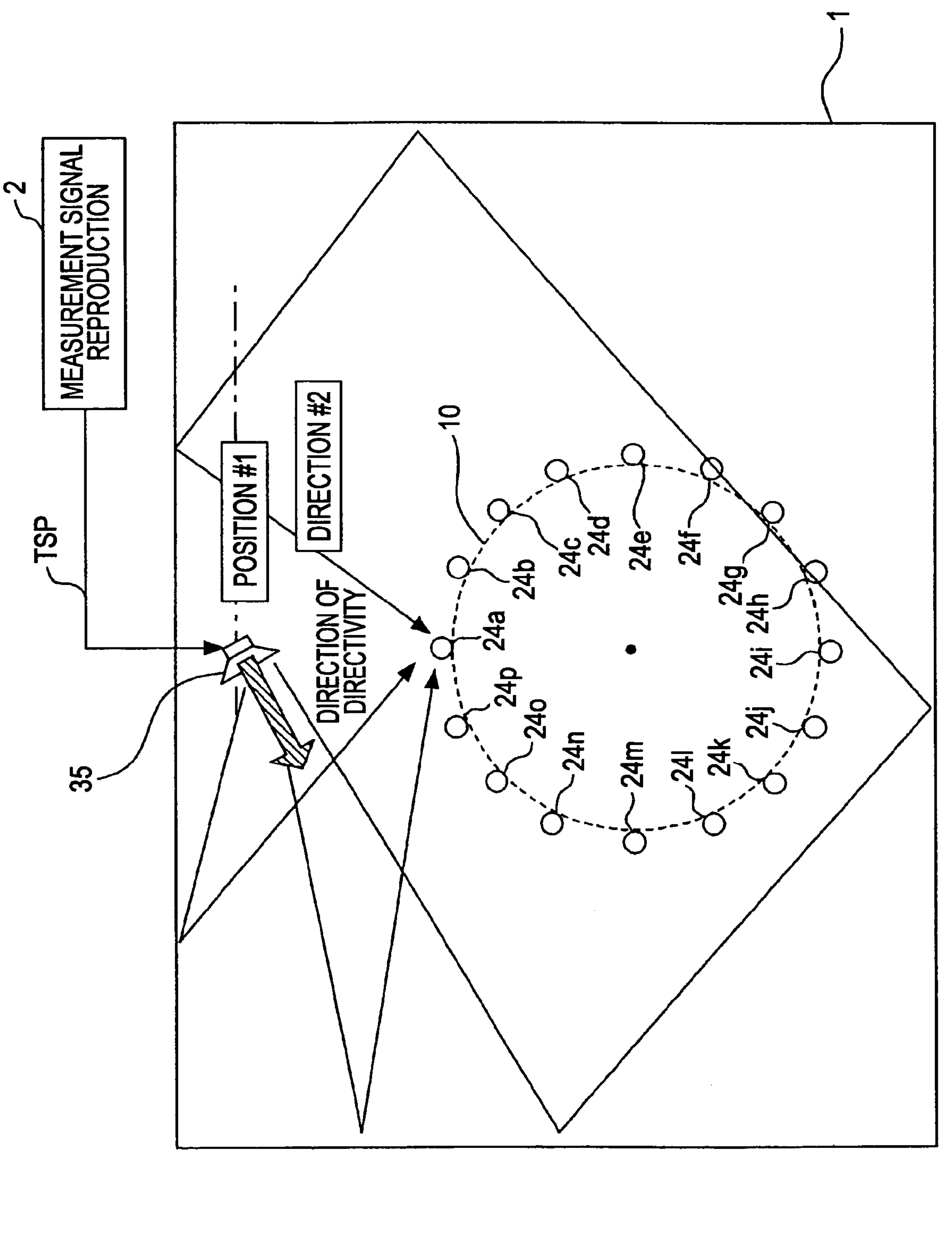
FIG. 19 a schematic diagram showing a manner in which measurement is performed in a measurement environment to determine measurement-based omnidirectional transfer functions used to reproduce a particular direction of directivity.

FIGS. 18 and 19 schematically show a manner in which measurement is performed in a measurement environment 1 to obtain parameters needed to reproduce the direction of the directivity of a sound source in the reproduction of the sound field.

As can be seen from FIGS. 18 and 19, the measurement is performed for both measurement-based directional transfer functions H and measurement-based omnidirectional transfer functions omniH.

FIG. 18 shows a manner in which the measurement is performed to determine the measurement-based directional transfer functions H.

In this measurement in the measurement environment 1, the measurement microphones 4*a* to 4*p* are placed on the first closed surface 10 such that they face in outward directions. A unidirectional speaker used as the measurement speaker 35 is placed so as to face in a particular direction, and a measurement signal TSP is output from this measurement speaker 35 as shown in FIG. 18. Thereafter, the transfer functions H are determined by measuring impulse responses from the measurement speaker 35 to the respective measurement microphones 4*a* to 4*p* in a similar manner as described above.

In the example shown in FIG. 18, it is assumed that the measurement speaker 35 is placed so as to face in direction #2, and the measurement speaker 35 is placed at position #1.

The transfer functions H obtained for the respective measurement microphones 4*a* to 4*p* in the state in which the measurement speaker 35 faces in direction #2 are denoted as transfer functions Ha-dir2, Hb-dir2, Hc-dir2, . . . , Hp-dir corresponding to the respective measurement microphones 4*a*, 4*b*, 4*c*, . . . , 4*p*.

FIG. 19 shows a manner in which measurement is performed to determine measurement-based omnidirectional transfer functions omniH. In this measurement to determine the measurement-based omnidirectional transfer functions omniH, omnidirectional measurement microphones 24*a* to 24*p* are placed at positions similar to the positions of the measurement microphones in the measurement to determine the measurement-based directional transfer functions H shown in FIG. 18. More specifically, a measurement signal TSP is output from a measurement speaker 35 placed at position #1 so as to face in direction #2, and measurement-based omnidirectional transfer functions omniH are determined based on the result of the measurement of the output measurement signal TSP by using the omnidirectional measurement microphones 24*a* to 24*p* placed on the first closed surface 10.

The measurement-based omnidirectional transfer functions omniH obtained for the respective measurement microphones 24*a* to 24*p* in the state in which the measurement speaker 35 faces in direction #2 are denoted as measurement-based omnidirectional transfer functions omniHa-dir2, omniHb-dir2, omniHc-dir2, and omniHp-dir2 corresponding to the respective measurement microphones 24*a* to 24*p*.

Figure 20:
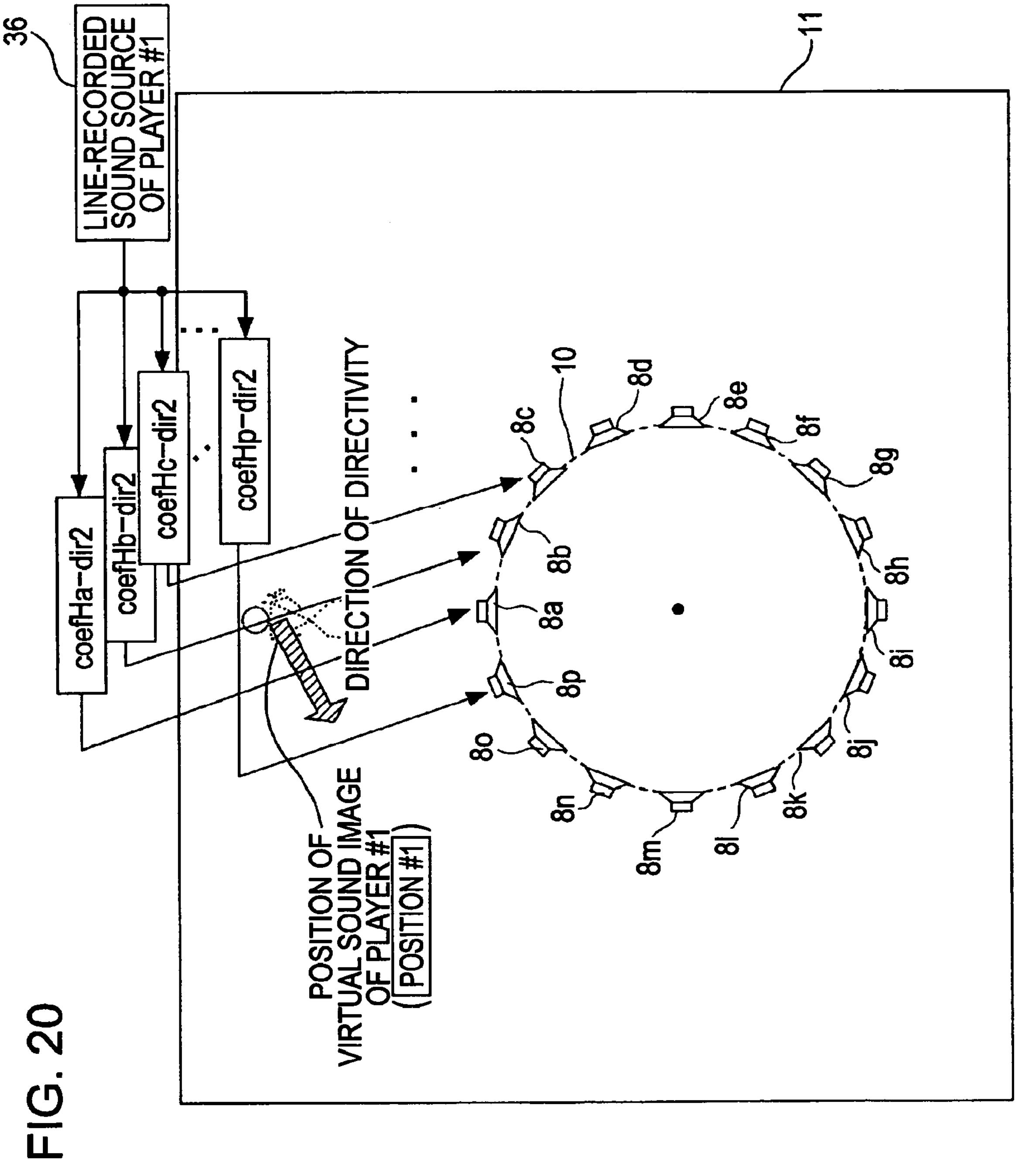
FIG. 20 is a schematic diagram showing a method to reproduce a particular direction of directivity in a reproduction environment.

FIG. 20 is a schematic diagram showing a manner in which the sound field in the measurement environment 1 is reproduced in a reproduction environment 11 based on the measurement-based directional transfer functions H and the measurement-based omnidirectional transfer functions omniH determined in the above-described manner.

Composite transfer functions coefHa-dir2 to coefHp-dir2 shown in FIG. 20 are determined by adding together the measurement-based directional transfer functions Ha-dir2 to Hp-dir2 determined by the measurement described above with reference to FIG. 18, the measurement-based directional transfer functions Ha-dir2 to Hp-dir2 determined by the measurement described above with reference to FIG. 19, and delay-based transfer functions dryHa-dir2 to dryHp-dir2 extracted from the respective measurement-based directional transfer functions Ha-dir2 to Hp-dir2 such that transfer functions with the same subscript (a to p) are added together.

Herein, it is assumed that the sound source is a line-recorded sound source (player #1) 36. Note that the line-recorded sound source 36 is a sound source directly recorded from a player (player #1 in this example). A specific example is a vocal sound detected in the form of an electric signal by a microphone. Another example is an electric audio signal directly captured from an audio output terminal of an electric instrument such as a guitar or a keyboard instrument.

Note that each player is assumed to correspond to one of positions of virtual sound images to be reproduced. In the example shown in FIG. 6, players of vocal, drum, guitar, and keyboard are at respective positions. In the example shown in FIG. 20, player #1 is a vocal player and the virtual sound image is represented by a phantom line.

In the reproduction environment 11, as shown in FIG. 20, reproduction speakers 8*a* to 8*p* are placed on a first closed surface 10 at positions similar to the positions of the measurement microphone 4*a* to 4*p* (measurement microphones 24*a* to 24*p*) in the measurement environment 1.

The line-recorded data is output as an audio signal from a line-recorded sound source 36, and is processed according to composite transfer functions coefHa-dir2, coefHb-dir2, coefHc-dir2, . . . , coefHp-dir2 generated so as to include information representing the direction of the directivity of the sound source. The audio signals obtained as a result of this process are output from the corresponding reproduction speakers 8.

This makes it possible for a listener in the region on the inner side of the first closed surface 10 to perceive that the player #1 plays at the virtual sound image position (position #1) in the measurement environment 1 and the sound is emitted from the virtual sound image position (position #1) in the direction of the directivity denoted by an allow in FIG. 20. Thus, the sound field of the sound emitted at the virtual sound image position (position #1) in the direction of the directivity in the measurement environment 1 is represented in the reproduction environment 11.

A reproduction signal generator for generating a reproduction signal to be output from the speakers 8*a* to 8*p* may be achieved by modifying the configuration shown in FIG. 12 such that the measurement-based directional transfer functions Ha-dir2 to Hp-dir2 and the measurement-based omnidirectional transfer functions omniHa to omniHp are stored in the memory 29, and the coefH generator 27 is replaced with a coefH generator 30 shown in FIG. 15 so that the composite transfer functions coefHa-dir2 to coefHp-dir2 including information indicating the direction of the directivity of the sound source are set in the calculation units 7*a* to 7*p*.

3-2. Simulation of Playing Form

The capability of representing the specific direction of directivity allows it to simulate movement of a player such as a vocalist or a guitarist such as turning around during playing or movement of musical instrument. A specific method is described below.

Figure 21:
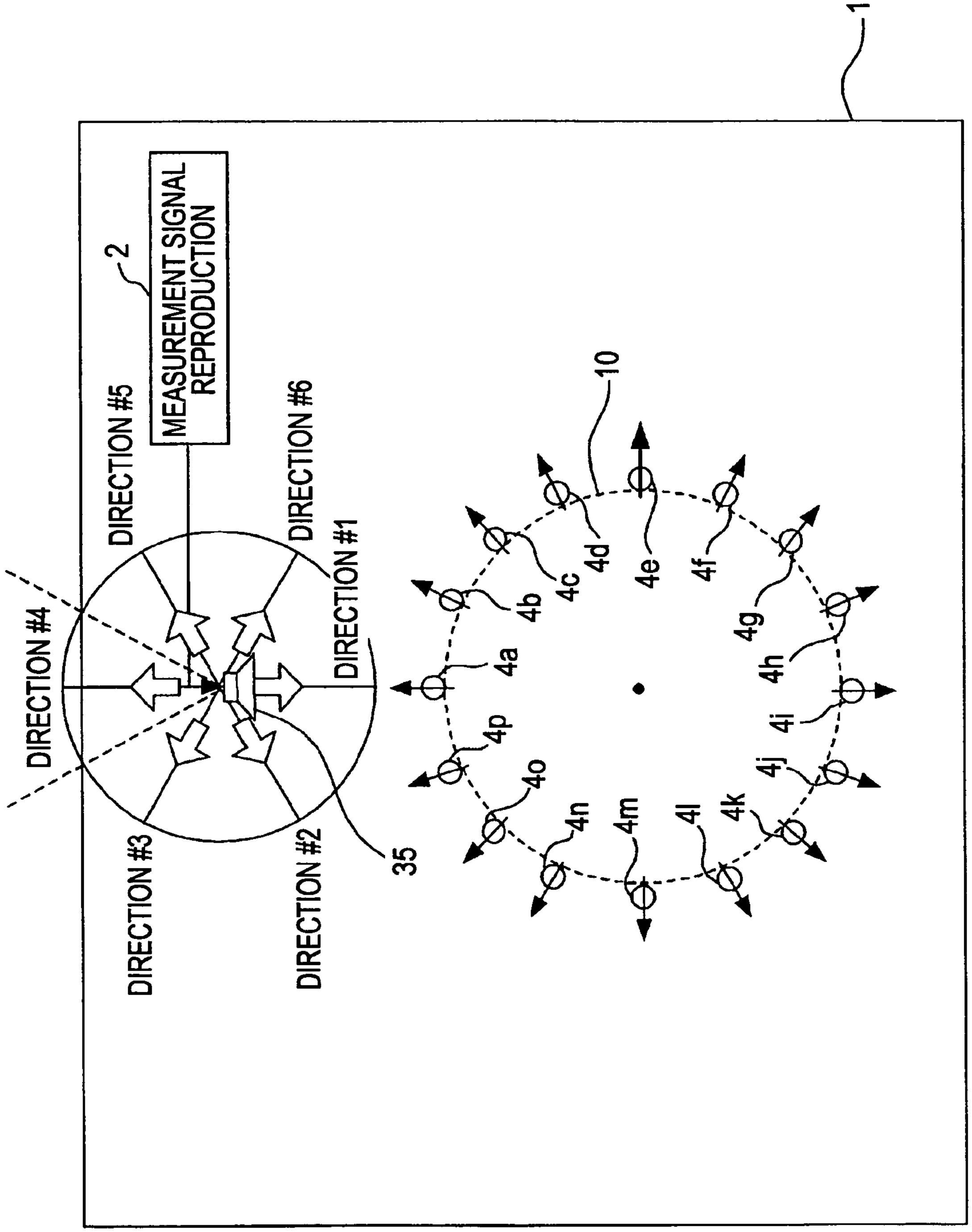
FIG. 21 is a schematic diagram showing a manner in which measurement is performed in a measurement environment to determine transfer functions used to simulate a playing form.

FIG. 21 is a schematic diagram showing a manner in which measurement is performed in the measurement environment 1 to determine transfer functions needed to simulate the playing form.

Note that the measurement in the measurement environment 1 is performed separately for measurement-based directional transfer functions H and measurement-based omnidirectional transfer functions omniH. The difference between the measurement for the measurement-based directional transfer functions H and the measurement for the measurement-based omnidirectional transfer functions omniH is only in whether unidirectional measurement microphones 4 or omnidirectional measurement microphones 24 are used as measurement microphones placed on the first closed surface 10. Thus, only the measurement for the measurement-based directional transfer functions H is explained below, and the explanation of the measurement for the measurement-based omnidirectional transfer functions H is omitted.

First, the measurement speaker 35 is placed at the virtual sound image position so as to face in various directions, and impulse responses are measured separately for each orientation of the measurement speaker 35. In this specific example, it is assumed that a speaker with directivity of 60 degrees is used as the measurement speaker 35 and the orientation of the measurement speaker 35 (the direction of directivity of the sound source) is changed over six directions (directions #1 to #6) from one direction to another.

Impulse responses are measured using the respective measurement microphones 4*a* to 4*p* placed on the first closed surface 10 as shown in FIG. 21 for each direction (#1 to #6) in which the measurement speaker 35 is oriented, and measurement-based directional transfer functions H from the measurement speaker 35 to the respective measurement microphones 4 are determined for each direction (#1 to #6).

When the measurement speaker 35 is oriented in direction #1, the obtained measurement-based directional transfer functions H from the measurement speaker 35 to the respective measurement microphones 4*a* to 4*p* are denoted by Ha-dir1, Hb-dir1, . . . , Hp-dir1. Similarly, the measurement-based directional transfer functions H from the measurement speaker 35 to respective measurement microphones 4*a* to 4*p* for the respective directions #2, #3, #4, #5, and #6 of the measurement speaker 35 are respectively denoted by Ha-dir2, Hb-dir2, . . . , Hp-dir2, Ha-dir3, Hb-dir3, . . . , Hp-dir3, Ha-dir4, Hb-dir4, . . . , Hp-dir4, Ha-dir5, Hb-dir5, . . . , Hp-dir5, and Ha-dir6, Hb-dir6, . . . , Hp-dir6.

Although an explanation with reference to a figure is not given, measurement-based omnidirectional transfer functions omniH to the respective measurement microphones 24*a* to 24*p* for direction #1 are denoted by omniHa-dir1, omniHb-dir1, . . . , omniHp-dir1. Similarly, the measurement-based omnidirectional transfer functions omniH from the measurement speaker 35 to respective measurement microphones 24*a* to 24*p* for the respective directions #2, #3, #4, #5, and #6 of the measurement speaker 35 are respectively denoted by omniHa-dir2, omniHb-dir2, . . . , omniHp-dir2, omniHa-dir3, omniHb-dir3, . . . , omniHp-dir3, omniHa-dir4, omniHb-dir4, . . . , omniHp-dir4, omniHa-dir5, omniHb-dir5, . . . , omniHp-dir5, and omniHa-dir6, omniHb-dir6, . . . , omniHp-dir6.

From the measurement-based directional transfer functions H determined for each direction (#1 to #6), delay-based transfer functions dryH for each direction (#1 to #6) can be extracted.

The delay-based transfer functions dryH corresponding to the respective measurement microphones 4*a* to 4*p* for direction #1 are denoted by dryHa-dir1, dryHb-dir1, . . . , dryHp-dir1. Similarly, the delay-based transfer functions dryH from the measurement speaker 35 to respective measurement microphones 4*a* to 4*p* for the respective directions #2, #3, #4, #5, and #6 of the measurement speaker 35 are respectively denoted by dryHa-dir2, dryHb-dir2, . . . , dryHp-dir2, dryHa-dir3, dryHb-dir3, . . . , dryHp-dir3, dryHa-dir4, dryHb-dir4, . . . , dryHp-dir4, dryHa-dir5, dryHb-dir5, . . . , dryHp-dir5, and dryHa-dir6, dryHb-dir6, . . . , dryHp-dir6.

Composite transfer functions coefH for each direction (#1 to #6) can be obtained from the measurement-based directional transfer functions H, the measurement-based omnidirectional transfer functions omniH, and the delay-based transfer functions dryH.

More specifically, composite transfer functions coefH for direction #1 are obtained as composite transfer functions coefHa-dir1, coefHb-dir1, . . . , coefHp-dir1. Similarly, for respective directions #2, #3, #4, #5, and #6, composite transfer functions coefH are obtained as composite transfer functions coefHa-dir2, coefHb-dir2, . . . , coefHp-dir2, composite transfer functions coefHa-dir3, coefHb-dir3, . . . , coefHp-dir3, composite transfer functions coefHa-dir4, coefHb-dir4, . . . , coefHp-dir4, composite transfer functions coefHa-dir5, coefHb-dir5, . . . , coefHp-dir5, and composite transfer functions coefHa-dir6, coefHb-dir6, . . . , coefHp-dir6.

In the reproduction of the sound, if the input audio signal to be reproduced is processed according to the composite transfer functions coefH while changing the direction of the composite transfer functions with passage of time, the direction (the directivity) of the sound emitted from the sound source is changed with the passage of time. For example, if the composite transfer functions coefH used in the calculation process on the input audio signal are sequentially changed in terms of the direction in order direction #1→direction #2→direction #3, . . . →direction #6, then the direction of the reproduced sound rotates about the virtual sound image position in order direction #1→direction #2→direction #3, . . . →direction #6, that is, the player rotates about the virtual sound image position in the reproduction of the sound field.

Figure 22:
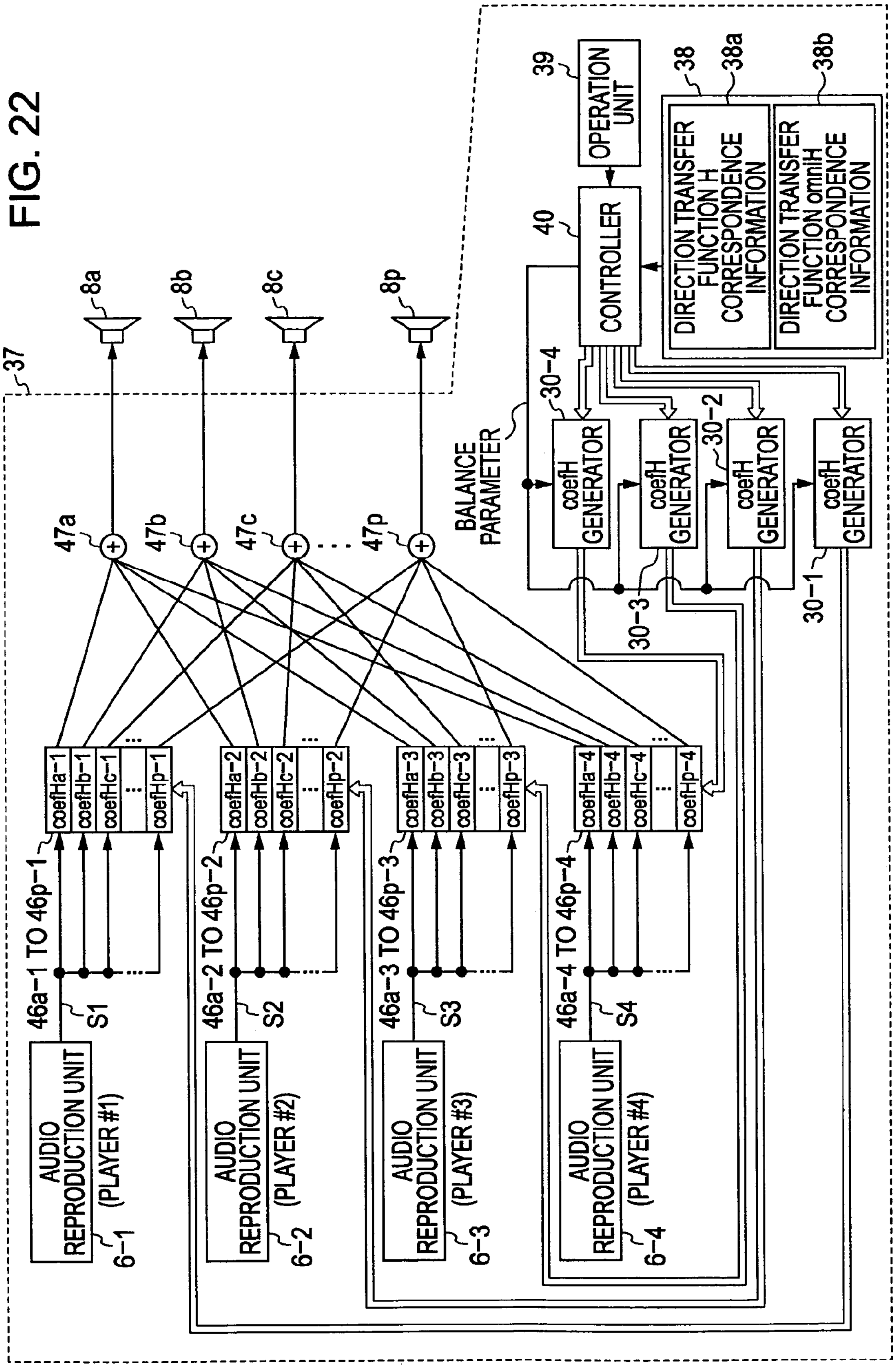
FIG. 22 is a block diagram showing a configuration of a reproduction signal generator adapted to simulate a playing form.

FIG. 22 shows a configuration of a reproduction signal generator 37 adapted to control the directivity of the reproduced sound.

In the example shown in FIG. 22, it is assumed that the reproduction signal generator 37 is adapted to reproduce sounds emitted at a plurality of positions (four positions #1 to #4 in this example) in the measurement environment 1 as in the example described above with reference to FIGS. 4 to 6.

When a plurality of positions are assumed as is the case in the present example, transfer functions H and transfer functions omniH can be determined by measuring impulse responses for the respective positions at which measurement speakers 35 (35-1 to 35-4) are placed, using the technique described above with reference to FIG. 21.

As shown in FIG. 22, in order to adapt to the plurality of positions (#1 to #4), the reproduction signal generator 37 includes sound reproduction units (6-1 to 6-4) for the respective positions (#1 to #4) and calculation units for the respective positions (#1 to #4) as in the configuration shown in FIG. 5.

Herein, the correspondence between positions (players) and sound reproduction units is denoted by a numeric number following a hyphen of the reference number denoting each sound reproduction unit. For example, a sound reproduction unit 6-1 is a sound reproduction unit for position #1. Similarly, calculation units 46*a*-1 to 46*p*-1 are calculation units for position #1, calculation units 46*a*-2 to 46*p*-2 are calculation units for position #2, calculation units 46*a*-3 to 46*p*-3 are calculation units for position #3, and calculation units 46*a*-4 to 46*p*-4 are calculation units for position #4.

The reproduction signal generator 37 also includes adders 47*a* to 47*p* corresponding one-to-one to the respective reproduction speakers 8*a* to 8*p*. The adders 47*a* to 47*p* respectively receive data output from the calculation units 46*a*-1 to 46*p*-1, the calculation units 46*a*-2 to 46*p*-2, the calculation units 46*a*-3 to 46*p*-3, and the calculation units 46*a*-4 to 46*p*-4. Note that data output from a calculation unit with a subscript of a lower-case letter (a to p) is input to an adder with the same subscript. Each calculation unit adds together the input data and supplies the result to a corresponding reproduction speaker 8. Each reproduction speaker 8 outputs a reproduction signal to reproduce a sound image at a corresponding position.

In order to control the directivity of a sound emitted at each position by changing the composite transfer functions which have been determined for respective directions, the reproduction signal generator 37 further includes coefH generators 30-1, 30-2, 30-3, and 30-4, a controller 40, a memory 38, and an operation unit 39.

In the memory 38, the direction-to-transfer function H correspondence information 38*a* associated with the measurement-based directional transfer functions H and the direction-to-transfer function omniH correspondence information 38*b* as the transfer functions for respective positions and for respective directions obtained as a result of measurement performed in the measurement environment 1 are stored.

FIG. 23 shows the data structure of the direction-to-transfer function H correspondence information 38*a* stored in the memory 38, and FIG. 24 shows the data structure of the direction-to-transfer function omniH correspondence information 38*b*.

As shown in these figures, the information indicating the transfer functions H and the transfer functions omniH for the respective positions and for the respective directions of the measurement speaker 35 is stored in the memory 38.

FIG. 23 shows, in the form of a table, which transfer function corresponds to which position and corresponds to which direction. In this table, a numeral following "-dir"in a symbol (such as Ha1-dir1) denoting a transfer function denotes a direction. For example, a transfer function from the measurement speaker 21 placed at position #1 and oriented in direction #2 to the measurement microphone 4*a* is denoted by a symbol Ha1-dir2. A transfer function from the measurement speaker 21 placed at position #3 and oriented in direction #6 to the measurement microphone 4*b* is denoted by a symbol Hb3-dir6.

Similarly, FIG. 24 shows, in the form of a table, the correspondence of transfer functions omniHa to omniHp in terms of position and direction. Also in this table, a numeral following "-dir" in a symbol (such as Ha1-dir1) denoting a transfer function denotes a direction.

In FIG. 22, the coefH generators 30-1, 30-2, 30-3, and 30-4 are each configured in a similar manner to the coefH generator 30 shown in FIG. 15. The coefH generator 30-1 generates composite transfer functions coefH for player #1 from transfer functions H and transfer functions omniH associated with position #1 (player #1) read from the memory 38 under the control of the controller 40. The coefH generator 30-2 generates composite transfer functions coefH for player #2 from transfer functions H and transfer functions omniH associated with position #2 (player #2) read from the memory 38 under the control of the controller 40. Similarly, the coefH generators 30-3 and 30-4 generate composite transfer functions coefH for respective players #3 and #4 from transfer functions H and transfer functions omniH associated with position #3 or #4 (player #3 or #4) read from the memory 38 under the control of the controller 40.

The composite transfer functions coefHa to coefHp associated with player #1 generated by the coefH generator 30-1 are supplied to the calculation units 46*a*-1 to 46*p*-1 to which the reproduction signal S1 associated with player #1 is supplied, such that a composite transfer function with a subscript of a lower-case letter (a to p in this specific example) is supplied to a calculation unit with the same subscript (a to p).

Similarly the composite transfer functions coefHa to coefHp associated with player #2 generated by the coefH generator 30-2 are supplied to the calculation units 46*a*-2 to 46*p*-2 to which the reproduction signal S2 associated with player #2 is supplied, such that a composite transfer function with a subscript of a lower-case letter (a to p in this specific example) is supplied to a calculation unit with the same subscript (a to p). The composite transfer functions coefHa to coefHp associated with player #3 generated by the coefH generator 30-3 are supplied to the calculation units 46*a*-3 to 46*p*-3 to which the reproduction signal S3 associated with player #3 is supplied, such that a composite transfer function with a subscript of a lower-case letter (a to p in this specific example) is supplied to a calculation unit with the same subscript (a to p). The composite transfer functions coefHa to coefHp associated with player #4 generated by the coefH generator 30-4 are supplied to the calculation units 46*a*-4 to 46*p*-4 to which the reproduction signal S4 associated with player #4 is supplied, such that a composite transfer function with a subscript of a lower-case letter (a to p in this specific example) is supplied to a calculation unit with the same subscript (a to p).

The controller 40 selects transfer functions H and transfer functions omniH from those associated with the respective directions stored in the memory 38 and supplies the selected transfer functions H and transfer functions omniH to the coefH generators 30-1, 30-2, 30-3, and 30-4 such that the calculation units 46 generate composite transfer function coefH associated with a particular direction corresponding to the supplied transfer functions H and transfer functions omniH thereby controlling the direction of the sound emitted at each position.

For example, to rotate the directivity of the sound emitted at position #1 in order direction #1→direction #2 →direction #3, transfer functions H and transfer functions omniH associated with position #1 are sequentially read from the memory 38 in order transfer functions Ha1-dir1 to Hp1-dir1 →Ha1-dir2 to Hp1-dir2→Ha1-dir3 to Hp1-dir3 and transfer functions omniHa1-dir1 to omniHp1-dir1 →omniHa1-dir2 to omniHp1-dir2→omniHa1-dir3 to omniHp1-dir3, and are sequentially supplied to the coefH generator 30-1. In response, the coefH generator 30-1 sequentially generates composite transfer functions coefH in order coefHa1-dir1 to coefHp1-dir1 →coefHa1-dir2 to coefHp1-dir2→coefHa1-dir3 to Hp1-dir3 and sequentially supplies these composite transfer functions coefH to the calculation units 46*a*-1 to 46*p*-1. As a result, the direction of the sound emitted at position #1 rotates with passage of time in order direction #1→direction #2→direction #3.

On the other hand, to rotate the directivity of the sound emitted at position #4 in order direction #4 →direction #3→direction #2, transfer functions H and transfer functions omniH associated with position #4 are sequentially read from the memory 38 in order transfer functions Ha4-dir4 to Hp4-dir4→Ha4-dir3 to Hp4-dir3 →Ha4-dir2 to Hp4-dir2, and transfer functions omniHa4-dir4 to omniHp4-dir4→omniHa4-dir3 to omniHp4-dir3→omniHa4-dir2 to omniHp4-dir2, and are sequentially supplied to the coefH generator 30-4. In response, the coefH generator 30-4 sequentially generates composite transfer functions coefH in order coefHa4-dir4 to coefHp4-dir4 →coefHa4-dir3 to coefHp4-dir3→coefHa4-dir2 to Hp4-dir2 and sequentially supplies these composite transfer functions coefH to the calculation units 46*a*-4 to 46*p*-4. As a result, the direction of the sound emitted at position #4 rotates with passage of time in order direction #4→direction #3 →direction #2.

When the direction of a sound is controlled, if it is desirable to control the direction more smoothly, it is needed that the above-described measurement should be performed for a greater number of directions. That is, it is needed to define a greater number of directions and determine transfer functions H and transfer functions omniH for each of the greater number of directions.

However, it is not practical to increase the number of times the measurement is performed. Instead, transfer functions H and transfer functions omniH are calculated by means of interpolation for a greater number of directions and are used to represent the rotation in a smoother manner. This makes it possible to represent smooth rotation using transfer functions H and transfer functions omniH originally determined for a small number of directions.

The controller 40 and the operation unit 39 are configured, as with the controller 25 and the operation unit 26 described above with reference to FIG. 15, such that the values of the balance parameters can be variably and individually set by the balance parameter setting units (21*a* to 21*p*, 22*a* to 22*p*, and 32*a* to 32*p*) in the coefH generator 30. This configuration makes it possible to adjust the components of the transfer functions H, the transfer functions omniH, and the delay-based transfer functions dryH for each player and for each position of the reproduction speakers 8*a* to 8*p*.

Note that, in order to adapt to four players, the operation unit 39 should have as many control knobs as there are players. In the case in which control knob icons are provided on the screen of the operation panel, the controller 40 displays as many as control knob icons as there are players.

The controller 40 may also be configured so as to be capable of specifying a manner in which to change the directivity of a sound. For example, the controller 40 may have another control knob on the operation unit 39 to allow a user to input a command to specify the manner in which to change the directivity and/or specify the timing of changing the directivity with respect to the time base of the audio signal.

The controller 40 may also be configured so as to be capable of specifying a sound source (position) whose directivity should be controlled.

When the directivity of the sound source is not controlled (that is, when sound quality is simply adjusted for the respective positions), the reproduction signal generator 37 may be configured such that the transfer functions H and the transfer functions omniH for the respective positions determined based on the result of measuring the sounds emitted from the omnidirectional measurement speakers 3 placed at the respective positions are stored in the memory 38, and such that the controller 40 supplies these transfer functions H and transfer functions omniH to the coefH generators 30 such that the transfer functions H and the transfer functions omniH associated with position #1 are supplied to the coefH generator 30-1, the transfer functions H and the transfer functions omniH associated with position #2 are supplied to the coefH generator 30-2, the transfer functions H and the transfer functions omniH associated with position #3 are supplied to the coefH generator 30-3, and the transfer functions H and the transfer functions omniH associated with position #4 are supplied to the coefH generator 30-4.

3-3. Reproduction of Stereo Effector

In the above explanation, it is assumed that the input audio signal is monophonic. In practice, the input audio signal can be stereophonic. For example, it is known to convert a monophonic audio signal output from an electric instrument such as an electric guitar into a stereo audio signal using an effector.

When it is desirable to directly reproduce such an effect, two sound sources Rch (right channel) and Lch (left channel) may be reproduced at one virtual sound image position. This can be accomplished by controlling the sound directivity using the technique described above.

Figure 25:
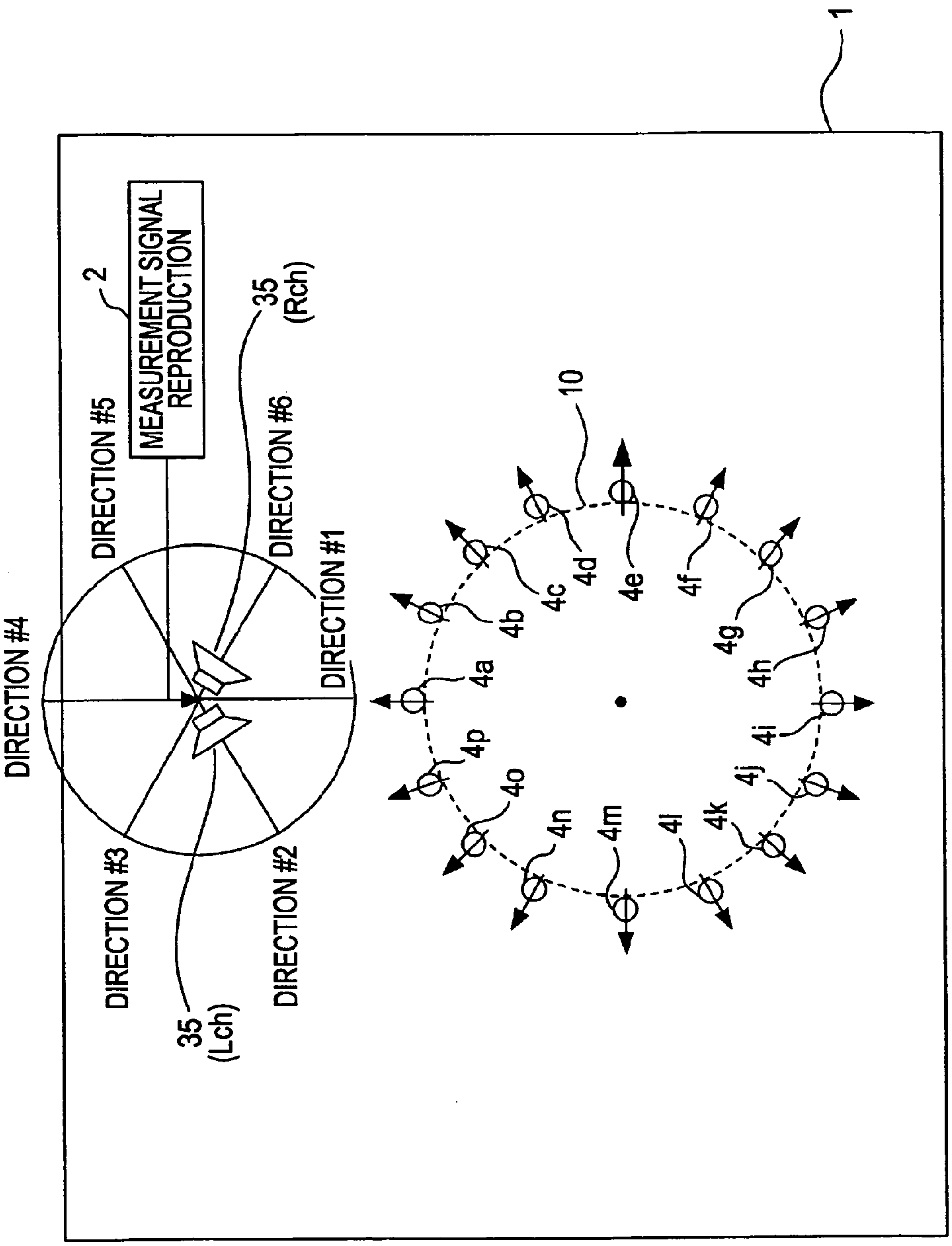
FIG. 25 a schematic diagram showing a manner in which measurement in a measurement environment is performed to determine transfer functions used to reproduce two sound sources Rch and Lch at one virtual sound image position.

FIG. 25 is a schematic diagram showing a manner in which measurement is performed in a measurement environment 1 to determine transfer functions needed to reproduce two sound sources Rch and Lch at one virtual sound image position.

To reproduce such two sound sources Rch and Lch, the directivity of these two sound sources should be set to be opposite to each other or at least so as not be completely the same. In the example shown in FIG. 25, the directivity of the sound source Rch is set to be in direction #6, and the directivity of the sound source Lch is set to be in direction #2.

In this case, the measurement is performed such that the impulse responses from the measurement speaker 35 serving as the sound source Rch and oriented in direction #6 to the respective measurement microphones 4 (measurement microphones 24) and the impulse responses from the measurement speaker 21 serving as the sound source Lch and oriented in direction #2 to the respective measurement microphones 4 (measurement microphones 24) are measured, and transfer functions H and transfer functions omniH are determined from the measured impulse responses for respective sound sources Rch and Lch.

Herein, when it is assumed that the measurement speaker 35 is placed at position #1, transfer functions H obtained for the respective microphones 4 and for direction #6 are denoted as transfer functions Ha1-dir6, Hb1-dir6, . . . , Hp1-dir6. Transfer functions H obtained for the respective microphones 4 and for direction #2 are denoted as transfer functions Ha1-dir2, Hb1-dir2, . . . , Hp1-dir2.

Transfer functions omniH obtained for the respective microphones 24 and for direction #6 are denoted as transfer functions omniHa1-dir6, omniHb1-dir6, . . . , omniHp1-dir6. Transfer functions omniH obtained for the respective microphones 24 and for direction #2 are denoted as transfer functions omniHa1-dir2, omniHb1-dir2, . . . , omniHp1-dir2.

Figure 26:
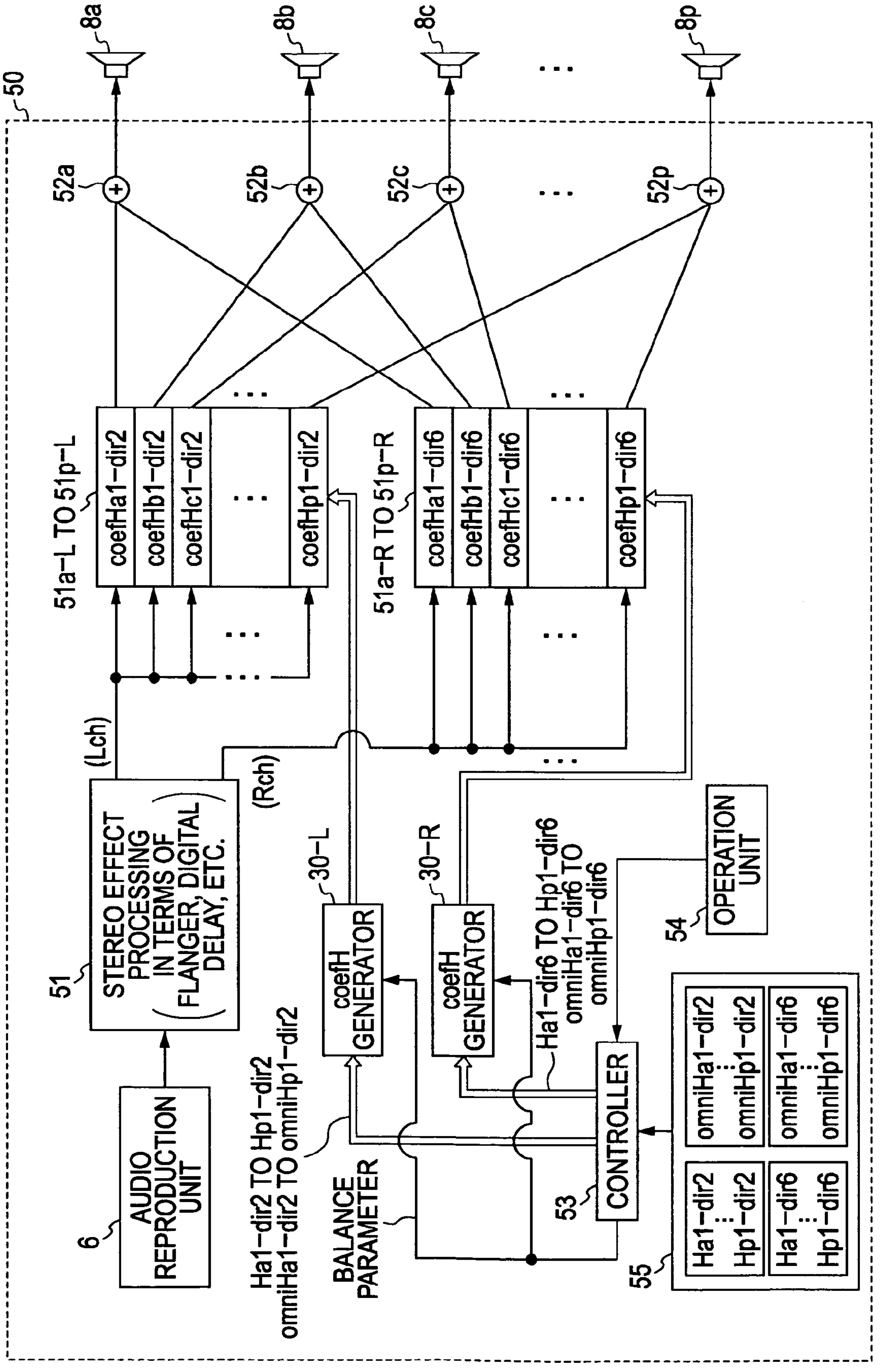
FIG. 26 a block diagram showing a reproduction signal generator adapted to reproduce two sound sources Rch and Lch at one virtual sound image position.

FIG. 26 illustrates a configuration of a reproduction signal generator 50 adapted to generate reproduction signals to be output from respective reproduction speakers 8*a* to 8*p* in a reproduction environment 11 to reproduce the two sound sources Rch and Lch at one virtual sound image position.

A reproduction signal S output from a sound reproduction unit 6 is input to a stereo effect processing unit 51. The stereo effect processing unit 51 generates a stereo audio signal including a Rch component and a Lch component by performing a digital effect process such as flanger or a digital delay process on the input monophonic audio signal.

Although in the present example, the reproduction signal generator 50 includes the stereo effector, the stereo effector may be disposed externally, and a stereo audio signal including an Rch component and an Lch component output from the external stereo effect may be input to the reproduction signal generator 50.

Calculation units 51*a*-L, 51*b*-L, . . . , 51*p*-L process the input audio signal Lch according to the preset composite transfer functions coefH. Calculation units 51*a*-R, 51*b*-R, . . . , 51*p*-R process the input audio signal Rch according to the preset composite transfer functions coefH.

The composite transfer functions coefH set in the respective calculation units 51*a*-L, 51*b*-L, . . . , 51*p*-L and the calculation units 51*a*-R, 51*b*-R, . . . , 51*p*-R are generated by the coefH generator 30-L and the coefH generator 30-R shown in the figure. The coefH generator 30-L and the coefH generator 30-R are each configured in a similar manner to the coefH generator 30 shown in FIG. 15. Note that the composite transfer functions coefH to be set in respective calculation units are generated from the transfer functions H and the transfer functions omniH supplied to the respective coefH generators 30 under the control of the controller 53.

In this case, the transfer functions Ha1-dir2 to Hp-dir2 and the transfer functions omniHa-dir2 to omniHp-dir2 associated with direction #2 determined based on the result of the above-described measurement in the measurement environment 1 the transfer functions Ha1-dir6 to Hp-dir6 and the transfer functions omniHa-dir6 to omniHp-dir6, which have been determined based on the result of the above-described measurement in the measurement environment 1, are stored in a memory 55 of the controller 53. The controller 53 reads the transfer functions Ha1-dir2 to Hp-dir2 and the transfer functions omniHa-dir2 to omniHp-dir2 from the memory 55 and supplies these transfer functions to the coefH generator 30-L responsible for Lch. The coefH generator 30-L generates composite transfer functions coefH (coefHa1-dir2 to coefHp-dir2) associated with direction #2 and supplies them to the calculation units 51*a*-L to 51*p*-L such that a composite transfer function coefH with a subscript of a lower-case letter (a to p) is supplied to a calculation unit 51 with the same subscript.

The controller 53 also reads the transfer functions Ha1-dir6 to Hp-dir6 and the transfer functions omniHa-dir6 to omniHp-dir6 from the memory 55 and supplies them to the coefH generator 30-R responsible for Rch. The coefH generator 30-R generates composite transfer functions coefH (coefHa1-dir6 to coefHp-dir6) associated with direction #6 and supplies them to the calculation units 51*a*-R to 51*p*-R such that a composite transfer function coefH with a subscript of a lower-case letter (a to p) is supplied to a calculation unit 51 with the same subscript.

The calculation units 51*a*-L, 51*b*-L, . . . , 51*p*-L generate reproduction signals to be output from the respective reproduction speakers 8 to reproduce the Lch sound source with directivity in direction #2.

The calculation units 51*a*-R, 51*b*-R, . . . , 51*p*-R generate reproduction signals to be output from the respective reproduction speakers 8 to reproduce the Rch sound source with directivity in direction #6.

Note that the controller 53 is configured such that the balance parameter values associated with the respective balance parameter setting units (21*a* to 21*p*, 22*a* to 22*p*, and 32*a* to 32*p*) in the coefH generator 30-L and the coefH generator 30-R can be individually and variably set. To this end, an operation unit 54 for specifying the respective balance parameter values is provided.

The reproduction signals generated by the calculation units 51*a*-L to 51*p*-L and the calculation units 51*a*-R to 51*p*-R are supplied adders 52*a* to 52*p* such that a reproduction signal generated by a calculation unit 51 with a subscript of a lower-case letter (a to p) is supplied to an adder 52 with the same subscript. The input reproduction signals are added together by the corresponding adders 52 and resultant signals are supplied to the reproduction speakers 8 with corresponding subscripts.

Thus, the reproduction signals for reproducing the directivity of the Lch sound source and the reproduction signals for reproducing the directivity of the Rch sound source are individually added together and output from the corresponding reproduction speakers 8. As a result, the sound field in the measurement environment 1 is reproduced in the region on the inner side of the first closed surface 10 on which the reproduction speakers 8 are placed in the reproduction environment 11 such that the directivity of each sound source is also reproduced.

3-4. Reproduction of Directivity of Sound Source and Reproduction of Sound Emission Characteristics for Each Directivity Unlike electric instruments, acoustic instruments such as a piano, a violin, drum, etc. are different in directivity and sound emission characteristic in each direction of directivity from one acoustic instrument to another. Strictly speaking, the directivity and the sound emission characteristics depending on the directivity of respective instruments (sound sources) individually interact with the entire acoustic space such as a hall, and an acoustic characteristic of each sound source is determined as a result of interaction. Therefore, in order to reproduce the virtual sound image of the sound source in a realistic manner, it is desirable to reproduce the sound field taking into account the directivity and the sound emission characteristics depending on the directivity.

A technique to reproduce the sound field taking into account the directivity and the sound emission characteristics depending on the directivity is described below with reference to FIGS. 27 to 30.

Figure 27A:
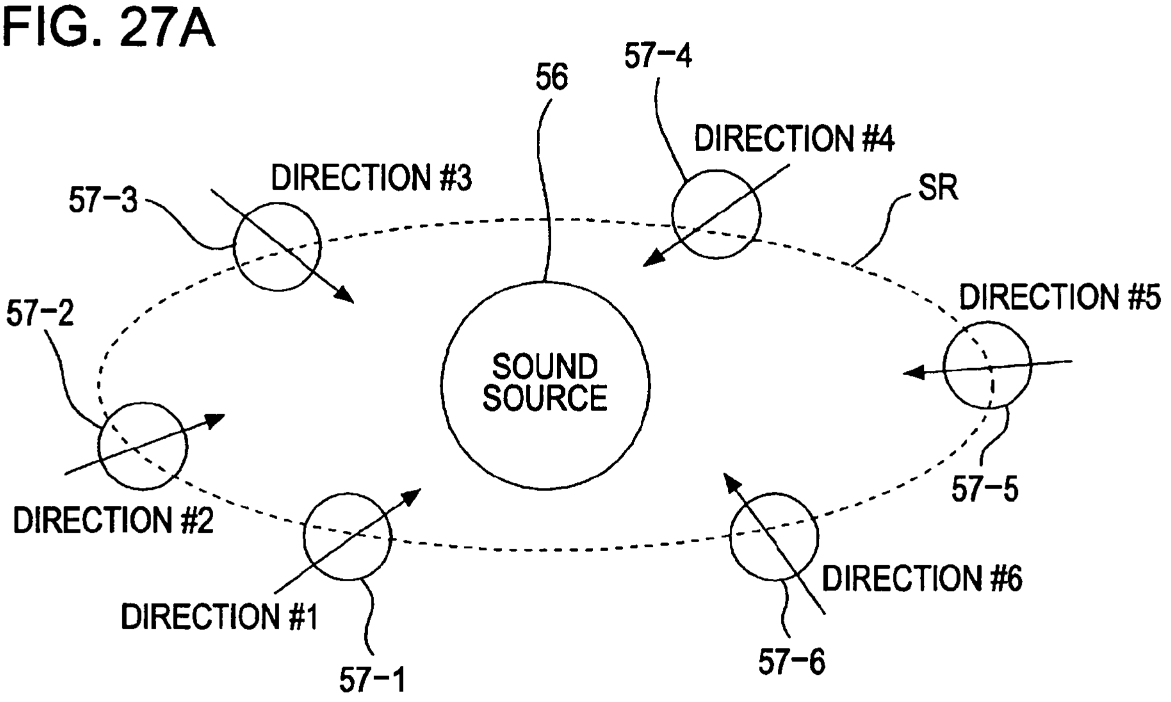
FIGS. 27A and 27B show a method of recording a sound source to reproduce a sound field such that directivity of the sound sourer and sound emission characteristics in a plurality of directions are reproduced.
Figure 27B:
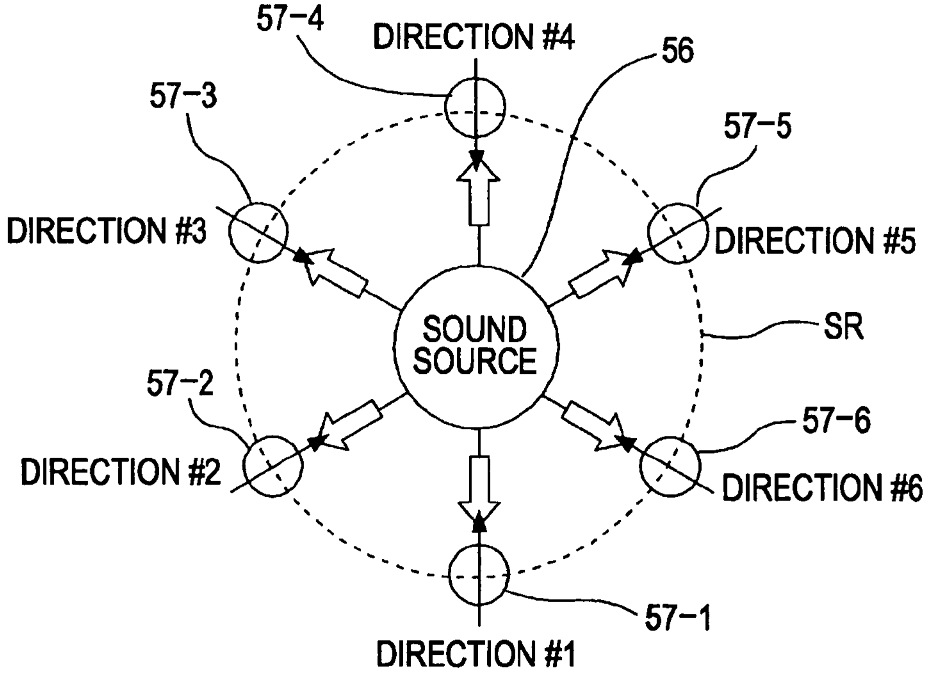

FIGS. 27A and 27B schematically illustrate a manner in which a sound source is recorded, wherein FIG. 27A is a perspective view and FIG. 27B is a top view.

First, a sound recording plane SR is defined such that a sound source 56 is circularly surrounded by the sound recording plane SR in a plane. In this sound recording plane SR, a plurality of recording microphones 57 (directional microphones) are placed such that the sound source 56 is surrounded by the recording microphones 57. In FIGS. 27A and 27B, an arrow on each microphone 57 indicates the direction of directivity of the microphone 57. As represented by these arrows, each microphone 57 is placed so as to face the sound source 56. If the sound emitted from the sound source 56 is recorded by each of the plurality of directional microphones placed in the above-described manner, the directivity of the sound source 56 and the sound emission characteristic thereof in the respective directions are reflected in the resultant recorded sounds.

In the example shown in FIGS. 27A and 27B, it is assumed that six recording microphones 57 each having directivity of 60° are placed in the sound source recording plane SR such that six directions #1 to #6 are respectively defined by these six recording microphones 57. Herein, as shown in FIGS. 27A and 27B, in order to distinguish these recording microphones 57 from each other, a numeral following a hyphen is used such as, for example, the recording microphone 57 for direction #1 is denoted as the recording microphone 57-1, the recording microphone 57 for direction #2 is denoted as the recording microphone 57-2 and so on.

By surrounding the sound source 56 from six directions as described above, six directions are defined as directivity of the sound source 56. By recording the sound using the recording microphones 57 respectively placed in these six directions, the sound emission characteristics of the sound source 56 in the respective six directions are reflected in the sound recorded by the respective recording microphones 57.

If the sounds recorded by these recording microphones 57 are emitted outwardly in the respective directions, then the directivity of the sound source 56 and the sound emission characteristics in the respective directions are reproduced.

More specifically, if directional speakers having the same directivity (60° as that of the recording microphones 57 are placed at the same positions as the positions of the respective recording microphones 57 placed in the respective directions shown in FIG. 27A or 27B, and if the sounds recorded by the respective recording microphones 57 are output from the corresponding speakers, then the sound source 56 is reproduced such that the directivity of the sound source 56 and the sound emission characteristics in the respective directions are reproduced.

In the recording of the sound source 56 using the respective recording microphones 57, it is desirable to place the recording microphones 57 at locations as close to the sound source 56 as possible to avoid the recorded sound from including as little spatial information in the recording environment as possible.

As described above, the directivity of the sound source 56 and the sound emission characteristics in the respective directions can be reproduced by recording the sound by the microphones placed in the respective directions around the sound source 56 and outputting the recorded sounds from the directional speakers placed in the same positions of the microphones in the directions opposite to the directions of the microphones. This technique can be used to reproduce the sound field in a reproduction environment 11 different from the measurement environment 1 in which the sound source 56 was recorded.

To represent, in the reproduction environment 11, the directions #1 to #6 of the sound source 56 placed in the measurement environment 1, transfer functions H and transfer functions omniH (in other words, composite transfer functions coefH) are determined for each direction. In this case, because the recorded sound of the sound source 56 has been obtained for each direction, if the convolution of the recorded sound in each direction with the composite transfer function coefH in this direction is determined, a reproduction signal in this direction is obtained.

Because there are six directions defined as directions of directivity of the sound source 56, the transfer functions H and the transfer functions omniH are determined in each of these directions using the technique described above with reference to FIG. 21. More specifically, the measurement speaker 35 placed in the measurement environment 1 is oriented in one of these six directions, and the impulse responses from the measurement speaker 35 to the respective measurement microphones 4*a* to 4*p* (24*a* to 24*p*) are measured. Based on the measured impulse responses, the transfer functions H and the transfer functions omniH in this direction can be determined. If the measurement speaker 35 is oriented in another one of the six directions, the transfer functions H and the transfer functions omniH can be determined in this direction. The transfer functions H and the transfer functions omniH are determined for all directions in this manner.

Herein, if it is assumed that the sound source 56 is placed in the measurement environment 1 at position #1 (player #1), then transfer functions H in direction #1 are determined as transfer functions Ha1-dir1, Hb1-dir1, . . . , Hp1-dir1. Similarly, transfer functions Ha1-dir2, Hb1-dir2, . . . , Hp1-dir2 are determined for direction #2, transfer function Ha1-dir3, Hb1-dir3, . . . , Hp1-dir3 are determined for direction #3, transfer function Ha1-dir4, Hb1-dir4, . . . , Hp1-dir4 are determined for direction #4, transfer function Ha1-dir5, Hb1-dir5, . . . , Hp1-dir5 are determined for direction #5, and transfer function Ha1-dir6, Hb1-dir6, . . . , Hp1-dir6 are determined for direction #6.

Figure 28:
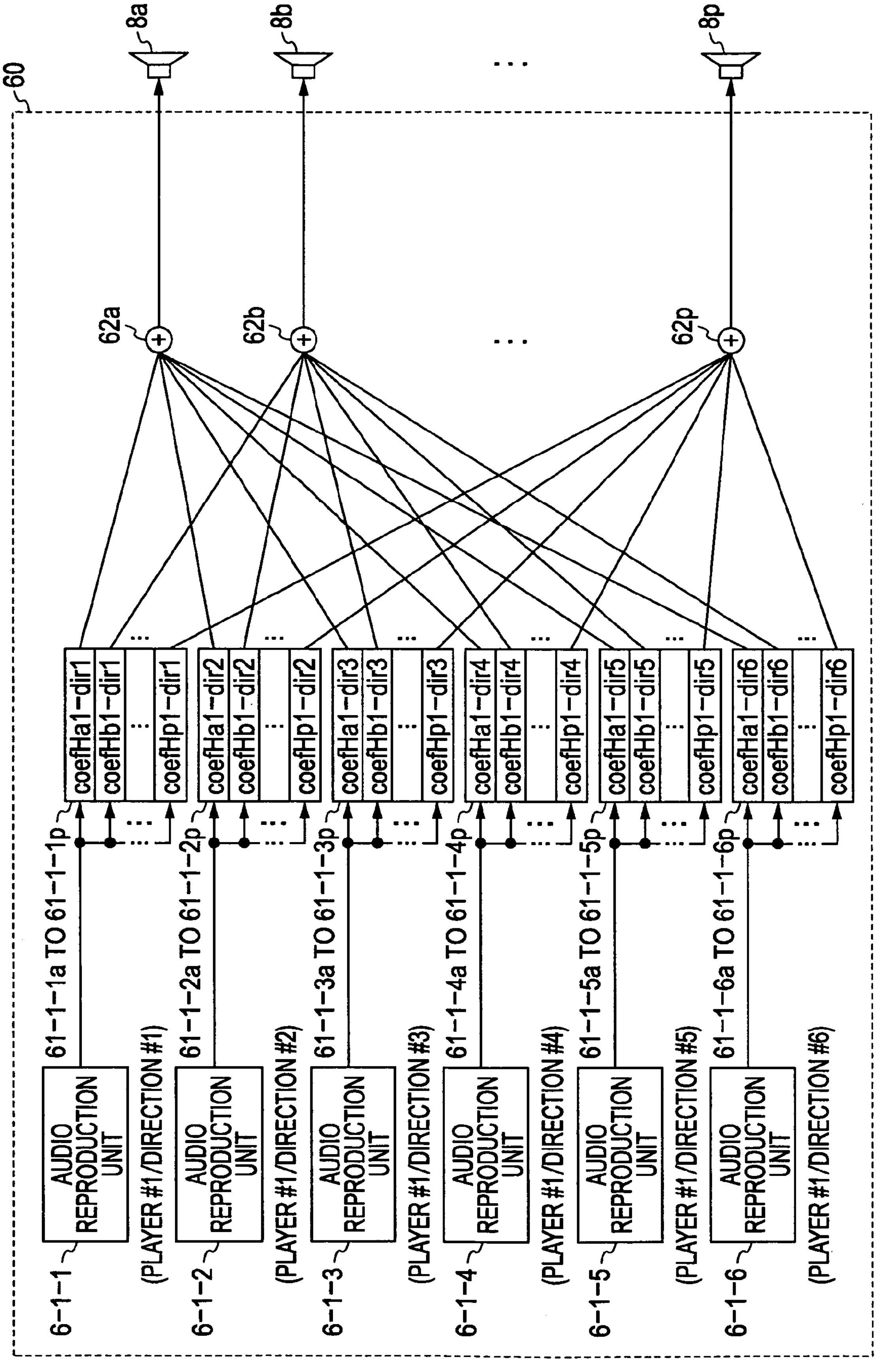
FIG. 28 is a block diagram showing a reproduction signal generator adapted to reproduce a sound field such that directivity of the sound sourer and sound emission characteristics in a plurality of directions are reproduced.

FIG. 28 shows a configuration of a reproduction signal generator 60 adapted to generate reproduction signals to reproduce a sound field such that the directivity of a sound source and sound emission characteristics in a plurality of directions are reproduced.

Although not shown in FIG. 28 for simplicity, the reproduction signal generator 60 also includes a part for generating composite transfer functions coefH to be set in respective calculation units 61, wherein this part may be configured in a similar manner to that shown in FIG. 22 (including coefH generators 30-1 to 30-4, the controller 40, the memory 38, and the operation unit 39).

The reproduction signal generator 60 is similar to that shown in FIG. 22 except that the number of positions are increased from four to six. Therefore, in order to supply composite transfer functions coefHa to coefHp to calculation units 61-1-1*a* to 61-1-1*p*, calculation units 61-1-2*a* to 61-1-2*p*, calculation units 61-1-3*a* to 61-1-3*p*, calculation units 61-1-4*a* to 61-1-4*p*, calculation units 61-1-5*a* to 61-1-5*p*, and calculation units 61-1-6*a* to 61-1-6*p*, the coefH generators 30 for use in the reproduction signal generator 60 shown in FIG. 28 must include additional coefH generators 30-5 and 30-6 in addition to the coefH generators 30-1, 30-2, 30-3, and 30-4 shown in FIG. 22.

In the memory 38, The controller 40 is configured so as to supply the transfer functions H and the transfer functions omniH associated with direction #1 to the coefH generator 30-1, the transfer functions H and the transfer functions omniH associated with direction #2 to the coefH generator 30-2, the transfer functions H and the transfer functions omniH associated with direction #3 to the coefH generator 30-3, the transfer functions H and the transfer functions omniH associated with direction #4 to the coefH generator 30-4, the transfer functions H and the transfer functions omniH associated with direction #5 to the coefH generator 30-5, and the transfer functions H and the transfer functions omniH associated with direction #6 to the coefH generator 30-6.

In FIG. 28, the audio signals recorded for the respective directions are reproduced by respective sound reproduction units 6. More specifically, the sound recorded by the recording microphone 57-1 oriented in direction #1 is reproduced by a sound reproduction unit 6-1-1 and the sound recorded by the recording microphone 57-2 oriented in direction #2 is reproduced by a sound reproduction unit 6-1-2. Similarly, the sounds recorded by the respective recording microphones 57-3, 57-4, 57-5, and 57-6 are reproduced by respective sound reproduction units 6-1-3, 6-1-4, 6-1-5, and 6-1-6.

Note that the reference numerals denoting the respective sound reproduction units are determined such that a numeral ("1" in this specific example) following a first hyphen indicates the position (position #1 in this specific example) at which the sound source 56 is placed (the sound source 56 is assumed to be placed at position #1 in this specific example). If the sound source 56 is placed, for example, at position #2, then "2" is put after the first hyphen. This notation rule will also be used elsewhere in the present description.

According to the composite transfer functions coefH generated for the respective directions, the audio signals recorded for the respective directions are processed by calculation units 61-1-1*a* to 61-1-1*p*, calculation units 61-1-2*a* to 61-1-2*p*, calculation units 61-1-3*a* to 61-1-3*p*, calculation units 61-1-4*a* to 61-1-4*p*, calculation units 61-1-5*a* to 61-1-5*p*, and calculation units 61-1-6*a* to 61-1-6*p*.

In the calculation units 61-1-1*a* to 61-1-1*p*, the composite transfer functions coefH (coefHa1-dir1 to coefHp1-dir1) are set which have been determined based on the result of the measurement made for the sound output from the measurement speaker 35 oriented in direction #1. The calculation units 61-1-1*a* to 61-1-1*p* process the audio signal supplied from the sound reproduction unit 6-1-1 in accordance with the composite transfer functions coefH set in the respective calculation units 61-1-1*a* to 61-1-1*p*. As a result, reproduction signals are obtained which will be output from the respective reproduction speakers 8*a* to 8*p* to reproduce the sound recorded in direction #1.

In the calculation units 61-1-2*a* to 61-1-2*p*, the composite transfer functions coefHa1-dir2 to coefHp1-dir2 are set. The calculation units 61-1-2*a* to 61-1-2*p* process the audio signal supplied from the sound reproduction unit 6-1-2 in accordance with the composite transfer functions coefH set in the respective calculation units 61-1-2*a* to 61-1-2*p*. As a result, reproduction signals are obtained which will be output from the respective reproduction speakers 8*a* to 8*p* to reproduce the sound recorded in direction #2.

Similarly, in the calculation units 61-1-3*a* to 61-1-3*p*, the calculation units 61-1-4*a* to 61-1-4*p*, the calculation units 61-1-5*a* to 61-1-5*p*, and the calculation units 61-1-6*a* to 61-1-6*p*, the composite transfer functions coefHa1-dir3 to coefHp1-dir3, the composite transfer functions coefHa1-dir4 to coefHp1-dir4, the composite transfer functions coefHa1-dir5 to coefHp1-dir5, and the composite transfer function coefHa1-dir6 to coefHp1-dir6 are respectively set, and these calculation units process the audio signal supplied from the respective sound reproduction units 6-1-3, 6-1-4, 6-1-5, and 6-1-6 in accordance with the composite transfer functions coefH set in the respective calculation units. As a result, reproduction signals to be output from the respective reproduction speakers 8*a* to 8*p* to reproduce the sound recorded in direction #3 are generated by the calculation units 61-1-3*a* to 61-1-3*p*, reproduction signals for reproducing the sound recorded in direction #4 are generated by the calculation units 61-1-4*a* to 61-1-4*p*, reproduction signals for reproducing the sound recorded in direction #5 are generated by the calculation units 61-1-5*a* to 61-1-5*p*, and reproduction signals for reproducing the sound recorded in direction #6 are generated by the calculation units 61-1-6*a* to 61-1-6*p*.

Adders 62*a*, 62*b*, . . . , 62*p* corresponding to the respective reproduction speakers 8*a*, 8*b*, . . . , 8*p* respective add together reproduction signals supplied from the calculation units 61 with the same subscripts as those of the adders 62*a*, 62*b*, . . . , 62*p*, and supply the resultant signals to the reproduction speakers 8 with the same subscript as those of the adders 62*a*, 62*b*, . . . , 62*p*.

Thus, as described above, the reproduction signals obtained for the respective directions are added together for each reproduction speaker 8 and output from corresponding reproduction speakers 8.

By using the reproduction signal generator 60 configured in the above-described manner, the recorded sounds can be reproduced in the reproduction environment 11 such that the sound recorded in direction #1 is reproduced so as to be emitted in direction #1 in the measurement environment 1, the sound recorded in direction #2 is reproduced so as to be emitted in direction #2 in the measurement environment 1, and so on.

Thus, in the region on the inner side of the first closed surface 10 in the reproduction environment 11, the virtual sound image is reproduced in a very realistic manner in the measurement environment 1 such that the directivity of the sound source and sound emission characteristics depending on the direction are reproduced.

In the above-described embodiment, by way of example, six recording microphones 57 each having directivity of 60° are used to define six directions, and composite transfer functions coefH are determined for the respective six directions. However, the number of recording microphones and the number of directions are not limited to six. For example, eighteen recording microphone 57 each having directivity of 20° may be used to define eighteen directions. In this case, the above-described measurement may be performed for each of these directions to determine transfer functions for each direction. Instead of performing the measurement for each of all defined directions, the measurement may be performed only for some of the defined directions to determined transfer functions for these some of the directions, and transfer functions for the remaining directions may be determined by means of calculation using interpolation from transfer functions for adjacent two directions. This allows a reduction in the number of times that the measurement is performed.

In the above-described embodiment, by way of example, the sound emitted from the sound source is recorded in a two-dimensional plane. Alternatively, for example, the sound may be recorded using microphones by which a sound source is three-dimensionally surrounded as shown in FIG. 29.

Figure 29:
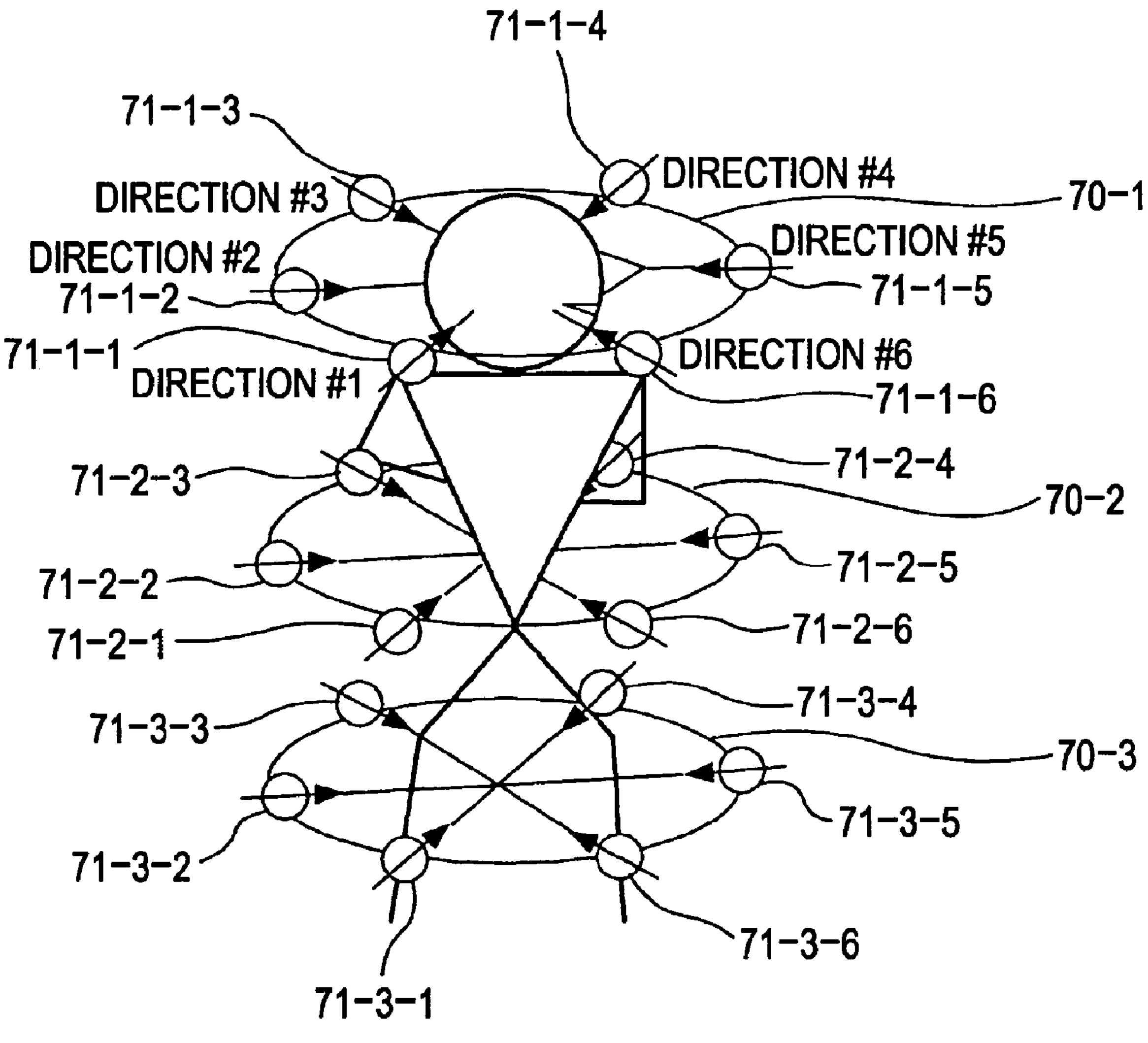
FIG. 29 is a schematic diagram showing a method of recording a sound by using microphones three-dimensionally surrounding a sound source.

In the example shown in FIG. 29, the sound source is surrounded by microphones placed cylindrically.

In this case, the cylinder is divided into three regions (a top region, a middle region, and a bottom region) by three circular planes, and a plurality of recording microphones 71 are placed in each circular plane as shown in FIG. 29.

In the example shown in FIG. 29, the top circular plane, the middle circular plane, and the bottom circular plane are respectively denoted by reference numerals 70-1, 70-2, and 70-3. The recording microphones 71 placed on the circumference of the top circular plane 70-1 are denoted by reference numeral 71-1, the recording microphones 71 placed on the circumference of the middle circular plane 70-2 are denoted by reference numeral 71-2, and the recording microphones 71 placed on the circumference of the bottom circular plane 70-3 are denoted by reference numeral 71-3.

A directional microphone with directivity of 60° is used as each of the recording microphones 71 placed in each circular plane, and six directions (#1 to #6) are defined. In a set of reference numerals plus hyphens denoting each recording microphone 71, a numeral following a second hyphen is used to denote a direction in which the recording microphone 71 is placed. For example, 71-1-2 denotes a recording microphone 71 placed in the top circular plane in direction #2, and 71-3-6 denotes a recording microphone 71 placed in the bottom circular plane in direction #6.

For example, if recording is performed using recording microphones 71 three-dimensionally surrounding a person, it is possible to record sounds emitted from a plurality of sound sources, such as a rustling sound of clothes, a sound generated by motion of hands, a sound of footsteps, etc., in addition to a voice such that information representing directivity of each sound source and sound emission characteristics depending on directions are also recorded.

To reproduce the recorded sound, reproduction speakers having the same directivity (60°) as that of microphones are placed in outward directions at geometrically similar positions to the positions of the microphones shown in FIG. 29, and the sounds recorded by the corresponding recording microphones 71 are output from the respective reproduction speakers. A listener can perceive as if the person were present in space surrounded by circumferences of circular planes 71-1 to 71-3.

Figure 30:
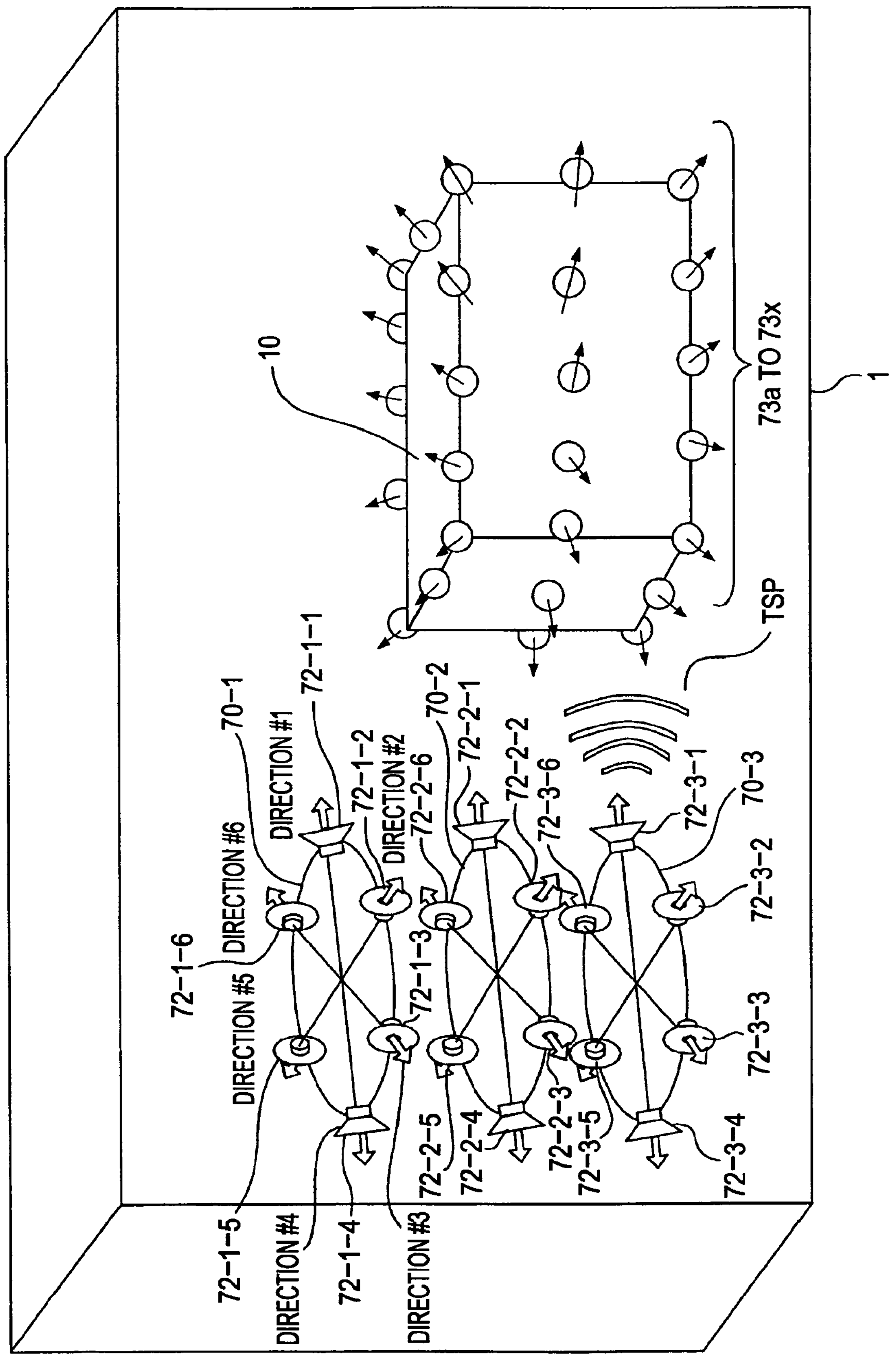
FIG. 30 is a schematic diagram showing a manner in which recording is performed in a measurement environment using microphones three-dimensionally surrounding a sound source.

FIG. 30 is a schematic diagram showing a manner in which measurement is performed in a measurement environment 1 to determine transfer functions used to three-dimensionally reproduce a sound source in a reproduction environment 11.

To achieve three-dimensional reproduction of a sound, a first closed surface 10 is defined three-dimensionally. In the specific example shown in FIG. 30, the first closed surface 10 is defined by faces of a rectangular parallelepiped. Measurement microphones are placed in outward direction on the first closed surface 10. In FIG. 30, these three-dimensionally placed measurement microphones are denoted by 73*a* to 73*x*. However, this does not necessarily mean that the number of measurement microphones is different from the number of measurement microphones two-dimensionally placed on the first closed surface 10 in previous embodiments, and the number of measurement microphones may be equal to that of measurement microphones (a to p) two-dimensionally placed on the first closed surface 10 in previous embodiments.

Although, unlike the first closed surface 10 employed in the previous embodiments, the first closed surface 10 used herein in the present embodiment is not a two-dimensional surface but of a three-dimensional surface, the same reference numeral (10) is used.

In the measurement, circular planes 70-1, 70-2, and 70-3 are defined in a region on the outer side of the first closed surface 10, and measurement speakers 72 are placed on these circular planes at similar positions and in similar directions to those employed in the recording. That is, the measurement speakers 72 are placed at geometrically similar positions to the positions of the recording microphones 71 shown in FIG. 29.

A directional speaker having directivity of 60° is used as each of the measurement speakers 72. To distinguish the measurement speakers 72 from each other, they are denoted by a combination of three numerals deliminated by a hyphen. A numeral following a first hyphen indicates a circular plane (70-1, 70-2, or 70-3) in which a measurement speaker is placed, and a numeral following a second hyphen indicates a direction (one of #1 to #6).

A measurement signal TSP supplied from a measurement signal reproduction unit 2 (not shown) is output separately from each measurement speaker 72, and impulse responses from the measurement speaker 72 to the respective measurement microphones 73*a* to 73*x* placed on the first closed surface 10 are measured to determine transfer functions H and transfer functions omniH.

Because there are as many measurement microphones 73 as x on the first closed surface 10 and there are as many measurement speakers 72 as 6×3=18, as many transfer functions (H and omniH) as 18×x are obtained in total.

In a reproduction environment 11, a first closed surface 10 in the form of a rectangular parallelepiped is defined so as to achieve consistency to the first closed surface 10 in the form of a rectangular parallelepiped used in the measurement environment 1, and reproduction speakers 8*a* to 8*x* are placed on the first closed surface 10 at positions geometrically similar to the positions of the measurement microphones 73 placed in the measurement environment 1.

A reproduction signal generator for generating reproduction signals to be output from the reproduction speakers 8*a* to 8*x* is configured in a basically similar manner to that shown in FIG. 28 except that there are a total of three systems for generating reproduction signals, each system including six sound reproduction units 6 and six sets of calculation units 61 (1*a* to 1*p*, 2*a* to 2*p*, . . . , 6*a* to 6*p*) so as to generate reproduction signals to be output from the respective reproduction speakers 8 by convoluting the respective recorded sound with the composite transfer functions coefH for respective directions (direction #1 to direction #6) in each circular plane 70.

In this case, because there are as many measurement microphones 73 as a to x, as many composite transfer functions coefH as coefHa to coefHx are generated for each measurement speaker 72. Therefore, each set includes as many calculation units 61 as coefHa to coefHx for each recorded sound. In order to adapt to as many reproduction speakers 8 as a to x, there are provided the same number of adders 62 (a to x) as the number of reproduction speakers 8. The respective adders 62 receive reproduction signals from the calculation units 61 with the same subscripts as the subscripts of the adders 62 and add together received reproduction signals. The resultant signals are supplied to the respective reproduction speakers 8 with the same subscripts as the subscripts of the adders 62.

As a result, reproduction signals are output from the respective reproduction speakers 8 thereby reproducing the sounds such that the sounds recorded by the respective recording microphones 71 are emitted in the corresponding directions on the corresponding circular planes 70-1, 70-2, and 70-3.

In the reproduction environment 11, a listener in the inside of the first closed surface 10 on which the reproduction speakers 8 are placed can perceive as if the person the sounds emitted from whom were recorded were present in the cylindrical space as the virtual sound image space in the measurement environment 1. In other words, the recorded sounds can be reproduced in the first closed surface 10 in the reproduction environment 11 as if the person the sounds emitted from whom were recorded were present in the cylindrical space as the virtual sound image space in the measurement environment 1.

The technique disclosed above can be advantageously applied to after-recording of an animation or CG. More specifically, for example, when a script is spoken by a voice artist, the spoken voice is recorded by microphones cylindrically surrounding the voice artist so that the recorded sound also includes a rustling sound of clothes, a sound of footsteps, etc. in addition to the voice. The measurement to determine the transfer functions is performed in the measurement environment 1 properly arranged in terms of the virtual sound positions and the position of the first closed surface 10 so as to adapt to scenes and characters.

This makes it possible to reproduce the recorded voice in the reproduction environment 11 as if the character were present in the cylindrical space set as the virtual sound image position.

Instead of cylindrically surrounding a sound source, the sound source may be surrounded spherically. In this case, recording microphones 71 are placed on a spherical surface at positions corresponding to arbitrary directions, the sound source is placed in space on the inner side of the sphere, and a sound emitted from the sound source is recorded by these recording microphones 71.

In this case, the measurement in the measurement environment 1 is performed such that measurement speakers 72 are placed at positions geometrically similar to the positions of the recording microphone 71 placed on the spherical surface, and impulse responses are measured in a similar manner as described above.

When the number of measurement microphones 73 is equal to the number of recording microphones 71 (that is, when the number of reproduction speakers 8 is equal to the number of measurement speakers 72, a reproduction signal generator for use in the present case may be configured in a similar manner to the configuration employed in the previous example.

In the example described above, a plurality of measurement speakers 72 are placed in the measurement of impulse responses. In the measurement of impulse responses in the measurement environment 1, instead of placing a plurality of measurement speakers 72, a single measurement speaker 72 may be used, and the position and the direction of the single measurement speaker 72 may be changed from one position to another on the circumference of the circular plane 70.

Also in this case, the transfer functions may be obtained with a less number of times the measurement is performed, if transfer functions are calculated by means of interpolation from transfer functions determined based on the actual measurement.

3-5. Addition of Ambience Data

To reproduce ambience in a live event or the like in a very realistic manner, it is desirable to add sounds (ambience) such as a cheer, clapping, etc. to musical sounds by players. A method of add ambience to achieve a realistic reproduced sound field is described below.

Figure 31:
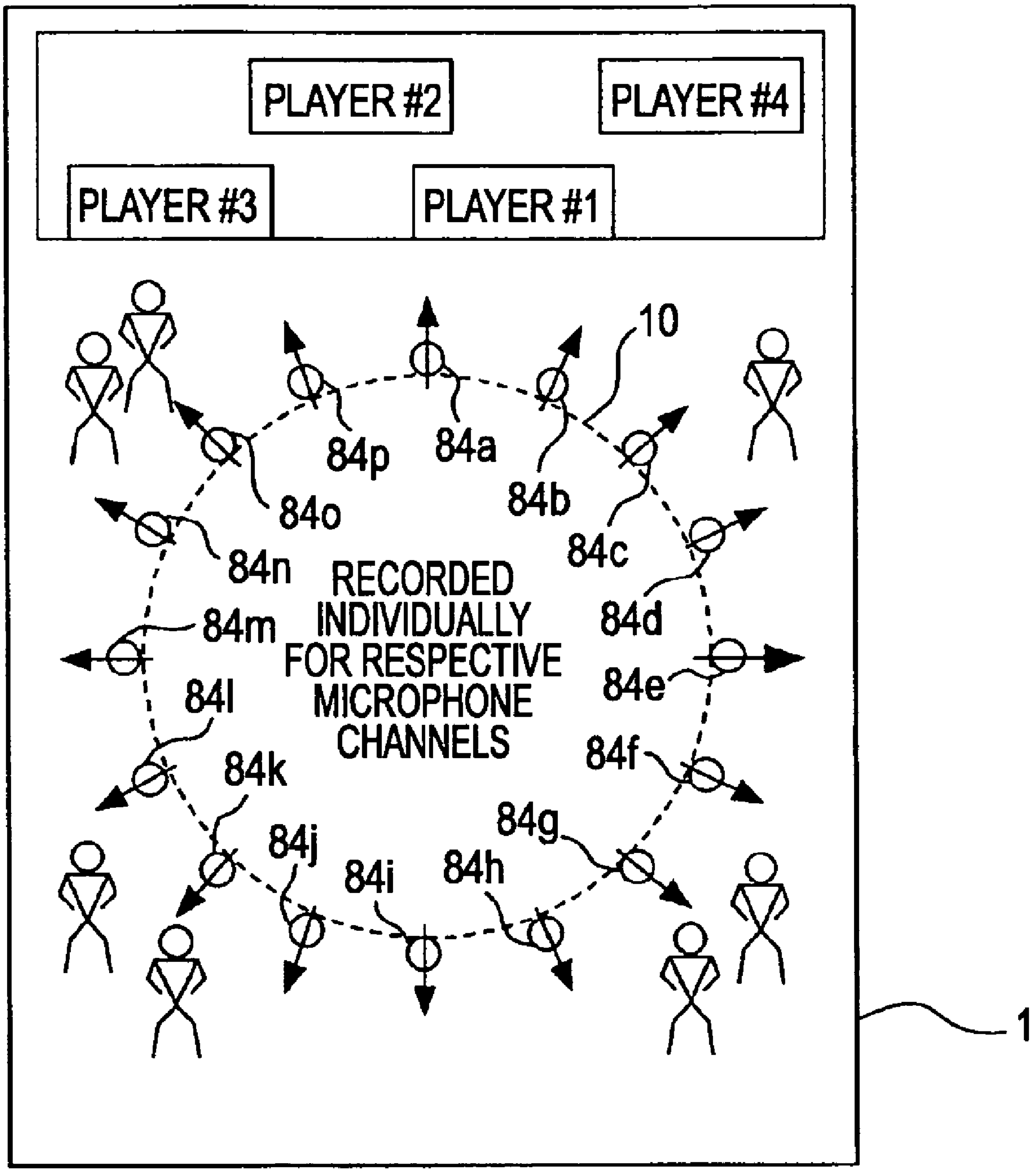
FIG. 31 is a schematic diagram illustrating a manner in which ambience is recorded in a measurement environment.

FIG. 31 is a schematic diagram illustrating a manner in which ambience is recorded in a measurement environment 1.

In this recording process, as many recording microphones 84*a* to 84*p* as those used in the measurement of impulse responses are placed on the first closed surface 10 at the same positions as the positions employed in the measurement of impulse responses. A directional microphone is used as each of the recording microphones 84*a* to 84*p*.

Although microphones placed on the respective positions on the first closed surface 10 in the same measurement environment 1 are denoted by different reference numerals for the recording microphones 84 and the measurement microphones 4, the same microphone may be used.

As shown in FIG. 31, a plurality of persons are placed as extras at proper positions in a region on the outer side of the first closed surface 10, and an ambience sound such as a cheer, clapping, etc. created by the extras is recorded by the recording microphones 84. Note that the resultant ambience sounds recorded by the recording microphones 84*a* to 84*p* include spatial information of the measurement environment 1. The ambience sounds recorded by the respective recording microphones 84*a*, 84*b*, . . . , 84*p* are respectively denoted as ambience-a, ambience-b, . . . , ambience-p.

In the reproduction environment 11, ambience-a, ambience-b, . . . , ambience-p, are output from the respective reproduction speakers 8*a*, 8*b*, . . . , 8*p* placed on the first closed surface 10. A listener present in space on the inner side of the first closed surface 10 can perceive that there is an audience in space on the outer side of the first closed surface 10 in the measurement environment 1.

Figure 32:
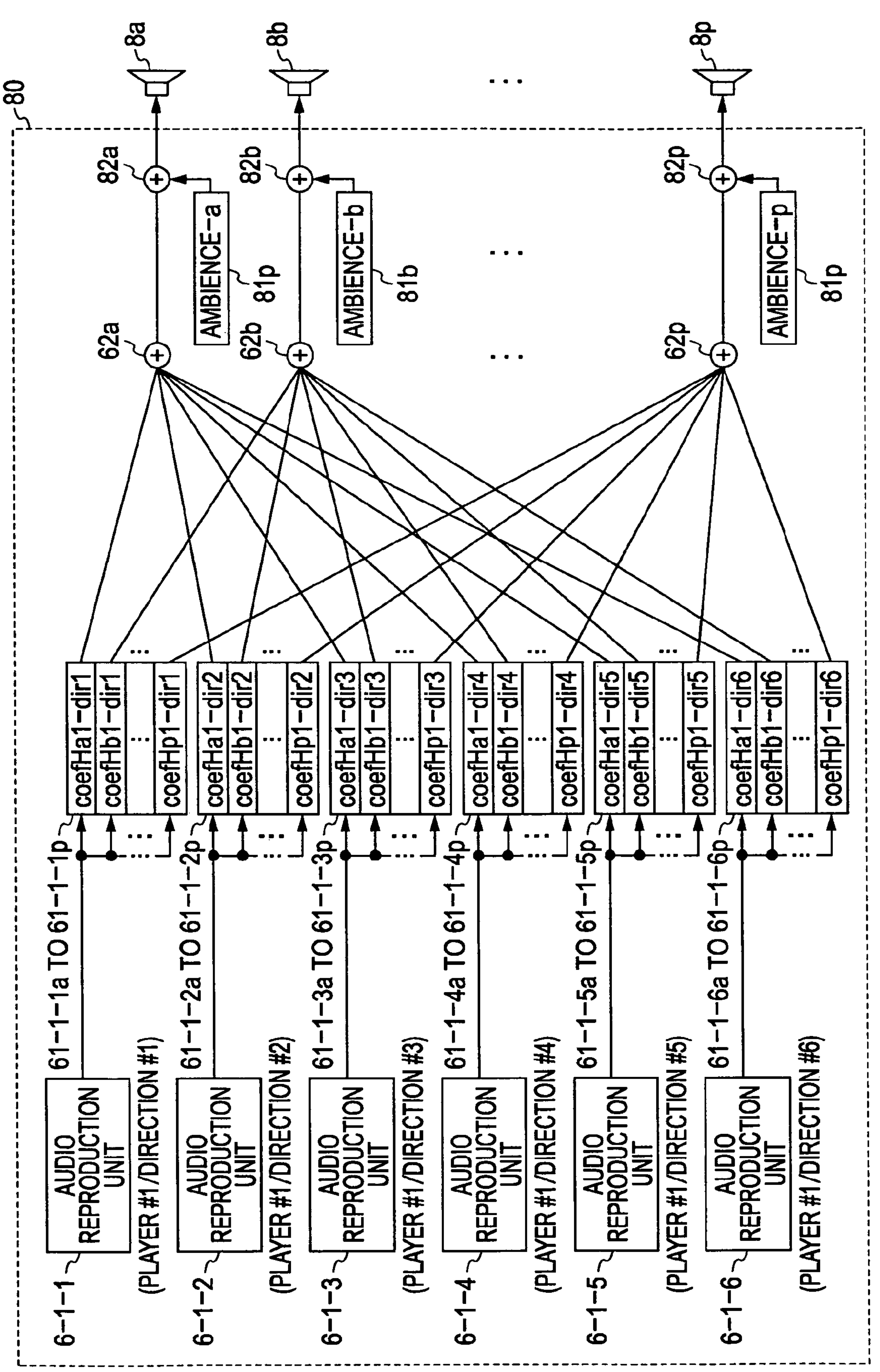
FIG. 32 is a block diagram showing a configuration of a reproduction signal generator adapted to reproduce a sound field using an ambience.

FIG. 32 shows a reproduction signal generator 80 adapted to add the ambience.

In the example shown in FIG. 32, the reproduction signal generator 80 is similar to the reproduction signal generator 28 (shown in FIG. 28) configured to reproduce a sound field taking into account the directivity of a sound source and sound emission characteristics in a plurality of directions except that the reproduction signal generator 80 is configured so as to be capable of adding ambience.

As shown in FIG. 32, ambience-a, ambience-b, . . . , ambience-p recorded in the measurement environment 1 are reproduced by respective reproduction unit 81*a*, 81*b*, . . . , 81*p*. Adders 82*a* to 82*p* are disposed between the respective adders 62*a* to 62*p* and the corresponding reproduction speakers 8*a* to 8*p*, ambience-a, ambience-b, . . . , ambience-p reproduced by respective reproduction unit 81*a*, 81*b*, . . . , 81*p* are supplied to the respective adders 82*a*, 82*b*, . . . , 82*p*.

Thus, ambience-a, ambience-b, . . . , ambience-p are added to the respective reproduction signals to be supplied to the respective reproduction speakers 8*a*, 8*b*, . . . , 8*p*. That is, ambience-a, ambience-b, . . . , ambience-p recorded by the recording microphones 84*a*, 84*b*, . . . , 84*p* in the measurement environment 1 are output into space on the inner side of the first closed surface 10 from the respective reproduction speakers 8*a*, 8*b*, . . . , 8*p* placed in the reproduction environment 11 at positions geometrically similar to the positions of the recording microphones 84*a*, 84*b*, . . . , 84*p*.

A listener present in the space on the inner side of the first closed surface 10 in the reproduction environment 11 can perceive that there is an audience in space on the outer side of the first closed surface 10 in the measurement environment 1. Thus, very realistic reproduction of the sound field is achieved.

In the above-described example, the technique to add ambience data is applied to the reproduction signal generator such as that shown in FIG. 28 originally configured to reproduce a sound field taking into account the directivity of a sound source and sound emission characteristics in a plurality of directions. Alternatively, the technique to add ambience data may be applied to the reproduction signal generator such as that shown in FIG. 12 originally configured to adjust sound quality. Also in this case, ambience-a, ambience-b, . . . , ambience-p may be simply added to reproduction signals to be supplied to the respective reproduction speakers 8*a*, 8*b*, . . . , 8*p*.

3-6. Reproduction of Sound Field Depending on Camera Viewpoint

In the previous embodiments, it is assumed that only a sound is reproduced in the reproduction environment 11. However, in practice, a content can be an AV (Audio Video) content, for example, of a live event of a certain artist. In this case, a recorded video image is reproduced in synchronization with an associated sound in the reproduction environment 11.

In many AV contents, the camera viewpoint (camera angle) is not fixed but changed so as to capture the image of the artist from various angles. In such a case in which the angle of the video image is changed, if the sound field is reproduced depending on the angle, presence is greatly enhanced.

Figure 33A:
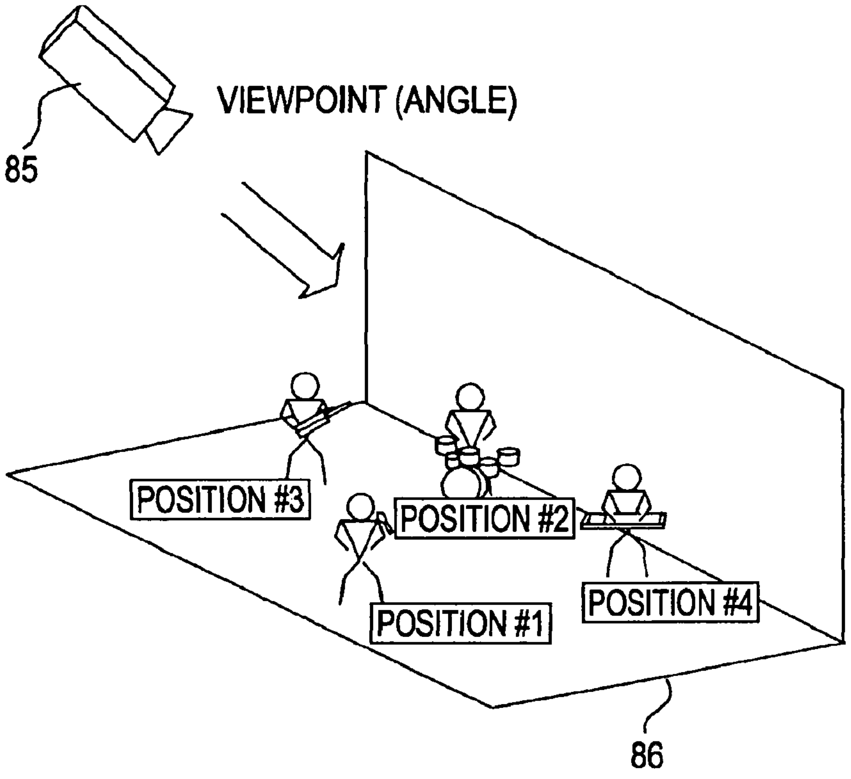
FIGS. 33A and 33B show a method of performing measurement in an measurement environment to reproduce a sound field depending on a camera angle.
Figure 33B:
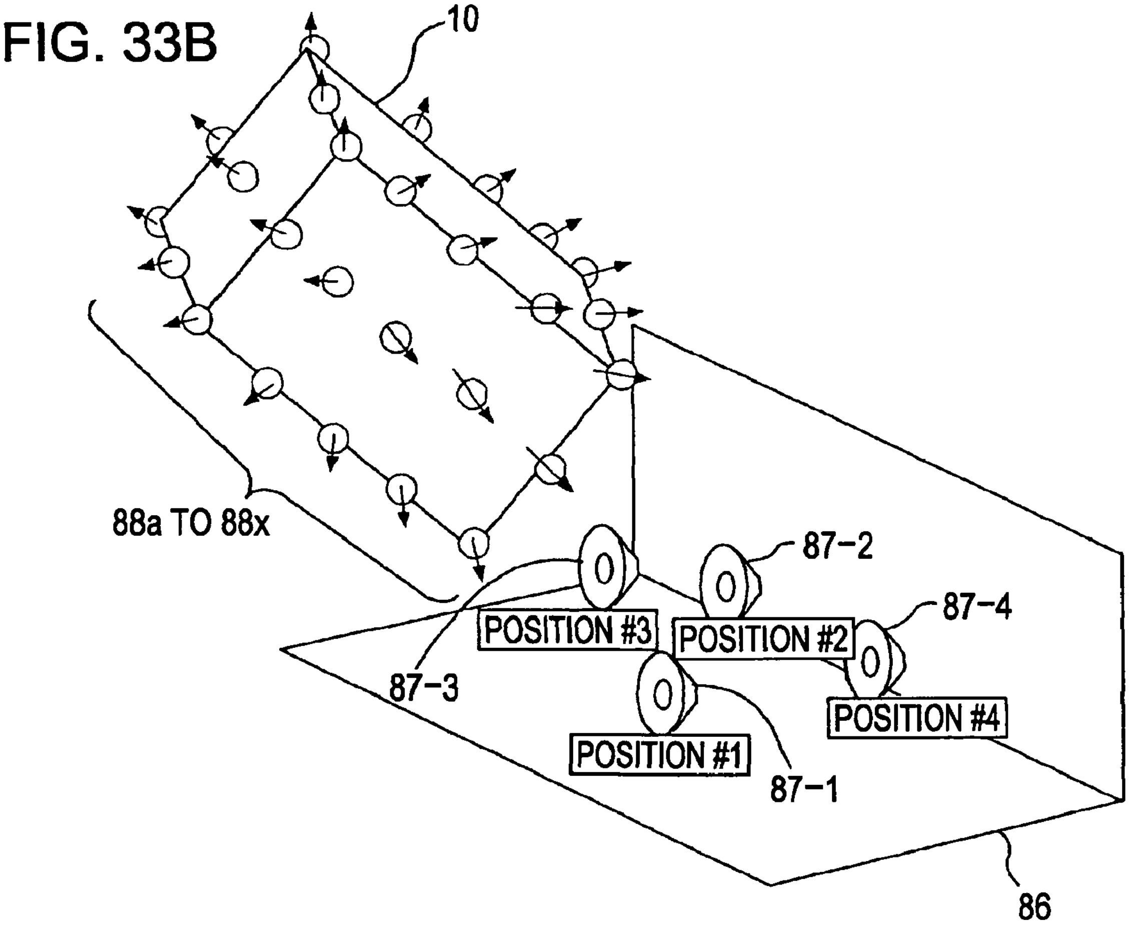

FIGS. 33A and 33B show a specific example of the technique.

FIG. 33A shows a manner in which a video content is recorded by a camera 85 for a live event performed in a measurement environment 1 such as a hall. FIG. 33B shows a manner in which measurement is performed depending on the camera angle. In this example, it is assumed that there are a plurality of players on a stage 86, and positions of these players are denoted by position #1 to position #4.

For example, as shown in FIG. 33A, when the camera 85 is capturing, from a certain angle, an image of artists on the stage 86, impulse responses are measured in the measurement environment 1 (the hall) shown in FIG. 23B for each position on the stage 86 using measurement microphones 88*a* to 88*x* placed so as to capture the stage 86 from the same angle as the camera angle.

In FIG. 33B, a first closed surface 10 similar to that shown in FIG. 30 is three-dimensionally defined in the measurement environment 1, and measurement microphone 88*a* to 88*x* are placed in a similar manner as in FIG. 30. The three-dimensional space defined by the first closed surface 10 is tilted at the same angle of the camera angle shown in FIG. 33A with respect to the stage 86. In this state, a measurement signal TSP is output separately from each of the respective measurement speakers 87 (87-1 to 87-4) placed at the respective positions, and impulse responses are measured for each of the measurement microphones 88.

As a result, as many transfer functions H and transfer functions omniH as x×4 corresponding to paths from the respective measurement speakers 87 to the respective measurement microphones 88 are determined.

In the reproduction in the reproduction environment 11, reproduction audio signals are convoluted with composite transfer functions coefH generated from the transfer functions H and transfer functions omniH depending on the angle of a scene, and resultant reproduction signals are output in the measurement environment 1 from the respective reproduction speakers 8*a* to 8*x* placed at positions geometrically similar to the positions of the measurement microphones 88*a* to 88*x*.

Thus, in the reproduction environment 11, an audience in space on the inner side of the first closed surface 10 surrounded by the reproduction speakers 8*a* to 8*x* perceives a sound field similar to the sound field actually perceived when the stage 86 is viewed at the same angle as the angle of the camera capturing the image of the stage 86 shown in FIG. 33A or 33B.

By reproducing the sound field in the above-described manner for various camera angles, it becomes possible for an audience to perceive the sound field in a very realistic manner depending on the angle of the camera capturing the image of the stage 86.

To this end, a set of transfer functions H and a set of transfer functions omniH are determined for each possible angle using the technique described above with reference to FIG. 33B, and information indicating the correspondence between the camera angle and the set of transfer functions H and information indicating the correspondence between the camera angle and the set of transfer functions omniH are produced.

Information indicating the camera angle for each scene is embedded, for example, as metadata in the video signal.

When the recorded video image and sound are reproduced, a set of transfer functions H and a set of transfer functions omniH corresponding to the angle are selected based on the angle information embedded in the video signal, the information indicating the corresponding between the angle and the set of transfer functions H, and a set of composite transfer functions coefH is generated from the selected set of transfer functions H and the set of transfer functions omniH. In accordance with the composite transfer functions coefH, the calculation units process the reproduction audio signals, and the resultant signals are output from the respective reproduction speakers 8*a* to 8*x*. Thus, the sounds are output while changing the direction of the sounds in synchronization with the camera angle, and thus an audience can perceive that the sounds come from the player playing on the stage 86.

The capability of controlling the direction of reproduced sound field depending on the camera angle can give great amusement to users.

In the above-described example, when the transfer functions H and transfer functions omniH are measured for each camera angle, the first closed surface 10 defined in the three-dimensional form is used. Instead, a first closed surface 10 defined in a two-dimensional form may be used.

In the example shown in FIG. 33B, the measurement speakers 87 are used as the measurement speakers for outputting the measurement signals TSP, and the measurement speakers 87 and the measurement microphones 88 are used as the measurement microphones placed on the first closed surface 10. Note that these are similar to the measurement speakers 35 or the measurement microphones 4 (or the measurement microphones 24).

4. Sound Field Reproduction System According to Embodiments

4-1. Example of System Configuration

Specific methods of realizing various functions of the sound field reproducing system and specific configurations of various parts according to embodiments of the invention thereof have been described above. Now, a method of realizing the total function and a total configuration of the sound field reproducing system are discussed below.

For simplicity, the direction of the sound source and the sound emission characteristics in a plurality of directions such as those described above with respect to FIGS. 27 to 30 are not taken into account in the following discussion. Furthermore, it is assumed that the system is not adapted to the stereo effector such as that described above with reference to FIGS. 25 and 26. Configurations for implementing also these capabilities will be discussed later.

Furthermore, it is also assumed that a sound is reproduced in a reproduction environment 20 such as a room of an ordinary house, and a configuration for reproducing a sound field on a second closed surface 14 will be discusses.

Furthermore, it is also assumed that three virtual sound image positions for player #1 to player #3 are defined, and six directions are defined as directions of directivity of a sound source for each position.

Furthermore, it is assumed that in the sound field reproducing system according to the present embodiment, an AV content including live video images and associated sounds is produced by recording various sounds and video images and transfer functions needed to reproduce the virtual sound image positions are measured at a producer, while the sound field is reproduced in an actual reproduction environment 11 at a user's place.

At the producer, the recorded video/audio data and transfer functions are recorded on a medium. At the user's place, a sound field is reproduced by a reproduction signal generator (described later) in accordance with the information recorded on the medium.

Figure 34:
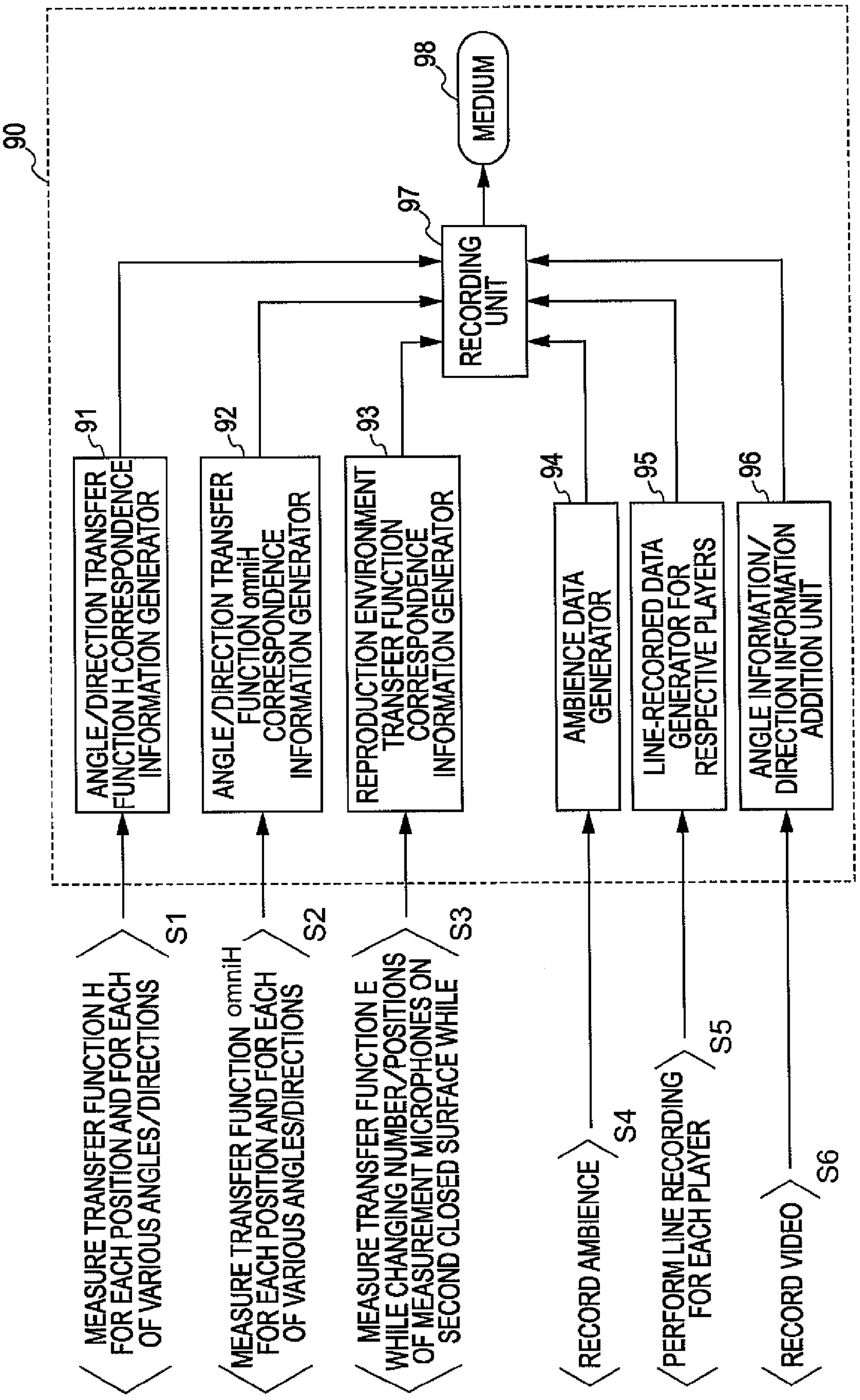
FIG. 34 shows a process performed by a producer in a sound field reproducing system and a configuration of a recording apparatus according to the embodiment of the present invention.

FIG. 34 shows a process performed at the producer and also shows a configuration of a recording apparatus 90 adapted to record the information obtained via the process on a medium 98.

The recording apparatus 90 includes an angle/direction-to-transfer function H correspondence information generator 91 for generating angle/direction-to-transfer function H correspondence information, an angle/direction-to-transfer function omniH correspondence information generator 92 for generating angle/direction-to-transfer function omniH correspondence information, a reproduction environment-to-transfer function correspondence information generator 93 for generating reproduction environment-to-transfer function correspondence information, an ambience data generator 94 for generating ambience data, and a line-recorded player-playing data 95 for generating line-recorded player-playing data, from information obtained via steps S1 to S5 shown in FIG. 34. The recording apparatus 90 also includes an angle information/direction designation information addition unit 96 for adding angle information/direction designation information to recorded video data obtained in step S6 shown in FIG. 34.

The recording apparatus 90 further includes a recording unit 97 for recording, on a medium such an optical disk 98, video data including angle information/direction designation information added thereto by the angle information/direction designation information addition unit 96 together with data generated by the angle/direction-to-transfer function H correspondence information generator 91, the data generated by angle/direction-to-transfer function omniH correspondence information generator 92, the data generated by the reproduction environment-to-transfer function correspondence information generator 93, and the data generated by the ambience data generator 94.

The recording apparatus 90 may be realized, for example, by a personal computer.

In FIG. 34, first, in step S1, transfer functions H are measured for each position and for each of possible angles/directions. This step is needed to obtain transfer functions H for controlling the directivity of a virtual sound image using the technique described above with reference to FIGS. 21 to 24 and for controlling the reproduction of a sound field depending on the camera angle using the technique described above with reference to FIGS. 33A and 33B.

In this step S1, directional speakers are placed as the measurement speakers 35 at respective positions (position #1 to position #3 in this specific example) selected as virtual sound image positions in the measurement environment 1 such as a hall, and a predetermined number of measurement microphone 88 (measurement microphones 4) are placed at predetermined positions on the first closed surface 10.

The measurement signal TSP is output from each measurement speaker 35 separately for each position and separately for each of various directions (direction #1, direction #2, . . . , direction #6) of the measurement speaker 35. On the other hand, the measurement of the impulse responses based on the measurement signals TSP detected by the respective measurement microphones 88 is performed separately for each of various possible camera angles and separately for each of various angles of the first closed surface 10 on which the measurement microphones 88 are placed as shown in FIG. 33B.

As a result, transfer functions H corresponding to the respective measurement microphones 88 are obtained for each position and for each direction/angle. That is, as many sets of transfer functions H corresponding to the respective measurement microphones 88 as number of positions × number of directions × assumed number of angles.

Herein, for simplicity, the number of measurement microphones 88 (measurement microphones 4) placed on the first closed surface 10 in the measurement environment 1 is not equal to a number corresponding to a to x shown in FIG. 33B but equal to a number corresponding to a to p.

Although it is assumed herein that one measurement speaker 35 is placed at each position, only one measurement speaker 35 may be used, and the measurement signal TSP may be output from this measurement speaker 35 while moving the measurement speaker 35 from one position to another.

Figure 36:
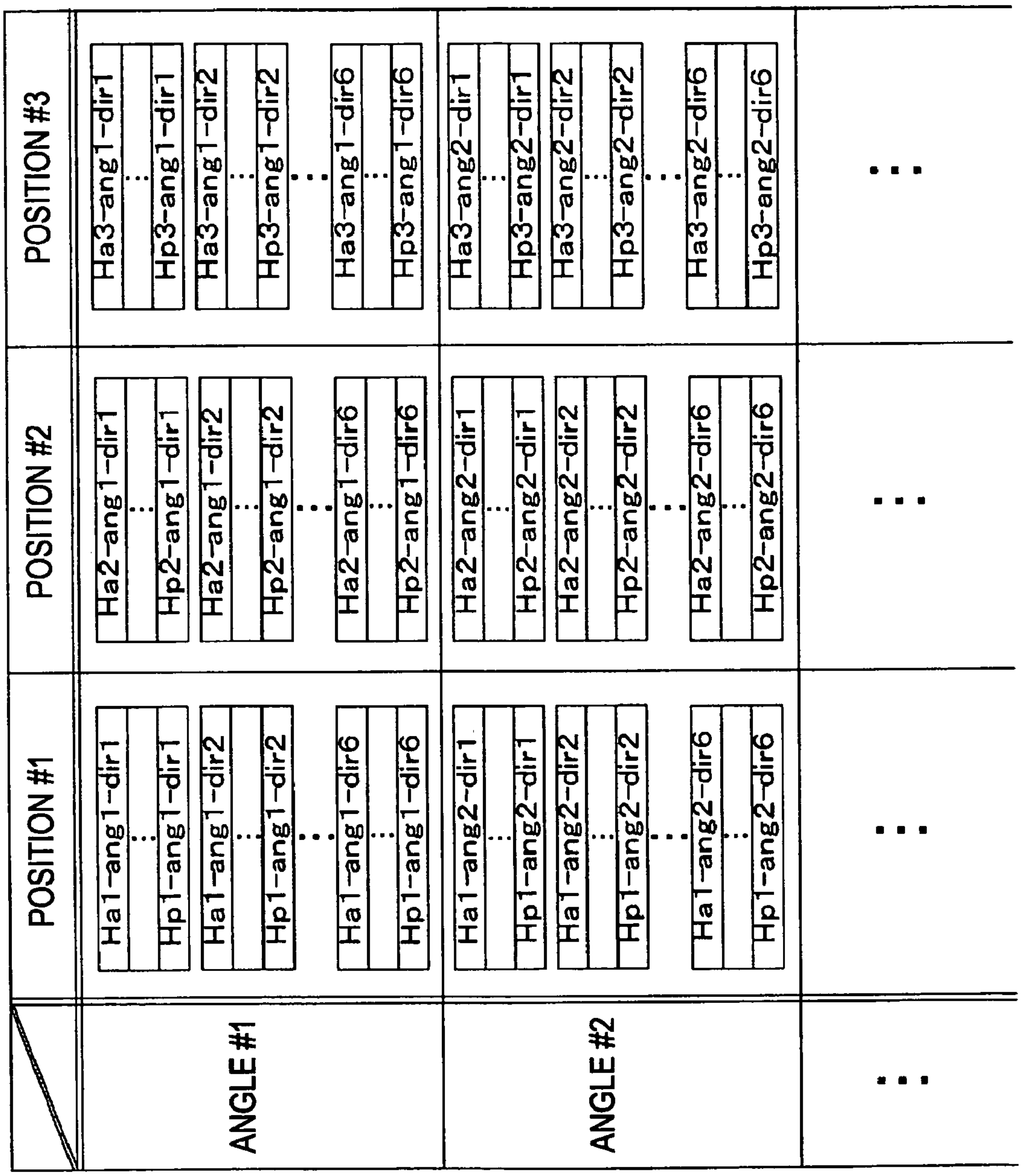
FIG. 36 shows an example of data structure of angle/direction-to-transfer function correspondence information associated with measurement-based directional transfer functions.

In the recording apparatus 90, the angle/direction-to-transfer function H correspondence information generator 91 generates angle/direction-to-transfer function H correspondence information such as that shown in FIG. 36 based on information associated with the respective transfer functions H obtained in step S1.

More specifically, as shown in FIG. 36, the generated angle/direction-to-transfer function H correspondence information indicates the correspondence of the transfer functions H obtained for the respective measurement microphone 88 with respect to the positions of the virtual sound images and the angles/directions.

In FIG. 36, the subscript (a to p) of each transfer function H indicates which one of the measurement microphones 88*a* to 88*p* the transfer function H corresponds to. A numeral following this subscript indicates the position. A numeral following "ang" indicates the angle, and a numeral following "dir" indicates the direction.

Referring again to FIG. 34, in step S2, transfer functions omniH are measured for each position and for each of possible angles/directions. In this step S2, the measurement is performed in a similar manner to step S1 described above except that omnidirectional measurement microphones 24 are used instead of the measurement microphones 88. As a result, transfer functions omniH are obtained for each position and for each of various directions/angles.

Figure 37:
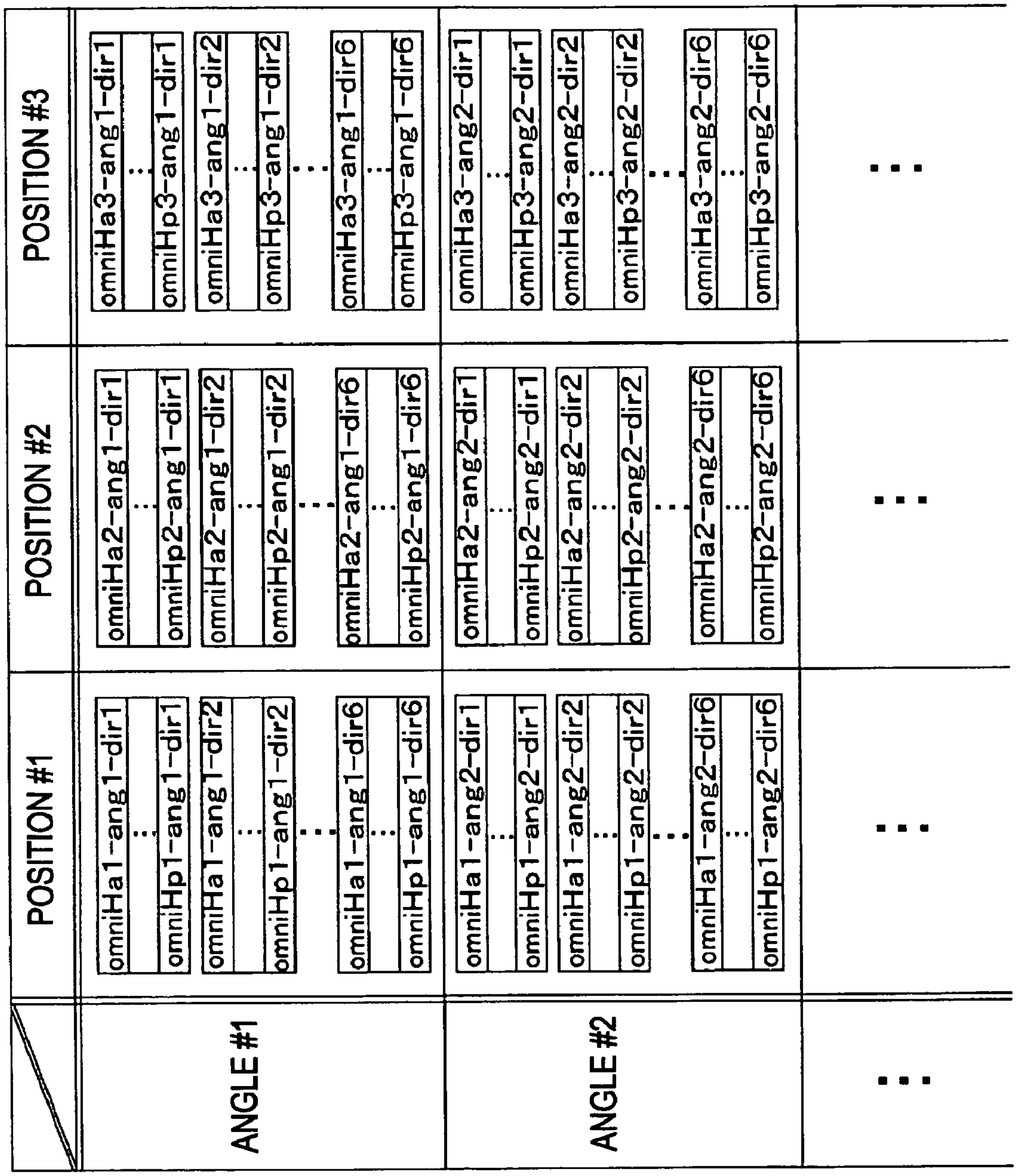
FIG. 37 shows an example of data structure of angle/direction-to-transfer function correspondence information associated with measurement-based omnidirectional transfer functions.

The angle/direction-to-transfer function omniH correspondence information generator 92 of recording apparatus 90 generates angle/direction-to-transfer function omniH correspondence information such as that shown in FIG. 37 based on each transfer function omniH obtained in step S2. In FIG. 37, the subscript (a to p) of each transfer function omniH indicates which one of the measurement microphones 24*a* to 24*p* the transfer function H corresponds to. A numeral following this subscript indicates the position. A numeral following "ang" indicates the angle, and a numeral following "dir", indicates the direction.

Referring again to FIG. 34, in step S3, transfer functions E are measured while changing the number/places of measurement microphones 13 on the second closed surfaces 14.

In this step S3, as in the example shown in FIG. 7, the reproduction speakers 8 are placed on the first closed surface 10 in the reproduction environment 11 such that they are placed at positions geometrically similar to the positions of the measurement microphones 88 (4 or 24) placed on the first closed surface 10 in the measurement environment 1. The impulse responses are measured based on the measurement signal TSP output separately from each reproduction speaker 8 while changing the number of positions/relative positions of the measurement microphone 13 placed on the second closed surface 14 in space on the inner side of the first closed surface 10 in the reproduction environment 11 so as to correctly correspond to the number of positions/relative positions of the reproduction speakers 18 to be used in the actual reproduction environment (reproduction environment 20). Thus, transfer functions E corresponding to the respective measurement microphones 13 are determined for each pattern in terms of number of positions/relative positions.

In this step S3, only a single measurement microphone 13 may be used, and the impulse response measurement may be performed while changing the position of the measurement microphone 13 on the second closed surface 14.

The reproduction environment-to-transfer function correspondence information generator 93 reproduction environment-to-transfer function correspondence information which relates the information of the transfer functions E obtained in step S3 for each number of positions/relative positions of the measurement microphone 13 to the information of the number of positions/relative positions.

In the next step S4, ambience data is recorded. That is, as shown in FIG. 31, persons are placed as extras at proper positions in a region on the outer side of the first closed surface 10 in the measurement environment 1, an ambience sound such as a cheer, clapping, etc. generated by the extras is recorded using the recording microphones 84 placed at positions similar to the positions of the respective measurement speaker 88 placed, in step S1, on the first closed surface 10.

As described above, when ambience sounds are recorded, the recording microphones 84 must be placed at the same positions as the positions of the measurement microphones 88 used in the measurement of the impulse responses. That is, it is needed to use the same number of recording microphones 84 as the number of measurement microphones 88, and it is needed to place the recording microphones 84 at the same positions as the positions of the measurement microphones 88 used in the measurement.

Because the measurement microphones 88*a* to 88*p* are used as the measurement microphones 88 as described above, the recording microphones 84*a* to 84*p* are used as the recording microphones 84. Although the measurement microphones and the recording microphones are denoted by different reference numerals, the same microphones may be used for both measurement microphones and recording microphones.

The ambience data generator 94 generates ambience data based on the ambience sound signals recorded in step S4. More specifically, in this specific example, ambience data including ambience-a to ambience-p recorded by the respective recording microphones 84*a* to 84*p* is generated.

In step S5, line-recording is performed for each player. For example, when an instrument played by a player is an electric instrument, an audio signal output in the form of an electric signal is recorded. For instruments such as a drum or a vocal other than electric instruments, recording is performed using a microphone placed close to a sound source.

The line-recorded data generator 95 assigned to each player generates a line-recorded data based on the sound recorded in step S5. In this specific example, line-recorded data of player #1 to #3 are respectively generated from line-recorded audio signals of player #1 to player #3.

In step S6, video data is recorded. More specifically, video images of an event held in the measurement environment 1 such as a hall are recorded using a video camera.

The angle information/direction designation information addition unit 96 adds, to the video data recorded in step S6, angle information specifying transfer functions H and transfer functions omniH to be selected depending on the angle, and direction designation information specifying transfer functions H and transfer functions omniH to be selected depending on the direction for each player, wherein the angle designation information and the direction designation information are added in the form of meta data.

In practice, the angle information is generated according to a determination made by a human operator as to the camera angle for respective scenes while reproducing the recorded video data. The angle information/direction designation information addition unit 96 adds angle information to the recorded video data in accordance with the determination as to the angle of the respective scenes. The direction designation information is also determined by a human operator. When the human operator examines the recorded video data while reproducing it, if the human operator finds a scene in which a player, for example, turns around, the human operator generates the direction designation information so as to specify the direction of directivity in synchronization with the movement of the player. The angle information/direction designation information addition unit 96 adds the direction designation information determined in such a manner to the recorded video data such that the added direction designation information specifies the direction for that scene.

The recording unit 97 records, on the medium 98, the data generated by the angle/direction-to-transfer function H correspondence information generator 91, the data generated by angle/direction-to-transfer function omniH correspondence information generator 92, the reproduction environment-to-transfer function correspondence information generator 93, the ambience data generator 94, and the line-recorded player-playing data 95, together with the video data including the angle information/direction designation information added by the angle information/direction designation information addition unit 96.

In this recording process, the ambience data including a plurality of sound signals ambience-a to ambience-p is recorded on the medium 98 such that these sound signals are recorded separately on different tracks. Similarly, line-recorded player-playing data is also recorded such that data is recorded separately on different tracks depending on players.

Note that step numbers shown in FIG. 34 doe not necessarily indicate the order in which to perform the steps.

Figure 35:
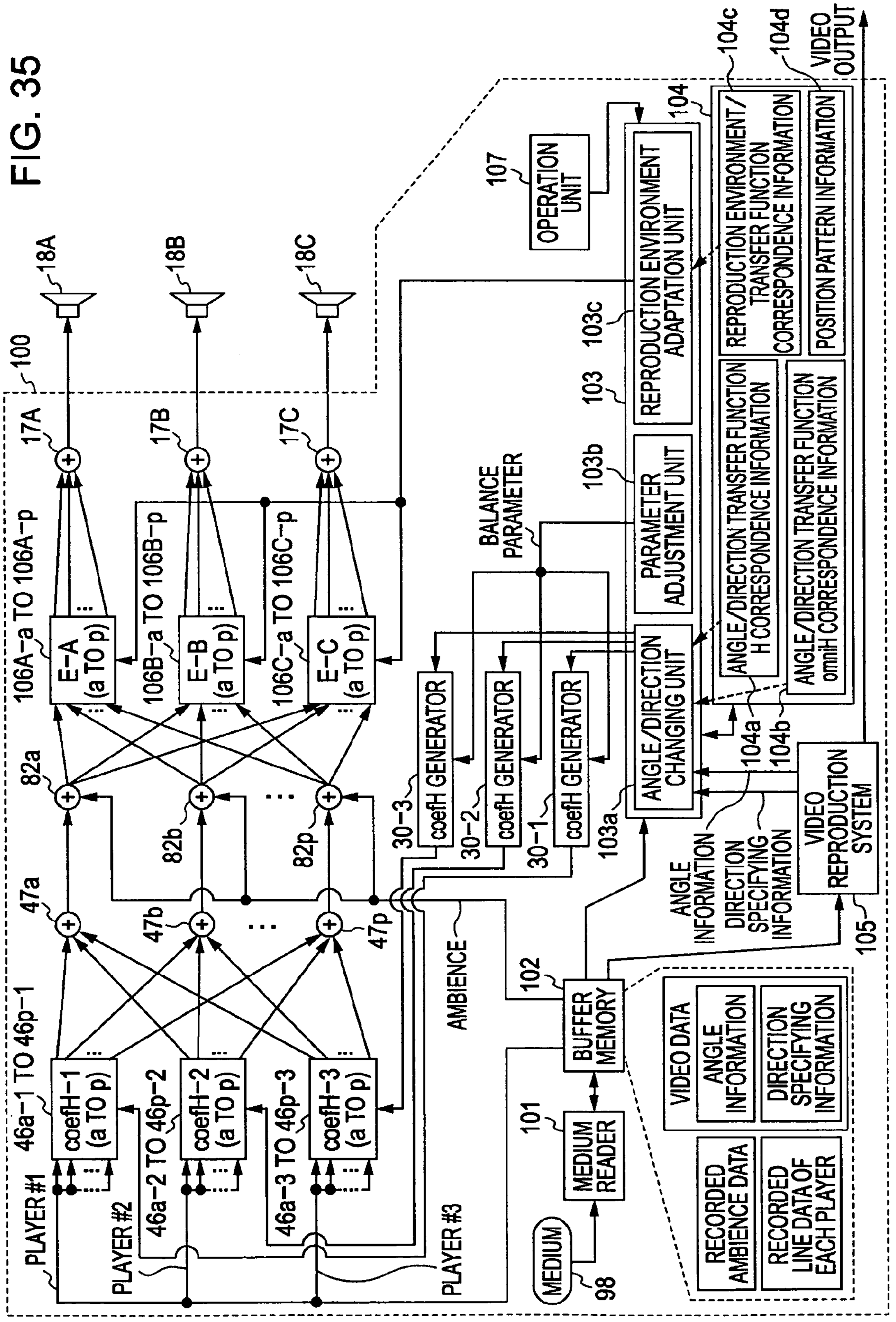
FIG. 35 is a block diagram showing a configuration of a reproduction signal generator in a sound field reproducing system according to an embodiment of the present invention.

FIG. 35 shows a configuration of a reproduction signal generator 100 adapted to generate reproduction signals used to reproduce a sound field in the reproduction environment 20 at a user's place.

Although not shown in the figures, the reproduction environment 20 is similar to the reproduction environment 20 shown in FIG. 9 except that three reproduction speakers 18A, 18B, and 18C are placed on the second closed surface 14 instead of five reproduction speakers 18. In the present example, it is assumed that there are three positions (position #1, position #2, and position #3) as virtual sound image positions. That is, there are three virtual sound images each similar to the measurement speaker 3 represented by phantom lines in FIG. 9.

In the present embodiment, in the reproduction environment 20, a display for displaying the video image of the AV content recorded on the medium 98 is placed at a proper position in the same space on the inner or outer side (as seen by a listener (audience)) of the second closed surface 14 as the space in which the virtual sound images are formed. By placing the display in the same space as the space in which the virtual sound images are formed, it becomes possible to reproduce the sound and the video image such that the position of each player on the screen of the display coincides with the position of the corresponding virtual sound image. This allows an audience to feel that sounds are emitted from the positions of the respective players.

Note that the display is not shown in FIG. 35.

As shown in FIG. 35, the reproduction signal generator 100 includes calculation units 46*a*-1 to 46*p*-1, calculation units 46*a*-2 to 46*p*-2, and calculation units 46*a*-3 to 46*p*-3. These calculation units are similar to those described above with reference to FIG. 22. However, unlike the reproduction signal generator 37 shown in FIG. 22 in which there are four calculation units to adapt to four players, the present reproduction signal generator 100 includes three calculation units corresponding to three players.

The reproduction signal generator 100 also includes a coefH generator 30-1, a coefH generator 30-2, and a coefH generator 30-3 for generating composite transfer functions coefH to be respectively set in the calculation units 46*a*-1 to 46*p*-1, the calculation units 46*a*-2 to 46*p*-2, and the calculation units 46*a*-3 to 46*p*-3. In contrast to the configuration shown in FIG. 22 in which there are four coefH generators 30 corresponding to four players, the present reproduction signal generator 100 has three coefH generators 30 corresponding to three players.

A controller 103 (described later) supplies the transfer functions H and the transfer functions omniH corresponding to the respective positions to the respective coefH generators 30-1, 30-2, and 30-2. In response, the coefH generators 30-1, 30-2, and 30-2 generate composite transfer functions coefH by adding the transfer functions H, the transfer functions omniH, and the delay-based transfer functions dryH.

In the notation of coefH generators, a symbol following a hyphen denotes the position. For example, the coefH generator 30-1 receives the transfer functions H and the transfer functions omniH corresponding to position #1 and generates composite transfer functions coefH corresponding to position #1. The generated composite transfer functions coefH are set in the calculation units 46*a*-1 to 46*p*-1.

The coefH generator 30-2 receives the transfer functions H and the transfer functions omniH corresponding to position #2 and generates composite transfer functions coefH corresponding to position #2. The generated composite transfer functions coefH are set in the calculation units 46*a*-2 to 46*p*-2. The coefH generator 30-3 receives the transfer functions H and the transfer functions omniH corresponding to position #3 and generates composite transfer functions coefH corresponding to position #3. The generated composite transfer functions coefH are set in the calculation units 46*a*-3 to 46*p*-3.

Adders 47*a* to 47*p* are disposed at a stage after the calculation units 46*a*-1 to 46*p*-1, the calculation units 46*a*-2 to 46*p*-2, and the calculation units 46*a*-3 to 46*p*-3 in which the corresponding composite transfer functions coefH are set in the above-described manner. These adders 47*a* to 47*p*, as with the adders shown in FIG. 22, add together signals supplied from the respective calculation units 46 with the same subscript as the subscript of the adders. As a result, reproduction signals corresponding to the respective reproduction speakers 8*a* to 8*p* placed on the first closed surface 10.

The reproduction signal generator 100 further includes adders 82*a* to 82*p* corresponding one-to-one to the adders 47*a* to 47*p*. These adders 82*a* to 82*p* are similar to those shown in FIG. 32, and are used to add ambience signals to the main audio signals.

At a subsequent stage, calculation units 106A-a to 106A-p, calculation units 106B-a to 106B-p, and calculation units 106C-a to 106C-p are disposed.

In these calculation units 106, the transfer functions E from the respective reproduction speakers 8*a* to 8*p* placed on the first closed surface 10 to the respective measurement microphone 13 placed on the second closed surface 14 are set, as with those shown in FIG. 8. The controller 103 supplies the corresponding transfer functions E to the respective calculation units 106 to adjust the reproduction environment so as to adapt to the number of positions/relative positions of the reproduction speakers 18 on the second closed surface 14.

The signals output from the adders 82*a* to 82*p* are respectively supplied to the calculation units 106A-a to 106A-p, the calculation units 106B-a to 106B-p, and the calculation units 106C-a to 106C-p having the same subscripts as those of the adders (a to p) The respective calculation units process the received signals in accordance with the transfer functions E set therein.

As a result, the calculation units 106A-a to 106A-p output reproduction signals (SHEA-a to SHEA-p) corresponding to sound paths from the respective reproduction speakers 8*a* to 8*p* on the first closed surface 10 to the measurement microphone 13A (the reproduction speaker 18A) on second closed surface 14 in the reproduction environment 11. The calculation units 106B-a to 106B-p output reproduction signals (SHEB-a to SHEB-p) corresponding to sound paths from the respective reproduction speakers 8*a* to 8*p* to the reproduction speaker 18B. The calculation units 106C-a to 106C-p output reproduction signals (SHEC-a to SHEC-p) corresponding to sound paths from the respective reproduction speakers 8*a* to 8*p* to the reproduction speaker 18C.

Adders 17A, 17B, and 17C are similar to those shown in FIG. 8 and one adder is disposed for each of the reproduction speakers 18 (18A, 18B, and 18C in this specific example) placed on the second closed surface 14 The adder 17A receives signals output from the respective calculation units 106A-a to 106A-p and adds together the received signals. The resultant signal is supplied to the reproduction speaker 18A. The adder 17B receives signals output from the respective calculation units 106B-a to 106B-p and adds together the received signals. The resultant signal is supplied to the reproduction speaker 18B. The adder 17C receives signals output from the respective calculation units 106C-a to 106C-p and adds together the received signals. The resultant signal is supplied to the reproduction speaker 18C.

The reproduction signal generator 100 includes a section for reproducing various kinds of information recorded on the medium 98 performing control operation in accordance with the read information. More specifically, the section includes a medium reader 101, a buffer memory 102, a controller 103, a memory 104, a video reproduction system 105, and an operation unit 107.

The medium reader 101 reads various kinds of information recorded on the medium 98 mounted on the reproduction signal generator 100 and supplies the read information to the buffer memory 102. Under the control of the controller 103, the buffer memory 102 stores the read data for the purpose of buffering and reads the stored data.

The controller 103 includes a microcomputer and is responsible for control over the entire reproduction signal generator 100. The memory 104 generically denotes storage devices such as ROM, RAM, a hard disk, etc. included in the controller 103. Although not shown in the figure, various controls programs are stored in the memory 104, and the controller 103 performs various kinds of control operations in accordance with the control programs.

As described above with reference to FIG. 34, video data is recorded on the medium 98, wherein the video data includes the angle/direction-to-transfer function H correspondence information, the angle/direction-to-transfer function omniH correspondence information, the reproduction environment-to-transfer function correspondence information, the recorded ambience data, the line-recorded player-playing data, and the angle/direction designation information.

The controller 103 reads, via the medium reader 101, the angle/direction-to-transfer function H correspondence information, the angle/direction-to-transfer function omniH correspondence information, and the reproduction environment-to-transfer function correspondence information, and stores them in the memory 104 as the angle/direction-to-transfer function H correspondence information 104*a*, the angle/direction-to-transfer function omniH correspondence information 104*b*, and the reproduction environment-to-transfer function correspondence information 104*c*.

The controller 103 also reads, via the medium reader 101, the recorded ambience data, the line-recorded player-playing data, and the video data including embedded angle information and direction designation information, and stores them in the buffer memory 102 for the purpose of buffering.

As shown in the figure, the recorded ambience data including ambience-a, ambience-b, . . . , ambience-p is read from the buffer memory 102 and supplied to the adders 82*a*, 82*b*, . . . , 82*p* described above.

As for the line-recorded player-playing data, the recorded sound signal of player #1, the recorded sound signal of player #2, and the recorded sound signal of player #3 are respectively supplied to the calculation units 46*a*-1 to 46*p*-1, the calculation units 46*a*-2 to 46*p*-2, and the calculation units 46*a*-3 to 46*p*-3.

The video data including the embedded angle information and direction designation information is supplied to the video reproduction system 105.

The buffer memory 102 is used as a buffer for all data recorded on the medium 98, such as the recorded ambience data, the line-recorded player-playing data, and the video data including embedded angle information and direction designation information. The controller 103 may be configured to control the buffer memory 102 so as to continuously supply these buffered data to the corresponding parts.

However, in practice, it takes a very long time to read all data from the medium 98 and buffer the read data in the buffer memory. To avoid the above problem, the controller 103 may control the reading operation of the buffer memory 102 such that a required amount of data is read at a time from the medium 98 and sequentially supplied to various parts.

The video reproduction system 105 generically denotes a video data reproduction system including a compression/decompression decoder, an error correction processing unit, etc. The video reproduction system 105 performs a reproduction process on the video data supplied from the buffer memory 102, using the compression/decompression decoder, the error correction processing unit, etc., thereby generating a video signal used to display a video image on the display (not shown) placed in the reproduction environment 20. The generated video signal is supplied as output video signal to the display.

The video reproduction system 105 is also configured so as to be capable of extracting the angle information and the direction designation information included in the form of metadata in the video data and supplies the extracted data to the controller 103.

The controller 103 includes an angle/direction changing unit 103*a* adapted to, in accordance with the angle information and the direction designation information supplied from the video reproduction system 105, extract the transfer functions H and the transfer functions omniH to be supplied to the coefH generators 30-1, 30-2, and 30-3 from the angle/direction-to-transfer function H correspondence information 104*a* and the angle/direction-to-transfer function omniH correspondence information 104*b* stored in the memory 104.

More specifically, the angle/direction changing unit 103*a* extracts the transfer functions H and the transfer functions omniH specified by the input angle information and direction designation information from the angle/direction-to-transfer function H correspondence information 104*a*, and the angle/direction-to-transfer function omniH correspondence information 104*b* stored in the memory 104 and sets the extracted transfer functions H and the transfer functions omniH in the corresponding coefH generators 30.

For example, when the angle information specifies "angle #1", the direction designation information specifies direction #1 for player #1 (position #1), direction #2 for player #2 (position #2), and direction #6 for player #3 (position #3), the angle/direction changing unit 103*a* extracts, from the angle/direction-to-transfer function H correspondence information 104*a* and the angle/direction-to-transfer function omniH correspondence information 104*b*, Ha1-ang1-dir1 to Hp1-ang1-dir1 and omniHa1-ang1-dir1 to omniHp1-ang1-dir1 for player #1, Ha2-ang1-dir2 to Hp2-ang1-dir2 and omniHa2-ang1-dir2 to omniHp2-ang1-dir2 for player #2, Ha3-ang1-dir6 to Hp3-ang1-dir6 and omniHa3-ang1-dir6 to omniHp3-ang1-dir6 for player #3, and the angle/direction changing unit 103*a* supplies Ha1-ang1-dir1 to Hp1-ang1-dir1 and omniHa1-ang1-dir1 to omniHp1-ang1-dir1 to the coefH generator 30-1, Ha2-ang1-dir2 to Hp2-ang1-dir2 and omniHa2-ang1-dir2 to omniHp2-ang1-dir2 to the coefH generator 30-2, and Ha3-ang1-dir6 to Hp3-ang1-dir6 and omniHa3-ang1-dir6 to omniHp3-ang1-dir6 to the coefH generator 30-3.

As a result of such operation performed by the angle/direction changing unit 103, the composite transfer functions coefH set in the respective calculation units 46*a*-1 to 46*p*-1, calculation units 46*a*-2 to 46*p*-2, and calculation units 46*a*-3 to 46*p*-3 are changed each time a new angle/direction is specified by the angle information and the direction designation information, the composite transfer functions coefH set in the respective calculation units are replaced with the composite transfer functions coefH corresponding to newly specified angle/direction. This makes it possible to control the direction of directivity of a reproduced sound field and of a specified player in synchronization with a change in angle.

Note that the angle/direction changing unit 103*a* may be implemented in the form of a program module executed by the controller 103. This also holds to a parameter adjustment unit 103*b* and a reproduction environment adjustment unit 103*c* described below.

The controller 103 includes the parameter adjustment unit 103*b* adapted to, in accordance with a command issued via the operation unit 107, individually adjust the balance parameters set in the balance parameter setting units (21*a* to 21*p*, 22*a* to 22*p*, and 32*a* to 32*p*) in the coefH generators 30-1, 30-2, and 30-3.

To this end, the operation unit 107 has control knobs for adjusting the parameters associated with the respective balance parameter setting units so as to allow a user to specify the balance parameter values to be set in the respective balance parameter setting units. The adjustment of the balance parameters may be performed using an operation panel displayed on the screen of the display (not shown). In this case, a pointing device such as a mouse is used as the operation unit 107. A user is allowed to operate the mouse to move a cursor on the screen to drag a control knob icon for adjusting the parameter displayed on the operation panel so as to specify the balance parameter value to be set in the balance parameter setting unit.

The parameter adjustment unit 103*b* adjusts the values of the balance parameters to be set in the respective balance parameter setting units in accordance with a command input via the operation unit 107.

In FIG. 35, for the purpose of simplicity, the controller 103 is connected to the respective coefH generators 30 via only one control line. However, actually, the controller 103 is connected to the balance parameter setting units (21*a* to 21*p*, 22*a* to 22*p*, and 32*a* to 32*p*) and the respective coefH generators 30 so that the controller 103 can individually supply a balance parameter value to each balance parameter setting unit.

By making adjustment using the parameter adjustment unit 103*b*, it is possible to adjust the sound quality differently depending on regions in which the speakers 8 are placed on the first closed surface 10. For example, the transfer functions dryH may be increased in a particular region to enhance the sharpness of a sound image, while the transfer functions omniH may be increased in another region to increase the amount of reverberation. Because the sound field reproduced by the speakers 8 placed on the first closed surface 10 is also reproduced in the region surrounded by the reproduction speakers 18 placed on the second closed surface 14, a listener in the space on the inner side of the second closed surface 14 can also perceive effects of similar quality adjustment. In the case of the example shown in FIG. 17B, listener in the space on the inner side of the second closed surface 14 perceives that the sharpness of the sound image is enhanced in the front region while the amount of reverberation is increased in the rear region.

The controller 103 also includes a reproduction environment adjustment unit 103*c* for adjusting the reproduction environment by setting the transfer functions E so as to adapt to the actual number of positions/relative positions of the reproduction speakers 18 based on the reproduction environment-to-transfer function correspondence information 104*c* stored in the memory 104 and based on the placement pattern information 104*d* also stored in the memory 104.

The placement pattern information 104*d* is information indicating a pattern in terms of number of positions/relative positions of the reproduction speakers 18 to which the reproduction signal generator 100 is configured so as to be adaptable. Based on the pattern of the number of positions/relative positions indicated by the placement pattern information 104*d*, the reproduction environment adjustment unit 103*c* extracts transfer functions E (Ea-A to Ep-A, Ea-B to Ep-B, and Ea-C to Ep-C) corresponding to the pattern from the reproduction environment-to-transfer function correspondence information 104*c*, and sets the extracted transfer functions E in the corresponding calculation units 106.

As a result, the transfer functions E corresponding to the actual number of positions/relative positions of the reproduction speakers 18 in the reproduction environment 20 are set in the respective calculation units 106, and thus the sound field is correctly reproduced by these reproduction speakers 18 placed in the reproduction environment 20.

When the reproduction signal generator 100 is adaptable to a plurality of patterns of number of positions/relative positions, another control knob or the like may be provided on the operation unit 107 so that a user is allowed to select a desired pattern from the plurality of patterns.

As described above, in the present sound field reproduction system, the directivity of a sound source and sound emission characteristics in a plurality of directions are not taken into account, and the present sound field reproduction system is not adaptable to a stereo effector. To configure sound field reproduction system so as to have such capabilities, the recording apparatus 90 and the reproduction signal generator 100 are added to the system. This configuration is described in further detail below.

Herein, by way of example, it is assumed that control of the directivity of the sound source and the sound emission characteristics in a plurality of directions is performed only for player #1, and it is also assumed that line-recorded data of player #2 is input via a stereo effector.

In this case, at a producer, in step S5, the sound is recorded using recording microphones 57 placed so as to surround player #1 in six directions (direction #1 to direction #6) as described above with reference to FIG. 27. The line-recorded data of player #2 is input to the recording apparatus 90 via the stereo effector.

In this case, the line-recorded data generators 95 corresponding to respective players operate as follows. For player #1, six recorded data respectively corresponding to the six directions (direction #1 to direction #6) are generated. For player #2, two recorded data Lch and Rch are generated. The recording unit 97 records these data on the medium 98.

In order to adapt to process six recorded data of player #1 corresponding to six directions (direction #1 to direction #6), the reproduction signal generator 100 is configured so as to have additional calculation units 46*a*-1-1 to 46*p*-1-1 for processing the recorded data of player #1 corresponding to direction #1, calculation units 46*a*-1-2 to 46*p*-1-2 for processing the recorded data of player #1 corresponding to direction #2, calculation units 46*a*-1-3 to 46*p*-1-3 for processing the recorded data corresponding to direction #3, calculation units 46*a*-1-4 to 46*p*-1-4 for processing the recorded data corresponding to direction #4, calculation units 46*a*-1-5 to 46*p*-1-5 for processing the recorded data corresponding to direction #5, and calculation units 46*a*-1-6 to 46*p*-1-6 for processing the recorded data corresponding to direction #6.

Furthermore, the reproduction signal generator 100 is configured so as to include, as coefH generators 30-1 for player #1, six coefH generators 30-1-1, 30-1-2, 30-1-3, 30-1-4, 30-1-5, and 30-1-6 for generating composite transfer functions coefH to be set in the respective calculation units 46*a*-1-1 to 46*p*-1-1, the calculation units 46*a*-1-2 to 46*p*-1-2, the calculation units 46*a*-1-3 to 46*p*-1-3, the calculation units 46*a*-1-4 to 46*p*-1-4, the calculation units 46*a*-1-5 to 46*p*-1-5, and the calculation units 46*a*-1-6 to 46*p*-1-6.

In this case, the reproduction signal generator 100 is configured such that the composite transfer functions coefH set in the calculation units 46*a*-1-1 to 46*p*-1-1, the calculation units 46*a*-1-2 to 46*p*-1-2, the calculation units 46*a*-1-3 to 46*p*-1-3, the calculation units 46*a*-1-4 to 46*p*-1-4, the calculation units 46*a*-1-5 to 46*p*-1-5, and the calculation units 46*a*-1-6 to 46*p*-1-6 are changeable only in accordance with the angle information. In other words, the composite transfer functions coefH are always set in the calculation units such that -dir1" is set in the calculation units 46*a*-1-1 to 46*p*-1-1, -dir2" is set in the calculation units 46*a*-1-2 to 46*p*-1-2, -dir3" is set in the calculation units 46*a*-1-3 to 46*p*-1-3, -dir4" is set in the calculation units 46*a*-1-4 to 46*p*-1-4, -dir5" is set in the calculation units 46*a*-1-5 to 46*p*-1-5, and -dir6" is set in the calculation units 46*a*-1-6 to 46*p*-1-6.

For the above purpose, the angle/direction changing unit 103*a* in the controller 103 is adapted to select transfer functions H and transfer functions omniH associated with an angle specified by angle information from transfer functions H and transfer functions omniH with subscripts "-dir1", "-dir2", "-dir3", "-dir4", "-dir5", and "-dir6 "and supply the selected transfer functions H and transfer functions omniH to the coefH generators 30-1-1, 30-1-2, 30-1-3, 30-1-4, 30-1-5, and 30-1-6.

The signals output from the calculation units 46*a*-1-1 to 46*p*-1-1, the signals output from the calculation unit 46*a*-1-2 to 46*p*-1-2, the signals output from the calculation unit 46*a*-1-3 to 46*p*-1-3, the signals output from the calculation unit 46*a*-1-4 to 46*p*-1-4, the signals output from the calculation unit 46*a*-1-5 to 46*p*-1-5, and the signals output from the calculation unit 46*a*-1-6 to 46*p*-1-6 are supplied to the adders 47 with the same subscripts (a to p) as the subscripts of the calculation units.

As for the calculation units 46 for processing recorded data of player #2, there are provided two sets of calculation units 46 (a to p) one set of which is for Lch and the other set is for Rch. More specifically, calculation units 46*a*-2-L to 46*p*-2-L are for Lch and calculation units 46*a*-2-R to 46*p*-2-R are for Rch. Furthermore, as coefH generators 30-2 for player #2, there are provided coefH generators 30-2-L and 30-2-R for generating composite transfer functions coefH to be set in the calculation units 46*a*-2-L to 46*p*-2-L and the calculation units 46*a*-2-R to 46*p*-2-R.

For these coefH generators 30-2-L and 30-2-R, the angle/direction changing unit 103*a* changes the transfer functions H and the transfer functions omniH only in accordance with the angle information. For example, as described above with reference to FIG. 25, for example, when direction #2 is assigned to Lch and direction #6 is assigned to Rch, the transfer functions H and the transfer functions omniH are set in the coefH generators such that -dir2" is set in the coefH generator 30-2-L and -dir6" is set in the coefH generator 30-2-R. Correspondingly, as for the composite transfer functions coefH set in the calculation units 46*a*-2-L to 46*p*-2-L and the calculation units 46*a*-2-R to 46*p*-2-R,"-dir2 " and "-dir6" are respectively set and composite transfer functions coefH are changed in accordance with the angle information.

The signals output from the calculation units 46*a*-2-L to 46*p*-2-L and the signals output from the calculation units 46*a*-2-R to 46*p*-2-R are supplied to the adders 47 with the same subscripts (a to p) as the subscripts of the calculation units.

In the sound field reproducing system according to the present embodiment described above with reference to FIGS. 34 to 37, it is assumed that the producer sells the medium 98 on which various kinds of information needed to reproduce a sound field are recorded, and the sound field is reproduced at the user's place in accordance with the information recorded on the medium 98.

Instead of supplying such information needed to reproduce a sound field via the medium 98, the information may be supplied to the user via a network.

In this case, an information processing apparatus is disposed at the producer to store/retain various kinds of information needed to reproduce the sound field on a particular storage medium and transmit the stored information to an external device via a network On the other hand, the reproduction signal generator 100 at the user's place is configured to be capable of performing data communication via the network.

The capability of providing various kinds of information needed to reproduce sound fields via a network makes it possible for the producer to provide the information to the user's place in real time. This makes it possible to even reproduce, in the reproduction environment 20, a sound field in the measurement environment 1 in real time.

In the above description, it is assumed that the reproduction signals to be output from the respective reproduction speaker 18 are generated at the user's place (by the reproduction signal generator 100). Alternatively, the producer (the recording apparatus 90) may include an apparatus such as that shown in FIG. 35 for generating reproduction signals. In this case, the reproduction signals to be output from the respective reproduction speakers 18 are recorded on the medium 98, and the user is allowed to reproduce the sound field only by reproducing the reproduction signals recorded on the medium 98.

This allows it to configure the apparatus at the user in a simpler form. However, the producer has to produce and sell as many types of media 98 as there are patterns of the number of positions/relative positions of the reproduction speakers 18 predicted to be employed in the actual reproduction environment 20.

In contrast, in the sound field reproducing system according to the present embodiment described above, the producer needs to produce only one type medium 98, thus high efficiency is achieved.

In the explanation with reference to FIGS. 34 and 35, it is assumed that the angle/direction-to-transfer function correspondence information and the reproduction environment-to-transfer function correspondence information are recorded on the medium 98 together with the recorded data and video data of respective players. Alternatively, only recorded data and video data of respective players are recorded on the medium 98, while the angle/direction-to-transfer function correspondence information and the reproduction environment-to-transfer function correspondence information are provided via a network. That is, of the information needed to reproduce a sound field, some or all information may be provided via a network.

In particular, as for the reproduction environment-to-transfer function correspondence information, only information set in the calculation units 106 are necessary and any other information is unnecessary. In view of the above, the reproduction environment-to-transfer function correspondence information may be stored in a particular server on a network. When a user wants to reproduce a sound field, the user first access this server and downloads transfer functions E corresponding to the pattern of the number of positions/relative positions of the reproduction speakers 18.

This allows a reduction in the data size of information recorded on the medium 98. Besides, it becomes unnecessary for the reproduction signal generator 100 to store unnecessary information. That is, it becomes unnecessary to perform useless reading operation, and thus a reduction in the processing load imposed on the controller 103 is achieved.

In the system shown in FIG. 35, it is assumed that the calculation units 46, the coefH generators 30, the adders 47, the adders 82, the calculation units 106, and the adder 17 are implemented by hardware. Alternatively, some or all of these parts may be implemented in the form of program module executed by the controller 103.

Furthermore, in the system shown in FIG. 35, the reproduction signal generator 100 has the medium reader for reading the medium 98. Alternatively, the information recorded on the medium 98 may be externally read and input to the reproduction signal generator 100. Once the information has been input, the reproduction signal generator 100 may operate in a similar manner as described above in accordance with the input information.

In the embodiments described above, an optical disk is used as the medium 98. Alternatively, other types of disk media (magnetic disk such as a hard disk, a magnetooptical disk, etc.) or a storage media other than disk media, such as a semiconductor memory, may be used.

In the embodiments described above, in the reproduction signal generator, composite transfer functions coefH are generated by adding respective transfer functions (H, omniH, and dryH) and then the reproduction signals are processed in accordance with the generated composite transfer functions coefH. Alternatively, the reproduction signals may be convoluted with the respective transfer functions (H, omniH, and dryH) separately, the balance parameters may be applied to the convoluted reproduction signals, and the resultant signals may be added together for each of the reproduction speakers 8*a* to 8*p*. This also allows the sound field to be reproduced in a similar manner to the above-described embodiment.

Note that when the reproduction signals are convoluted with the respective transfer functions separately, the signals finally obtained by adding the separately convoluted signals for each of reproduction speakers 8*a* to 8*p* are equivalent to the signals obtained by convoluting the reproduction signals with the composite transfer functions.

The present invention has been described above with reference to specific embodiments. However, the present invention is not limited to details of these embodiments.

For example, in the embodiments described above, the present invention is applied to the reproduction of a sound field in a system adapted to reproduce a sound in a room of an ordinary house or in a film live hall. Alternatively, the present invention may be applied to other types of systems adapted to reproduce a sound, such as a car audio system. The present invention is also useful to realize an amusement apparatus capable of giving high presence and high reality to a user or a virtual reality apparatus such as a game machine.

It should be understood by those skilled in the art that various modifications, combinations, sub-combinations and alterations may occur depending on design requirements and other factors insofar as they are within the scope of the appended claims or the equivalents thereof.

What is claimed is:

1. An audio signal processing method comprising:

emitting at least one sound at a virtual sound image location in a space outside a first closed surface;

generating a set of directional transfer functions, each one of the directional transfer functions based on a result of a directional measurement of the at least one sound emitted at the virtual sound image location and detected at a selected one of a plurality of positions on the first closed surface using at least one directional microphone oriented outward;

generating a corresponding set of omnidirectional transfer functions, each one of the omnidirectional transfer functions based on a result of an omnidirectional measurement of the at least one sound emitted at the virtual sound image location and detected at a corresponding one of the plurality of positions on the first closed surface using at least one omnidirectional microphone oriented outward, wherein for a corresponding omnidirectional transfer function of the set of omnidirectional transfer functions the corresponding one of the plurality of positions is the same location as the selected one of a plurality of positions; and generating a set of first composite transfer functions by adding, at a specified ratio and in correspondence for each one of the plurality of positions on the first closed surface, one of the directional transfer functions to a corresponding one of the omnidirectional transfer functions.

2. The method of claim 1, further comprising generating first reproduction audio signals corresponding to each of the plurality of positions on the first closed surface by performing a calculation process on an input audio signal in accordance with the set of first composite transfer functions.

3. The method of claim 2, further comprising:

outputting the first reproduction audio signals from audio speakers placed at positions geometrically similar to the plurality of positions on the first closed surface.

4. The method of claim 1, further comprising:

generating a set of delay-based transfer functions, each one of the delay-based transfer functions comprising information indicating sound delay times and sound levels extracted from one of the directional transfer functions; and adding, at a specified ratio and in correspondence for each one of the plurality of positions on the first closed surface, one of the delay-based transfer functions to a corresponding one of the first composite transfer functions.

5. The method of claim 1, wherein the specified ratio for one position of the plurality of positions on the first closed surface differs from at least one other specified ratio for at least one other position of the plurality of positions on the first closed surface.

6. The method of claim 1, wherein the emitting at least one sound comprises emitting sound in accordance with a time stretched pulse.

7. The method of claim 1, wherein the emitting at least one sound comprises emitting sound by a directional speaker.

8. The method of claim 1, further comprising:

emitting sounds from sound sources placed at positions geometrically similar to the plurality of positions on the first closed surface;

measuring the emitted sounds at a plurality of positions on a second closed surface located in a space inside the first closed surface; and generating a set of secondary transfer functions corresponding to paths from the sound sources to the plurality of positions on the second closed surface, based on the measuring of the emitted sounds.

9. The method of claim 8, further comprising:

generating first reproduction audio signals corresponding to each of the plurality of positions on the first closed surface by performing a calculation process on an input audio signal in accordance with the set of first composite transfer functions;

generating second reproduction audio signals corresponding to each of the plurality of positions on the second closed surface by performing a calculation process on the first reproduction audio signals in accordance with the set of secondary transfer functions; and outputting the second reproduction audio signals from reproduction speakers placed at positions geometrically similar to the plurality of positions on the second closed surface.

10. The method of claim 9, wherein the emitting sounds from sound sources includes emitting sound in accordance with a time stretched pulse.

11. The method of claim 10, wherein the act of emitting at least one sound further comprises emitting at least one sound by a directional speaker oriented in one of a plurality of directions and the emitting at least one sound is performed individually for each of the plurality of directions;

the act of generating a set of directional transfer functions further comprises generating one set of directional transfer functions for each of the plurality of directions;

the act of generating a corresponding set of omnidirectional transfer functions further comprises generating one set of corresponding omnidirectional transfer functions for each of the plurality of directions; and the act of generating a set of first composite transfer functions further comprises adding a selected set of directional transfer functions to a selected set of omnidirectional transfer functions wherein one function of the selected set of directional transfer functions is added at a specified ratio to one function of the selected set of omnidirectional transfer functions.

12. The method of claim 10, wherein the act of emitting at least one sound further comprises emitting at least one sound by a directional speaker oriented in one of two directions and the emitting at least one sound is performed individually for each of the two directions;

the act of generating a set of directional transfer functions further comprises generating two sets of directional transfer functions, one set for each of the two directions;

the act of generating a corresponding set of omnidirectional transfer functions further comprises generating two sets of corresponding omnidirectional transfer functions, one set for each of the two directions; and the act of generating a set of first composite transfer functions further comprises adding a first of the two sets of directional transfer functions to a first of the two sets of omnidirectional transfer functions to produce a first set of composite transfer functions and adding a second of the two sets of directional transfer functions to a second of the two sets of omnidirectional transfer functions to produce a second set of composite transfer functions, and the method further comprises:

generating reproduction audio signals corresponding to each of the two directions by performing a calculation process on a first stereo channel audio signal in accordance with the first set of composite transfer functions and performing a calculation process on a second stereo channel audio signal in accordance with the second set of composite transfer functions.

13. The method of claim 10, further comprising:

recording, at a first plurality of locations around a source using a source directional microphone, a plurality of source sound signals emitted from the source, and wherein the act of emitting at least one sound further comprises emitting, using a directional speaker, each of the recorded plurality of source sound signals at a second plurality of locations geometrically similar to the first plurality of locations, wherein each of the recorded plurality of source sound signals is emitted in a direction opposite that for which the each of the recorded plurality of source sound signals was recorded;

the act of generating a set of directional transfer functions further comprises generating a plurality of sets of directional transfer functions, one set for each of the second plurality of locations;

the act of generating a corresponding set of omnidirectional transfer functions further comprises generating a plurality of corresponding sets of omnidirectional transfer functions, one set for each of the second plurality of locations; and the act of generating a set of first composite transfer functions further comprises generating a plurality of sets of first composite transfer functions, one set for each of the second plurality of locations.

14. The method of claim 13, further comprising:

generating a set of reproduction audio signals, one reproduction audio signal for each of the plurality of positions on the first closed surface, wherein generating each reproduction audio signal of the set of reproduction audio signals comprises:

performing a calculation process on an input audio signal in accordance with a respective first composite transfer function from each set of first composite transfer functions to produce a set of component reproduction audio signals; and adding the component reproduction audio signals to produce the each reproduction audio signal of the set of reproduction audio signals.

15. The method of claim 13, further wherein the first plurality of locations around the source lie in a plane.

16. The method of claim 13, further wherein the first plurality of locations around the source are distributed in three dimensions.

17. The method of claim 1, further comprising:

recording, at each of the plurality of positions on the first closed surface using a directional microphone, ambience sound signals for each of the plurality of positions on the first closed surface occurring in space outside the first closed surface;

generating first reproduction audio signals corresponding to each of the plurality of positions on the first closed surface by performing a calculation process on an input audio signal in accordance with the set of first composite transfer functions; and adding respectively, corresponding to each of the positions on the first closed surface, a recorded ambience sound signal to a generated first reproduction audio signal.

18. The method of claim 1, further comprising:

changing an orientation of the first closed surface with respect to the virtual sound image location; and repeating the acts of generating a set of directional transfer function, generating a corresponding set of omnidirectional transfer functions, and generating a set of first composite transfer functions for a plurality of orientations of the first closed surface with respect to the virtual sound image location to produce a plurality of sets of orientation composite transfer functions.

19. The method of claim 18, further comprising:

generating first reproduction audio signals corresponding to each of the plurality of positions on the first closed surface by performing a calculation process on an input audio signal in accordance with a selected set of orientation composite transfer functions; and selecting the selected set of orientation composite transfer functions according to viewpoint information associated with a video image displayed in synchronization with the input audio signal.

20. A sound field reproducing system comprising:

recording apparatus adapted to:

record an input audio signal on a recording medium;

detect at least one sound signal at a plurality of positions on a first closed surface and record a corresponding detected sound signal for each one of the plurality of positions on the first closed surface, the at least one sound signal emitted at a virtual sound image location in a space outside the first closed surface;

generate and record a set of directional transfer functions, each one of the directional transfer functions based on a result of a directional measurement of the at least one sound emitted at the virtual sound image location and detected at a selected one of the plurality of positions on the first closed surface using at least one directional microphone oriented outward; and generate and record a corresponding set of omnidirectional transfer functions, each one of the omnidirectional transfer functions based on a result of an omnidirectional measurement of the at least one sound emitted at the virtual sound image location and detected at a corresponding one of the plurality of positions on the first closed surface using at least one omnidirectional microphone oriented outward, wherein for a corresponding omnidirectional transfer function of the set of omnidirectional transfer functions the corresponding one of the plurality of positions is the same location as the selected one of a plurality of positions; and audio signal processing apparatus having an input means and adapted to:

generate a set of first composite transfer functions by adding, at a specified ratio and in correspondence for each one of the plurality of positions on the first closed surface, one of the directional transfer functions to a corresponding one of the omnidirectional transfer functions; and generate first reproduction audio signals corresponding to each of the plurality of positions on the first closed surface by performing a calculation process on an input audio signal in accordance with the set of first composite transfer functions.

21. The sound field reproducing system of claim 20, wherein the recording medium is removable, and the input means is adapted to read the set of directional transfer functions, the corresponding set of omnidirectional transfer functions, and the input audio signal from the recording medium.

22. The sound field reproducing system of claim 20, wherein the input means is adapted to receive the set of directional transfer functions, the corresponding set of omnidirectional transfer functions, and the input audio signal via a network.

23. The sound field reproducing system of claim 20, wherein the audio signal processing apparatus is further adapted to:

generate a set of delay-based transfer functions, each one of the delay-based transfer functions comprising information indicating sound delay times and sound levels extracted from one of the directional transfer functions; and add, at a specified ratio and in correspondence for each one of the plurality of positions on the first closed surface, one of the delay-based transfer functions to a corresponding one of the first composite transfer functions.

24. The sound field reproducing system of claim 20, wherein the audio signal processing apparatus is further adapted to add each directional transfer function to each corresponding omnidirectional transfer function at a ratio specified individually for each corresponding position on the first closed surface.

25. The sound field reproducing system of claim 20, wherein the recording apparatus is further adapted to:

detect secondary sound signals at a plurality of positions on a second closed surface located in a space inside the first closed surface;

record secondary sound signals from sound sources placed at positions geometrically similar to the plurality of positions on the first closed surface; and generate and record a set of secondary transfer functions corresponding to paths from the sound sources to the plurality of positions on the second closed surface, based on the detecting of the secondary sound signals, and wherein the audio signal processing apparatus is further adapted to:

generate second reproduction audio signals corresponding to each of the plurality of positions on the second closed surface by performing a calculation process on the first reproduction audio signals in accordance with the set of secondary transfer functions.

26. A sound field reproducing system comprising:

recording means for:

recording an input audio signal on a recording medium;

detecting at least one sound signal at a plurality of positions on a first closed surface and record a corresponding detected sound signal for each one of the plurality of positions on the first closed surface, the at least one sound signal emitted at a virtual sound image location in a space outside the first closed surface;

generating and recording a set of directional transfer functions, each one of the directional transfer functions based on a result of a directional measurement of the at least one sound emitted at the virtual sound image location and detected at a selected one of the plurality of positions on the first closed surface using at least one directional microphone oriented outward; and generating and recording a corresponding set of omnidirectional transfer functions, each one of the omnidirectional transfer functions based on a result of an omnidirectional measurement of the at least one sound emitted at the virtual sound image location and detected at a corresponding one of the plurality of positions on the first closed surface using at least one omnidirectional microphone oriented outward, wherein for a corresponding omnidirectional transfer function of the set of omnidirectional transfer functions the corresponding one of the plurality of positions is the same location as the selected one of a plurality of positions; and audio signal processing means for:

inputting data;

generating a set of first composite transfer functions by adding, at a specified ratio and in correspondence for each one of the plurality of positions on the first closed surface, one of the directional transfer functions to a corresponding one of the omnidirectional transfer functions; and generating first reproduction audio signals corresponding to each of the plurality of positions on the first closed surface by performing a calculation process on an input audio signal in accordance with the set of first composite transfer functions.

* * * * *